(12) United States Patent
Zhang et al.

(10) Patent No.: US 8,990,740 B2
(45) Date of Patent: Mar. 24, 2015

(54) METHOD AND SYSTEM FOR A RUN-TIME RECONFIGURABLE COMPUTER ARCHITECTURE

(75) Inventors: Wei Zhang, Singapore (SG); Niraj K. Jha, Westfield, NJ (US); Li Shang, Boulder, CO (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 13/513,277

(22) PCT Filed: Dec. 1, 2010

(86) PCT No.: PCT/CA2010/001917
§ 371 (c)(1),
(2), (4) Date: Dec. 11, 2012

(87) PCT Pub. No.: WO2011/066650
PCT Pub. Date: Jun. 9, 2011

(65) Prior Publication Data
US 2013/0135008 A1    May 30, 2013

Related U.S. Application Data

(60) Provisional application No. 61/265,434, filed on Dec. 1, 2009.

(51) Int. Cl.
| | | |
|---|---|---|
| *G06F 17/50* | (2006.01) | |
| *H03K 19/177* | (2006.01) | |
| *B82Y 10/00* | (2011.01) | |
| *G06F 15/78* | (2006.01) | |
| *G11C 13/02* | (2006.01) | |

(52) U.S. Cl.
CPC ............... *G06F 17/505* (2013.01); *B82Y 10/00* (2013.01); *G06F 15/7867* (2013.01); *G11C 13/025* (2013.01); *H03K 19/177* (2013.01); *H03K 19/17748* (2013.01); *G11C 2213/16* (2013.01)
USPC ............................. 716/104; 716/105; 326/41

(58) Field of Classification Search
USPC .................................... 716/104, 105; 326/41
See application file for complete search history.

(56) References Cited

U.S. PATENT DOCUMENTS

| 5,986,932 A | 11/1999 | Ratnakumar et al. |
|---|---|---|
| 7,136,317 B1 | 11/2006 | Hanson et al. |

(Continued)

FOREIGN PATENT DOCUMENTS

WO    2007124048 A2    11/2007

OTHER PUBLICATIONS

Galanis. et al., "Mapping DSP applications on processor/coarse-grain reconfigurable array architectures", Sep. 2006 IEEE International Symposium on Circuits and Systems: 3666-3669.

(Continued)

*Primary Examiner* — Stacy Whitmore
*Assistant Examiner* — Magid Dimyan
(74) *Attorney, Agent, or Firm* — Meagher Emanuel Laks Goldberg & Liao, LLP

(57) ABSTRACT

A reconfigurable computer architecture is disclosed. The reconfigurable computer architecture has a plurality of logic elements, a plurality of connection switching elements, and a plurality of volatile and/or non-volatile configuration random access memories (RAMs). Each of the configuration RAMs is electrically coupled to at least one of the plurality of logic elements or at least one of the connection switching elements.

5 Claims, 53 Drawing Sheets

(56) References Cited

U.S. PATENT DOCUMENTS

| | | | |
|---|---|---|---|
| 7,692,448 B2* | 4/2010 | Solomon | 326/38 |
| 8,117,436 B2 | 2/2012 | Zhang et al. | |
| 8,230,375 B2* | 7/2012 | Madurawe | 716/117 |
| 8,384,426 B2* | 2/2013 | Or-Bach | 326/39 |
| 8,407,660 B2* | 3/2013 | Solomon | 716/138 |
| 2004/0222817 A1* | 11/2004 | Madurawe | 326/39 |
| 2006/0006904 A1* | 1/2006 | Marui | 326/38 |
| 2008/0263334 A1* | 10/2008 | Synder et al. | 712/221 |
| 2009/0070727 A1* | 3/2009 | Solomon | 716/16 |
| 2009/0178043 A1* | 7/2009 | Prasanna et al. | 718/102 |
| 2011/0037497 A1* | 2/2011 | Or-Bach | 326/38 |

OTHER PUBLICATIONS

Muttreja. et al., "CMOS Logic Design \\ith Independent-gate FinFETs", 25th International Conference on Computer Design, Oct. 2007 560-567.

Chiricescu. et al., "Design and Analysis of a Dynamically Reconfigurable Three-Dimensional FPGA", IEEE Transactions on Very Large Scale Integration (VLSI) Systems Feb. 2001, 9 (1) 186-196.

Rueckes. et al., "Carbon Nanotube-Based Nonvolatile Random Access Memory for Molecular Computing", Science, Jul. 2000, 289 (5476):94-97.

Goldstein. et al., "PipeRench a Reconfigurable Architecture and Compiler", Computer, Apr. 2000, 33 (4) 70-77.

Ward. et al., "A Non-Volatile Nanoelectromechanical Memory Element Utilizing a Fabric of Carbon Nanotubes", Non-Volatile Memory Technology Symposium, Nov. 2004, 34-38.

S. Lai, "Current status of the phase change memory and its future", in Proc. Int. Electron Devices Meeting, Dec. 2003, pp. 10.1.1-10.1.4.

S. Tehrani, J. M. Slaughter, M. Deherrera, B. N. Engel, and N. D. Rizzo, "Magnetoresistive random access memory using magnetic tunnel junctions", Proc. IEEE, vol. 91, pp. 703-714, 2003.

G. R. Fox, F. Chu, and T. Davenport, "Current and future ferroelectric non-volatile memory technology", J. Vaccum Science Technology B., vol. 19, pp. 1967-1971, 2001.

P.G. Paulin and J.P. Knight, "Force-Directed Scheduling for the Behavioral Synthesis of ASIC's", IEEE Trans. Computer-Aided Design, vol. 8, pp. 661-679, Jun. 1989.

AS. Marquardt, V. Betz, and J. Rose, "Using Cluster-Based Logic Blocks and Timing-Driven Packing to Improve FPGA Speed and Density", in Proc. Int. Symp. FPGA, Feb. 1999, pp. 37-46.

V. Betz and J. Rose, "VPR: A New Packing, Placement and Routing Tool for FPGA Research", Proc. Int. Wkshp. FPGA, Aug. 1997, pp. 213-222.

C.L.E. Chang, "RISA: Accurate and Efficient Placement Routability Modeling", in Proc. Int. Conf Computer-Aided Design, Nov. 1994, pp. 690-695.

C. Huang et al., "Synthesis of heterogeneous distributed architectures for memory intensive applications", Proc. Int. Conf Computer-Aided Design, Nov. 2003, pp. 46-53.

\* cited by examiner

TABLE 1

CIRCUIT MAPPING RESULTS

| Circuit | LUT graph depth | Level-1 folding | | | | Level-2 folding | | | |
|---|---|---|---|---|---|---|---|---|---|
| | | LEs | Delay (ns) | LEs x Delay | Freq. (GHz) | LEs | Delay (ns) | LEs x Delay | Freq. (GHz) |
| pm1 | 3 | 9 | 1.08 | 9.72 | 2.78 | 11 | 1.00 | 11.00 | 2.00 |
| sct | 4 | 9 | 1.64 | 14.76 | 2.86 | 16 | 1.10 | 17.60 | 1.82 |
| cm163a | 4 | 4 | 1.40 | 5.60 | 2.86 | 8 | 1.10 | 8.80 | 1.82 |
| z4ml | 5 | 2 | 1.75 | 3.5 | 2.86 | 3 | 1.47 | 4.41 | 2.04 |
| cc | 5 | 13 | 2.05 | 26.65 | 2.44 | 14 | 2.03 | 28.35 | 1.48 |
| poler8 | 7 | 9 | 2.87 | 25.83 | 2.44 | 10 | 2.20 | 22.0 | 1.82 |
| cordic | 7 | 7 | 2.87 | 20.09 | 2.44 | 12 | 2.20 | 26.40 | 1.82 |
| lal | 7 | 24 | 2.52 | 60.48 | 2.78 | 32 | 2.00 | 64.00 | 2.00 |
| ldd | 7 | 10 | 2.94 | 29.40 | 2.38 | 17 | 2.48 | 42.16 | 1.61 |
| 9symml | 18 | 10 | 10.36 | 103.60 | 1.72 | 30 | 7.45 | 223.50 | 1.20 |
| alu2 | 31 | 12 | 12.71 | 152.52 | 2.68 | 24 | 11.76 | 282.24 | 1.36 |
| 16-bit ripple-carry adder | 16 | 2 | 4.80 | 9.60 | 3.33 | 4 | 3.52 | 14.08 | 2.27 |
| 32-bit ripple-carry adder | 32 | 2 | 9.60 | 19.20 | 3.33 | 4 | 7.04 | 28.16 | 2.27 |
| 64-bit ripple-carry adder | 64 | 2 | 19.20 | 38.40 | 3.33 | 4 | 14.08 | 56.32 | 2.27 |
| 16-bit carry-lookahead adder | 10 | 13 | 3.60 | 46.80 | 2.78 | 26 | 3.43 | 89.13 | 1.46 |
| 32-bit carry-lookahead adder | 18 | 13 | 6.48 | 84.24 | 2.78 | 26 | 6.17 | 160.42 | 1.46 |
| 64-bit carry-lookahead adder | 34 | 13 | 12.24 | 159.12 | 2.78 | 26 | 11.65 | 302.90 | 1.46 |
| 16-bit carry-select adder | 8 | 30 | 2.88 | 86.4 | 2.78 | 55 | 2.76 | 151.80 | 1.46 |
| 32-bit carry-select adder | 14 | 30 | 5.04 | 150.12 | 2.78 | 55 | 4.80 | 264.00 | 1.46 |
| 64-bit carry-select adder | 26 | 30 | 9.36 | 280.80 | 2.78 | 55 | 8.91 | 490.05 | 1.46 |
| 8-bit multiplier | 8 | 16 | 3.88 | 62.08 | 2.06 | 32 | 3.24 | 103.68 | 1.23 |
| 16-bit multiplier | 16 | 32 | 7.76 | 248.32 | 2.06 | 64 | 6.48 | 414.72 | 1.23 |
| 32-bit multiplier | 32 | 64 | 15.52 | 993.28 | 2.06 | 128 | 12.96 | 1658.88 | 1.23 |

| Circuit | LUT graph depth | Level-4 folding | | | | No folding | | | |
|---|---|---|---|---|---|---|---|---|---|
| | | LEs | Delay (ns) | LEs x Delay | Freq. (GHz) | LEs | Delay (ns) | LEs x Delay | Freq. (GHz) |
| pm1 | 3 | 22 | 0.61 | 13.42 | 1.64 | 22 | 0.61 | 13.42 | 1.64 |
| sct | 4 | 32 | 0.62 | 19.84 | 1.61 | 32 | 0.62 | 19.84 | 1.61 |
| cm163a | 4 | 14 | 0.59 | 8.26 | 1.69 | 14 | 0.59 | 8.26 | 1.69 |
| z4ml | 5 | 5 | 1.25 | 6.25 | 1.60 | 9 | 0.73 | 6.57 | 1.37 |
| cc | 5 | 24 | 1.91 | 45.84 | 1.05 | 28 | 1.14 | 31.78 | 0.88 |
| poler8 | 7 | 16 | 1.54 | 24.64 | 1.30 | 35 | 1.01 | 35.35 | 0.99 |
| cordic | 7 | 14 | 1.60 | 22.40 | 1.25 | 28 | 1.07 | 29.96 | 0.93 |
| lal | 7 | 56 | 1.56 | 87.36 | 2.56 | 73 | 1.07 | 78.11 | 0.93 |
| ldd | 7 | 31 | 2.05 | 63.55 | 0.98 | 44 | 1.38 | 60.72 | 0.72 |
| 9symml | 18 | 54 | 6.85 | 369.90 | 0.73 | 124 | 3.83 | 474.92 | 0.26 |
| alu2 | 31 | 44 | 9.36 | 411.84 | 0.85 | 211 | 6.14 | 1295.54 | 0.16 |
| 16-bit ripple-carry adder | 16 | 8 | 2.88 | 23.04 | 1.39 | 32 | 2.39 | 76.48 | 0.42 |
| 32-bit ripple-carry adder | 32 | 8 | 5.76 | 46.08 | 1.39 | 64 | 5.00 | 320.00 | 0.20 |
| 64-bit ripple-carry adder | 64 | 8 | 11.52 | 92.16 | 1.39 | 128 | 10.21 | 1306.88 | 0.10 |
| 16-bit carry-lookahead adder | 10 | 52 | 3.63 | 163.35 | 0.83 | 104 | 2.35 | 244.40 | 0.43 |
| 32-bit carry-lookahead adder | 18 | 52 | 6.05 | 272.25 | 0.83 | 208 | 4.45 | 925.60 | 0.23 |
| 64-bit carry-lookahead adder | 34 | 52 | 10.89 | 490.05 | 0.83 | 416 | 8.65 | 3598.4 | 0.12 |
| 16-bit carry-select adder | 8 | 93 | 2.42 | 225.06 | 0.83 | 134 | 2.21 | 296.14 | 0.45 |
| 32-bit carry-select adder | 14 | 93 | 4.84 | 450.12 | 0.83 | 268 | 4.31 | 1155.08 | 0.23 |
| 64-bit carry-select adder | 26 | 93 | 8.47 | 787.71 | 0.83 | 536 | 8.51 | 4561.36 | 0.12 |
| 8-bit multiplier | 8 | 64 | 2.92 | 186.88 | 0.68 | 128 | 2.39 | 305.92 | 0.42 |
| 16-bit multiplier | 16 | 128 | 5.84 | 747.52 | 0.68 | 512 | 4.98 | 2549.76 | 0.20 |
| 32-bit multiplier | 32 | 256 | 11.68 | 2990.08 | 0.68 | 2048 | 9.54 | 19537.92 | 0.10 |

FIG. 8

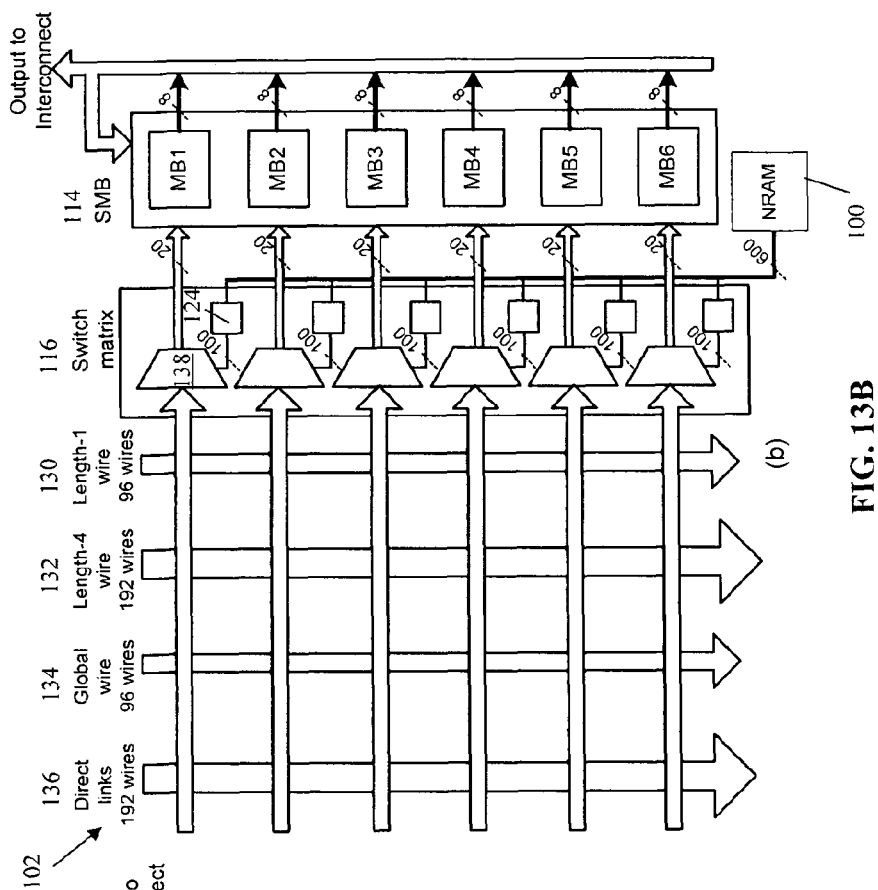
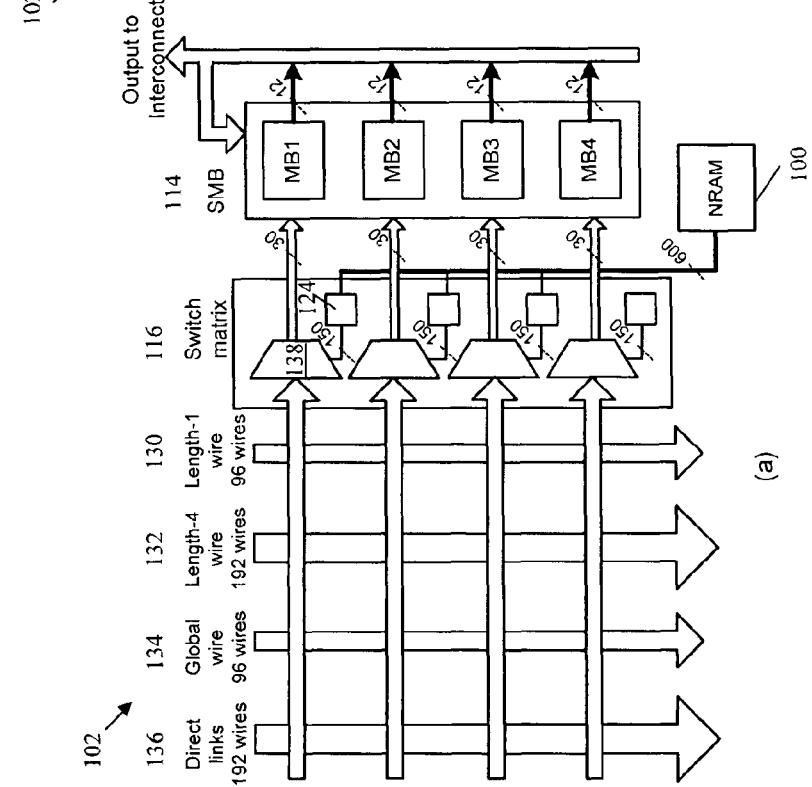
FIG. 13B
FIG. 13A

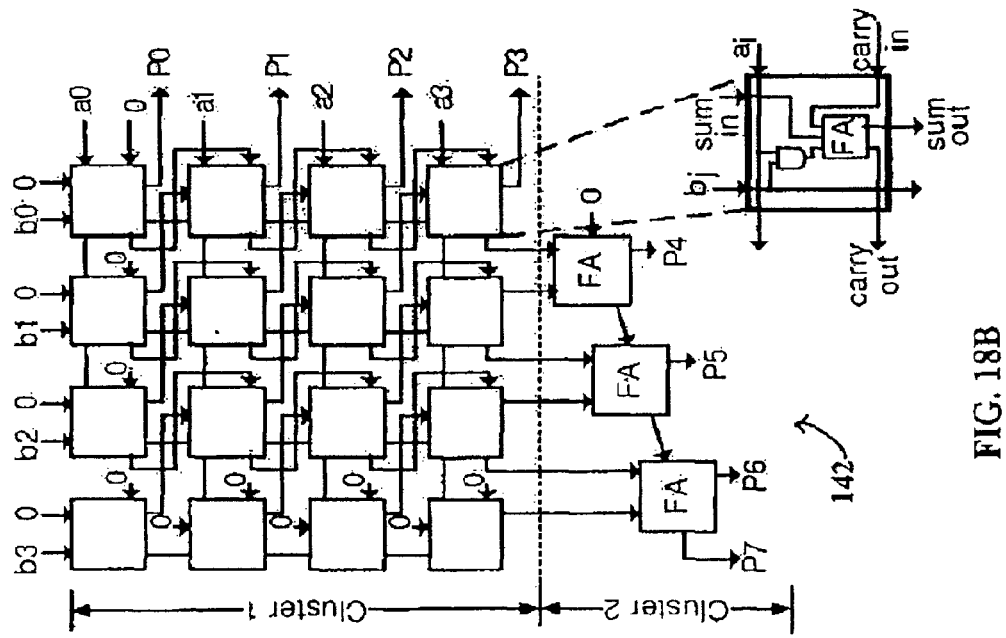
FIG. 18B
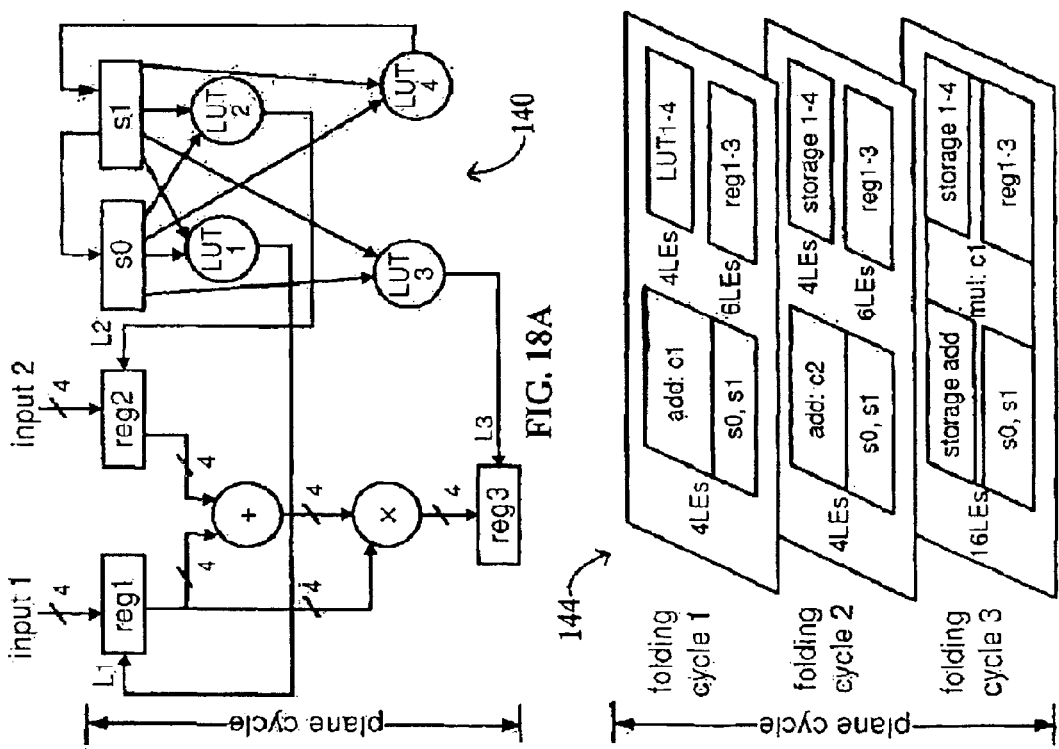
FIG. 18A
FIG. 18C

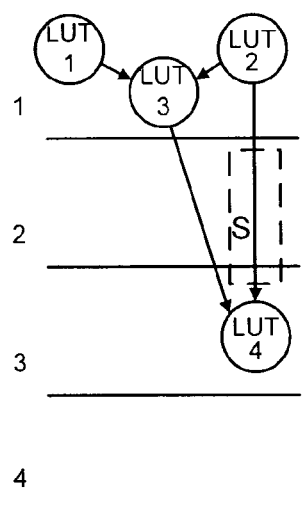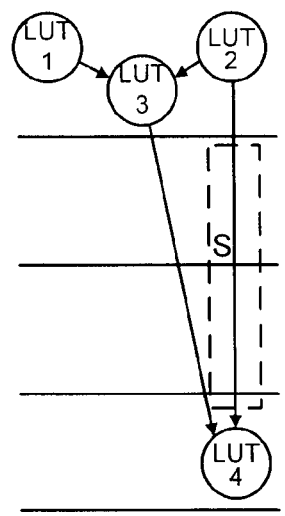
FIG. 22A  FIG. 22B  FIG. 22C

TABLE II

CIRCUIT MAPPING RESULTS FOR AT PRODUCT OPTIMIZATION

| Circuit | # Planes | Max plane depth | #LUTs | #Flip flops | No folding | | AT optimization (k enough) | | | | AT optimization (k = 16) | | | |
|---------|----------|-----------------|-------|-------------|------------|--|---------------------------|--|--|--|--------------------------|--|--|--|
| | | | | | #LEs | Delay (ns) | Folding level | #LEs | Delay (ns) | AT Improv. | Folding level | #LEs | Delay (ns) | AT Improv. |
| ex1 | 1 | 24 | 644 | 50 | 644 | 12.90 | 1 | 34 | 17.02 | 14.36X | 2 | 68 | 15.60 | 7.83X |
| FIR | 1 | 25 | 673 | 112 | 678 | 14.20 | 1 | 56 | 18.50 | 9.29X | 2 | 72 | 16.90 | 7.91X |
| ex2 | 3 | 22 | 694 | 130 | 694 | 38.76 | 1 | 67 | 48.84 | 8.22X | 2 | 88 | 42.90 | 7.13X |
| c5315 | 1 | 14 | 792 | 0 | 792 | 7.86 | 1 | 144 | 10.36 | 4.17X | 1 | 144 | 10.36 | 4.17X |
| Biquad | 1 | 22 | 1376 | 64 | 1376 | 12.34 | 1 | 68 | 16.28 | 15.34X | 2 | 136 | 14.30 | 8.73X |
| Paulin | 2 | 24 | 1468 | 147 | 1468 | 26.74 | 1 | 106 | 35.52 | 10.43X | 2 | 136 | 31.20 | 9.25X |
| ASPP4 | 2 | 24 | 2240 | 160 | 2240 | 26.80 | 1 | 100 | 36.96 | 16.24X | 2 | 200 | 32.40 | 9.26X |

TABLE III

CIRCUIT MAPPING RESULTS FOR TYPICAL OPTIMIZATION

| Circuit | Optimization | Area const. (#LEs) | Delay const. (ns) | Folding level | #LEs | Delay (ns) |
|---------|--------------|--------------------|-------------------|---------------|------|------------|
| ex1 | Delay | - | - | 1 | 34 | 17.02 |
| FIR | Delay | 110 | - | 3 | 108 | 16.74 |
| ex2 | Area | - | 40 | 11 | 352 | 38.04 |
| c5315 | Area | - | - | 1 | 144 | 10.36 |
| Biquad | Delay | 100 | - | 1 | 68 | 16.28 |
| Paulin | - | 210 | 30 | 3 | 204 | 29.76 |
| ASPP4 | Area | - | 28.5 | 6 | 600 | 28.32 |

FIG. 25

Table IV. Mapping results for LE design I

| Bench. | Level-1 folding | | Level-4 folding | | No folding | | Folding level | AD improv. |
|---|---|---|---|---|---|---|---|---|
| | #LEs | delay (ns) | #LEs | delay (ns) | #LEs | delay (ns) | | |
| Diffeq | 125 | 138.9 | 179 | 88.0 | 933 | 56.0 | 4 | 3.3X |
| Biquad | 438 | 185.4 | 446 | 115.0 | 1271 | 43.2 | 4 | 1.1X |
| Paulin | 148 | 130.0 | 248 | 95.5 | 1402 | 59.3 | 1 | 4.3X |
| ASPP4 | 321 | 161.5 | 384 | 135.4 | 2114 | 55.3 | 1 | 2.3X |
| Matrix | 231 | 314.2 | 533 | 198.6 | 2859 | 94.4 | 1 | 2.5X |
| Wavelet | 216 | 303.0 | 416 | 323.4 | 3746 | 112.6 | 1 | 6.4X |
| DCT | 214 | 297.7 | 609 | 263.6 | 7796 | 126.7 | 1 | 15.5X |
| Motion | 689 | 815.4 | 898 | 443.0 | 9447 | 133.3 | 4 | 3.2X |

FIG. 29

Table V. Mapping results for LE design II

| Bench. | Level-1 folding | | Level-4 folding | | No folding | | Folding level | AD improv. |
|---|---|---|---|---|---|---|---|---|
| | #LEs | delay (ns) | #LEs | delay (ns) | #LEs | delay (ns) | | |
| Diffeq | 56 | 124.2 | 136 | 98.9 | 933 | 69.5 | 1 | 8.1X |
| Biquad | 64 | 105.3 | 240 | 102.5 | 1271 | 65.6 | 1 | 12.4X |
| Paulin | 63 | 113.7 | 248 | 115.7 | 1402 | 67.0 | 1 | 13.1X |
| ASPP4 | 110 | 129.6 | 383 | 142.1 | 2114 | 69.8 | 1 | 9.0X |
| Matrix | 228 | 266.6 | 491 | 192.8 | 2859 | 71.4 | 1 | 3.4X |
| Wavelet | 203 | 323.5 | 370 | 231.7 | 3746 | 131.2 | 1 | 7.5X |
| DCT | 128 | 325.0 | 512 | 353.9 | 7796 | 196.0 | 1 | 36.7X |
| Motion | 554 | 687.4 | 567 | 473.8 | 9447 | 188.6 | 4 | 6.6X |

FIG. 30

Table VI. Mapping results for LE design III

| Bench. | Level-1 folding | | Level-4 folding | | No folding | | Folding level | AD improv. |
|---|---|---|---|---|---|---|---|---|
| | #LEs | delay (ns) | #LEs | delay (ns) | #LEs | delay (ns) | | |
| Diffeq | 51 | 136.3 | 144 | 92.3 | 933 | 60.0 | 1 | 8.1X |
| Biquad | 64 | 106.4 | 240 | 87.8 | 1271 | 59.7 | 1 | 11.1X |
| Paulin | 64 | 142.1 | 256 | 104.8 | 1402 | 58.2 | 1 | 9.0X |
| ASPP4 | 112 | 160.4 | 384 | 140.5 | 2114 | 58.8 | 1 | 6.9X |
| Matrix | 228 | 327.4 | 487 | 172.3 | 2859 | 86.2 | 1 | 3.3X |
| Wavelet | 208 | 374.4 | 368 | 218.8 | 3746 | 121.4 | 1 | 5.8X |
| DCT | 128 | 386.1 | 512 | 263.6 | 7796 | 181.2 | 1 | 28.6X |
| Motion | 634 | 877.9 | 664 | 420.8 | 9447 | 196.3 | 4 | 6.9X |

FIG. 31

Table VII
DELAY FOR DIFFERENT WIRE SEGMENT DISTRIBUTIONS

| Length-1 wire % | Length-4 wire % | Long wire % | Level-1 folding | Level-4 folding | No folding |
|---|---|---|---|---|---|
| 60 | 30 | 10 | 1 | 1 | 1 |
| 50 | 40 | 10 | 0.98 | 1.08 | 0.9 |
| 30 | 60 | 10 | 1.01 | 0.99 | 0.9 |
| 50 | 30 | 20 | 1.02 | 1.05 | 0.79 |
| 40 | 40 | 20 | 1 | 0.94 | 0.81 |
| 30 | 50 | 20 | 1.03 | 0.97 | 0.85 |
| 40 | 30 | 30 | 1.03 | 1.03 | 0.78 |
| 30 | 40 | 30 | 1.02 | 1.01 | 0.84 |

FIG. 35

Table VIII
PERFORMANCE COMPARISON FOR DIFFERENT NANO RAMS

| Nano RAM | Reconf. delay (ns) | Area ($F^2$) | Delay for different folding levels | | |
| | | | Level-1 | Level-2 | Level-4 |
|---|---|---|---|---|---|
| NRAM | 160 | 6 | 1 | 1 | 1 |
| MRAM | 420 | 8 | 1.12 | 1.07 | 1.04 |
| PCM | 370 | 12 | 1.10 | 1.05 | 1.03 |
| DRAM | 580 | 6 | 1.19 | 1.11 | 1.06 |

FIG. 36

Table IX. Mapping of benchmarks with memory access to NATURE

| Benchmarks | # LUTs | # Mem. | Size (Kb) | Folding level | # LE | Delay (ns) | # RAM blocks | AD improv. |
|---|---|---|---|---|---|---|---|---|
| Haar | 2328 | 3 | 68 | 4 | 224 | 201.2 | 1 | 5.3X |
| Matrix | 2859 | 2 | 128 | 4 | 487 | 172.3 | 1 | 2.6X |
| YUV2RGB | 3210 | 2 | 88 | 4 | 331 | 239.7 | 1 | 5.2X |
| FIR | 3239 | 2 | 64 | 4 | 511 | 202.6 | 1 | 3.6X |
| Wavelet | 3746 | 2 | 256 | 4 | 368 | 218.8 | 2 | 5.8X |
| Jacobian | 4483 | 3 | 256 | 4 | 432 | 305.1 | 2 | 5.3X |
| Motion | 9447 | 2 | 512 | 6 | 664 | 420.8 | 4 | 6.5X |
| IIR | 14098 | 3 | 64 | 4 | 1187 | 550.8 | 1 | 6.2X |

FIG. 43

Table X
RECONFIGURATION BITS REQUIRED FOR ONE SMB

| Logic levels in SMB | # bits for LEs | # bits for input CB | # bits for output CB | # bits for SB per SMB | Total |
|---|---|---|---|---|---|
| 1 | 1248 | 480 | 510 | 815 | 3053 |
| 2 | 1632 | 576 | 510 | 815 | 3533 |

Table XI
SUMMARY OF RECONFIGURATION PARAMETERS

| Reconfiguration bits per SMB | 3.6$Kb$ |
|---|---|
| No. reconfiguration copies | 32 |
| Size of nano RAM per SMB | 115.2$Kb$ |
| Reconfiguration delay | 2.4$ns$ - 3.4$ns$ |
| No. reconfiguration cycles | 2 |
| No. vias required per SMB | 1824 |
| Via size | 1$\mu m^2$ |
| Via pitch | 2.5$\mu m$ |
| Via density | $16 \times 10^4/mm^2$ |

Table XII
FinFET Technology Parameters

| Technology node | 32nm |
|---|---|
| Channel length (L) | 16nm |
| Gate-drain(source) overlap | 1nm |
| Fin height ($H_{fin}$) | 32nm |
| Fin thickness ($W_{fin}$) | 8nm |
| Oxide thickness ($t_{ox}$) | 0.8nm |
| Channel doping | $10^{15} cm^{-3}$ |
| Source/drain doping | $10^{20} cm^{-3}$ |
| Work function | 4.5eV |
| $V_{dd}$ | 1V |

FIG. 56

---
Algorithm 1: Back-gate bias assignment procedure
---
1 *Procedure BIAS_ASSIGN (node_list SL, delay_degrad)*
2 Compute *bias_amen* for all the nodes in SL;
3 $max\_amen = \max \{bias\_amen_i\}$ for $i \in$ SL;
4 while *node j with max_amen has slack > delay_degrad* do
5     Assign 0.2V back-gate bias voltage to node $j$;
6     Adjust the slacks of predecessors and successors of node $j$ and
7     update their *bias_amen* value;
8     $max\_amen = \max \{bias\_amen_i\}$ for $i \in$ SL;
9 return SL;
---

FIG. 59

Table XIII. Comparison between the unified and fine-grain architectures

| Benchmarks | Fine-grain, no-folding (Case 1) | | Fine-grain, folding (Case 2) | | |
|---|---|---|---|---|---|
| | #LEs | Delay (ns) | #LEs | Delay (ns) | Folding level |
| Diffeq | 933 | 35.7 | 80 | 66.9 | 2 |
| Biquad | 1271 | 33.2 | 128 | 77.2 | 2 |
| Paulin | 1402 | 35.4 | 128 | 77.4 | 2 |
| ASPP4 | 2114 | 34.0 | 208 | 77.0 | 2 |
| Matrix | 2859 | 48.6 | 336 | 158.1 | 3 |
| Wavelet | 7320 | 77.1 | 736 | 177.2 | 4 |
| DCT | 7378 | 108.4 | 512 | 205.5 | 4 |
| Motion | 9447 | 135.3 | 657 | 316.3 | 6 |

| Unified, folding | | | | AD prod. improv. (Case 1) | AD prod. improv. (Case 2) |
|---|---|---|---|---|---|
| #LEs | #DSP | Delay (ns) | Folding level | | |
| 80 | 2 | 21.0 | 4 | 14.2X | 2.3X |
| 48 | 2 | 20.3 | 2 | 21.7X | 4.7X |
| 80 | 3 | 25.6 | 1 | 15.1X | 3.0X |
| 78 | 5 | 25.8 | 1 | 17.6X | 3.9X |
| 272 | 2 | 101.6 | 2 | 5.0X | 1.9X |
| 202 | 6 | 116.7 | 3 | 16.2X | 3.8X |
| 182 | 4 | 99.8 | 4 | 32.6X | 4.3X |
| 597 | 3 | 261.0 | 6 | 7.6X | 1.6X |

FIG. 60

Table XIV. Mapping results for the 3D unified architecture

| Benchmarks | #LEs | #DSP blocks | Delay (ns) | Folding level | #Folding cycles | Area-delay prod. improv. |
|---|---|---|---|---|---|---|
| Diffeq | 80 | 2 | 24.0 | 4 | 10 | 1.4X |
| Biquad | 48 | 2 | 24.0 | 2 | 10 | 1.1X |
| Paulin | 128 | 3 | 19.2 | 4 | 8 | 1.0X |
| ASPP4 | 78 | 5 | 33.6 | 1 | 14 | 1.0X |
| Matrix | 272 | 2 | 88.7 | 2 | 26 | 1.4X |
| Wavelet | 202 | 6 | 111.7 | 3 | 24 | 1.3X |
| DCT | 182 | 4 | 94.5 | 4 | 25 | 1.3X |
| Motion | 597 | 3 | 255.5 | 6 | 26 | 1.3X |

FIG. 61

Table XV. Power reduction due to ABGB

| Benchmarks | Folding level | Normal mode | | | | | LP mode | | | | | Power red. |
|---|---|---|---|---|---|---|---|---|---|---|---|---|
| | | Cycle (ns) | Power (mW) | | | Total | Cycle (ns) | Power (mW) | | | Total | |
| | | | Reconf. | Logic and inter. | Leakage | | | Biasing | Reconf. | Logic and inter. | Leakage | | |
| Diffeq | 1 | 2.4 | 11.6 | 2.9 | 7.9 | 22.4 | 3.1 | 0.3 | 10.1 | 3.1 | 0.9 | 14.4 | 1.6X |
| Biquad | 2 | 2.4 | 6.7 | 1.8 | 5.0 | 13.5 | 3.1 | 0.3 | 5.1 | 1.4 | 0.5 | 7.3 | 1.8X |
| Paulin | 4 | 2.1 | 19.3 | 5.1 | 12.4 | 37.1 | 3.1 | 1.6 | 15.0 | 4.3 | 1.2 | 22.1 | 1.7X |
| ASPP4 | no | 10.6 | 0 | 7.8 | 11.3 | 19.1 | 10.6 | 2.1 | 0 | 7.8 | 7.5 | 17.4 | 1.1X |
| Wavelet | 4 | 4.4 | 19.0 | 6.8 | 21.9 | 47.7 | 4.4 | 0.7 | 19.0 | 6.8 | 6.5 | 33.0 | 1.4X |
| DCT | 2 | 2.7 | 27.0 | 7.0 | 21.0 | 55.0 | 3.1 | 0.4 | 23.5 | 6.9 | 5.8 | 36.6 | 1.5X |

FIG. 62

Table XVI. Comparison between FinFET-based 3D unified architecture and 2D fine-grain architecture for AD product optimization

| Benchmarks | 3D unified, folding | | | | |
|---|---|---|---|---|---|
| | Fold. Level | #LEs | #DSPs | Delay (ns) | Power (mW) |
| Diffeq | 4 | 80 | 2 | 24.0 | 28.5 |
| Biquad | 2 | 48 | 2 | 24.0 | 13.5 |
| Paulin | 4 | 128 | 3 | 19.2 | 37.1 |
| ASPP4 | 1 | 78 | 5 | 33.6 | 33.1 |
| Wavelet | 3 | 202 | 6 | 111.7 | 38.1 |
| DCT | 4 | 182 | 4 | 94.5 | 46.5 |

| Benchmarks | 2D fine-grain, no-folding | | | AD prod. improv. | Power improv. |
|---|---|---|---|---|---|
| | #LEs | Delay (ns) | Power (mW) | | |
| Diffeq | 933 | 35.7 | 29.2 | 15.5X | 1.0X |
| Biquad | 1271 | 33.2 | 39.4 | 27.5X | 2.9X |
| Paulin | 1402 | 35.4 | 42.9 | 25.2X | 1.2X |
| ASPP4 | 2114 | 34.0 | 66.9 | 16.9X | 2.0X |
| Wavelet | 7320 | 77.1 | 173.4 | 21.2X | 4.6X |
| DCT | 7378 | 108.4 | 166.4 | 43.0X | 3.6X |

FIG. 63

Table XVII. Comparison between FinFET-based 3D unified architecture and 2D fine-grain architecture for power optimization

| Benchmarks | 3D unified, folding | | | | |
|---|---|---|---|---|---|
| | Fold. Level | #LEs | #DSPs | Delay (ns) | Power (mW) |
| Diffeq | 1 | 64 | 2 | 49.6 | 14.4 |
| Biquad | 2 | 48 | 2 | 43.4 | 7.3 |
| Paulin | no | 300 | 4 | 19.8 | 13.2 |
| ASPP4 | no | 430 | 7 | 21.2 | 17.4 |
| Wavelet | no | 1080 | 12 | 36.8 | 21.1 |
| DCT | no | 1138 | 12 | 44.2 | 20.9 |

| Benchmarks | 2D fine-grain, no-folding | | | AD prod. improv. | Power improv. |
|---|---|---|---|---|---|
| | #LEs | Delay (ns) | Power (mW) | | |
| Diffeq | 933 | 35.7 | 29.2 | 8.7X | 2.0X |
| Biquad | 1271 | 33.2 | 39.4 | 15.2X | 5.4X |
| Paulin | 1402 | 35.4 | 42.9 | 8.6X | 3.2X |
| ASPP4 | 2114 | 34.0 | 66.9 | 7.8X | 3.8X |
| Wavelet | 7320 | 77.1 | 173.4 | 15.0X | 8.1X |
| DCT | 7378 | 108.4 | 166.4 | 17.0X | 7.9X |

FIG. 64

METHOD AND SYSTEM FOR A RUN-TIME RECONFIGURABLE COMPUTER ARCHITECTURE

RELATED APPLICATIONS

This application is a 35 U.S.C. §371 national phase of International Application No. PCT/CA2010/001917, filed Dec. 1, 2010, and claims the benefit of the filing date of U.S. Provisional Patent Application Ser. No. 61/265,434, filed Dec. 1, 2009. This application is a continuation-in-part application based on pending U.S. patent application Ser. No. 12/297,638, now U.S. Patent No. 8,117,436, issued Feb. 14, 2012, which entered U.S. national stage prosecution on Apr. 9, 2009, and which claims the benefit of international PCT Patent Application No. PCT/US2007/009658 filed Apr. 19, 2007, and which also claims the benefit of U.S. Provisional Application Nos. 60/793,665, filed Apr. 19, 2006, and 60/919,225, filed Mar. 21, 2007. This application claims the benefit of each of the above patent applications for material which has already been disclosed, and each of the above-identified related applications is incorporated herein by reference.

GOVERNMENT RIGHTS

This invention was made with government support under Grant #CNS-0719936 awarded by the National Science Foundation. The government has certain rights in the invention.

FIELD

The claimed invention relates generally to reconfigurable computer architectures, and particularly to FET compatible field-programmable gate arrays (FPGAs) having universal memories supporting fine-grain and/or course grain reconfiguration in two-dimensional or three-dimensional structures to enable temporal logic folding, along with a register transfer level (RTL)/gate-level automatic design optimization method and system.

BACKGROUND

After consistently providing large improvements in productivity and performance for more than two decades, CMOS is expected to approach its physical limits in the coming decade. To enable future technology scaling, intensive research is being directed towards the development of nanoscale molecular devices, such as carbon nanotube and nanowire. Such nanodevices demonstrate superior characteristics over MOSFET in terms of integration density, performance, power consumption, etc. However, lack of a mature fabrication process is a roadblock in implementing chips using these nanodevices. If photo-lithography could be used to implement structures made from these nanodevices, then such structures could be combined with CMOS logic to create hybrid CMOS/nanochips, which could leverage the beneficial aspects of both technologies.

Motivated by the impressive potential of nanotechnologies, researchers are investigating nanoelectronic circuits and architectures. If such circuits/architectures are implemented using bottom-up chemical self-assembly techniques, then the chip defect levels are expected to be high (between 1% and 10%). To be able to deal with such high defect levels, regular architectures are favored. Reconfigurable architectures, in addition to being regular, allow reconfiguration around fabrication defects as well as run-time faults. Thus, both regular and reconfigurable architectures have found popularity.

SUMMARY

A reconfigurable computer architecture is disclosed. The reconfigurable computer architecture has a plurality of logic elements, a plurality of connection switching elements, and a plurality of volatile and/or non-volatile configuration random access memories (RAMs). Each of the configuration RAMs is electrically coupled to at least one of the plurality of logic elements or at least one of the connection switching elements.

A method for optimizing a circuit for a reconfigurable computer architecture is also disclosed. A folding level is determined for an input circuit design by identifying each plane of the input circuit design, obtaining circuit parameters within each plane, and obtaining a user optimization objective. The input circuit design is partitioned into logical functions and logical function clusters. Each of the logical functions and logical function clusters are scheduled into to a folding stage. Each logical function and logical function cluster is mapped to a specific look-up table (LUT) or LUT cluster. Temporal placement is performed. Routing is generated. A layout is generated for each folding stage and a configuration bitmap is generated for use with each of one or more folding cycles run by the reconfigurable computer architecture.

Another reconfigurable computer architecture is disclosed. The reconfigurable computer architecture has a logic layer and a memory layer electrically coupled to the logic layer. The logic layer has a plurality of logic elements and a plurality of connection switching elements. The memory layer has a plurality of configuration random access memories (RAMs), wherein each of the configuration RAMs is electrically coupled to at least one of the plurality of logic elements or at least one of the connection switching elements.

A further reconfigurable computer architecture is disclosed. The reconfigurable computer architecture has a plurality of logic elements, wherein the plurality of logic elements comprises a plurality of FinFETs, each FinFET comprising a front gate and a back gate. The reconfigurable computer architecture also has a plurality of connection switching elements and a plurality of volatile and/or non-volatile configuration random access memories (RAMs). Each of the configuration RAMs is electrically coupled to at least one of the plurality of logic elements or at least one of the connection switching elements.

A logic element for a reconfigurable computer architecture is disclosed. The logic element has an m-input look-up table (LUT). The logic element also has an SRAM cell electrically coupled to the LUT and configured to receive reconfiguration bits from a local configuration RAM. The logic element further has a LUT result storage electrically coupled to the LUT table.

A switching element for a reconfigurable computer architecture is also disclosed. The switching element has an SRAM cell configured to receive reconfiguration bits from a local configuration RAM. The switching element also has a switch electrically coupled to the SRAM cell and configured to operate based on the reconfiguration bits of the SRAM cell.

BRIEF DESCRIPTION OF THE DRAWINGS

FIG. 8 illustrates experimental circuit mapping results for one embodiment of a reconfigurable computer architecture.

FIG. 13A schematically illustrates a high-level view of one embodiment of a logic block (LB) architecture where a SMB has 4 MBs.

FIG. 13B schematically illustrates a high-level view of one embodiment of a logic block (LB) architecture where the SMB has 6 MBs.

FIG. 18A schematically illustrates one embodiment of an example Register Transfer Level (RTL) circuit.

FIG. 18B schematically illustrates one embodiment of a module partition.

FIG. 18C schematically illustrates a mapping result.

FIG. 22A schematically illustrates one embodiment of a storage lifetime for the ASAP schedule of FIG. 21A.

FIG. 22B schematically illustrates one embodiment of a storage lifetime for the ALAP schedule of FIG. 21B.

FIG. 22C schematically illustrates one embodiment of a maximum storage lifetime for source distribution computations during Distribution Graph (DG) creation.

FIG. 25 illustrates experimental circuit mapping results of instances of optimization for an embodiment of a reconfigurable computer architecture.

FIGS. 29, 30, and 31 illustrate experimental results showing the design trade-offs of three different LE embodiments.

FIG. 35 shows comparisons of average delays of benchmarks for different wire segment distributions under the assumption of 16 LEs in an SMB.

FIG. 36 shows performance comparisons for different nano RAMs.

FIG. 43 illustrates experimental results of mapping of benchmarks with memory accesses within NATURE.

FIG. 56 illustrates parameters for a FinFET embodiment on which a simulation was based.

FIG. 59 illustrates one embodiment of pseudo code which may be used with part of NanoMap in some embodiments.

FIG. 60 illustrates comparison results for different reconfigurable computer architectures.

FIG. 61 illustrates experimental results for area-delay product improvement for a 3D embodiment of a reconfigurable computer architecture.

FIG. 62 illustrates average power consumption in an embodiment of a 3D reconfigurable computer architecture for the LP mode with ABGB and normal mode without biasing for different folding levels.

FIGS. 63 and 64 illustrate experimental results comparing an embodiment of a 3D reconfigurable computer architecture with an embodiment of a 2D reconfigurable computer architecture.

Figure 1:
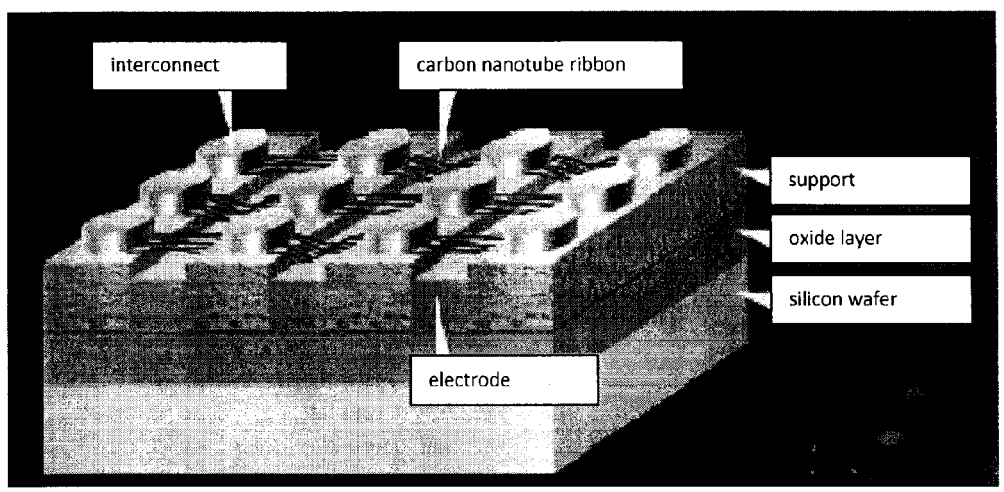
FIG. 1 schematically illustrates one embodiment of a nanotube random access memory structure.

It will be appreciated that for purposes of clarity and where deemed appropriate, reference numerals have been repeated in the figures to indicate corresponding features, and that the various elements in the drawings have not necessarily been drawn to scale in order to better show the features.

DETAILED DESCRIPTION

Embodiments of high-performance run-time reconfigurable architectures are provided, along with embodiments of a design optimization method and system to efficiency balance performance and area considerations of the architectures. A high-density, high-speed memory is implemented in the architecture to enable cycle-by-cycle reconfiguration and logic folding. Choice of different folding levels allows the designer flexibility in performing area-performance trade-offs. The significant increase in relative logic density (more than an order of magnitude for larger circuits) made possible by the disclosed embodiments and their equivalents can allow the use of cheaper reconfigurable architectures with smaller logic capacities to implement the same functionality, thus giving a boost to such use in cost-conscious embedded systems.

One embodiment implements a non-volatile nanotube random-access memory, that is considerably faster and denser than dynamic RAM (DRAM), has much lower power consumption than DRAM or flash, has similar speed to static RAM (SRAM) and is highly resistant to environmental forces (temperature, magnetism). Use of highly-dense nanotube random-access memories, such as a NRAM® chip, or of other emerging non-volatile memory technologies, including Phase Change RAMs (PCM), Magnetoresistive RAMs (MRAMs), and Ferroelectric RAMs (FRAMs), allows on-chip multi-context configuration storage, thereby enabling fine-grain temporal logic folding of a circuit before mapping to the architecture.

Reconfigurable architectures do exist in the art. However, their teachings are limited to allowing later stages of a pipeline to be executed in a same set of logic blocks that executed an earlier stage of the pipeline. This can be regarded as coarse-grain temporal folding. However, such architectures are largely limited to stream media or DSP applications. The claimed invention, on the other hand, supports fine-grain temporal folding, and is without the application limitations present in current reconfigurable architectures. Current reconfigurable architectures are described in the following, which is incorporated herein by reference for its useful background information:

S. C. Goldstein, H. Schmidt, M. Budiu, S. Cadambi, M. Moe, and R. R. Taylor, "PipeRench: A Reconfigurable Architecture and Compiler," *Computer*, vol. 33, pp 70-77, April 2000.

Carbon Nanotube & NRAM® Chips

Carbon nanotubes are hollow cylinders composed of one or more concentric layers of carbon atoms in a honeycomb lattice arrangement. The diameter of a nanotube is usually a few nanometers and length up to millimeters. Nanotubes exhibit unique electronic, mechanical and chemical properties. For example, carrier transport in nanotube is ballistic in the micrometer range and allows current densities as high as $10^9$ A/cm$^2$. These properties of nanotubes make them very attractive building blocks for molecular electronics.

Carbon nanotube random-access memories are described in the following, which is incorporated herein by reference for its useful background information:

J. W. Ward, M. Meinhold, B. M. Segal, J. Berg, R. Sen, R. Sivarajan, D. K. Brock, and T. Rueckes, "A Non-Volatile Nanoelectromechanical Memory Element Utilizing a Fabric of Carbon Nanotubes," in *Proc. Non-Volatile Memory Technology Symp.*, pp 15-17, November 2004.

FIG. 1 shows a basic structure of a carbon nanotube random-access memory 100, such as a NRAM® chip. Memory cells are fabricated in a two-dimensional array using photo-lithography. Each memory cell comprises multiple suspended nanotubes, support and electrode. The memory state is determined by the state of the suspended nanotubes—whether they are bent or not leads to well-defined electrostatically switchable ON/OFF states. When opposite voltages are applied to the support and electrode of a memory cell, the suspended nanotubes are bent due to VanderWals forces, reducing the resistance between the nanotubes and electrode to as low as several hundred ohms, corresponding to the "1" state. On the other hand, when the same high voltage is applied to the support and electrode, the nanotube remains straight or returns from the "1" state, resulting in a resistance of several Gigaohms, which is defined as the "0" state. Such ON/OFF states have been shown to be both electrically and mechanically very stable.

Phase Change RAMs, Magnetoresistive RAMs, and Ferroelectric RAMs (FRAMs)

Phase Change RAMs, Magnetoresistive RAMs, and Ferroelectric RAMs (FRAMs) are each respectively detailed in the following, each of which are incorporated herein by reference for their useful background information:

S. Lai, "Current status of the phase change memory and its future," in Proc. Int. Electron Devices Meeting, December 2003, pp. 10.1.1-10.1.4;

S. Tehrani, J. M. Slaughter, M. Deherrera, B. N. Engel, and N. D. Rizzo, "Magnetoresistive random access memory using magnetic tunnel junctions," Proc. IEEE, vol. 91, pp. 703-714, 2003;

G. R. Fox, F. Chu, and T. Davenport, "Current and future ferroelectric non-volatile memory technology," J. Vacuum Science Technology B., vol. 19, pp. 1967-1971, 2001.

NATURE Architecture

Figure 2:
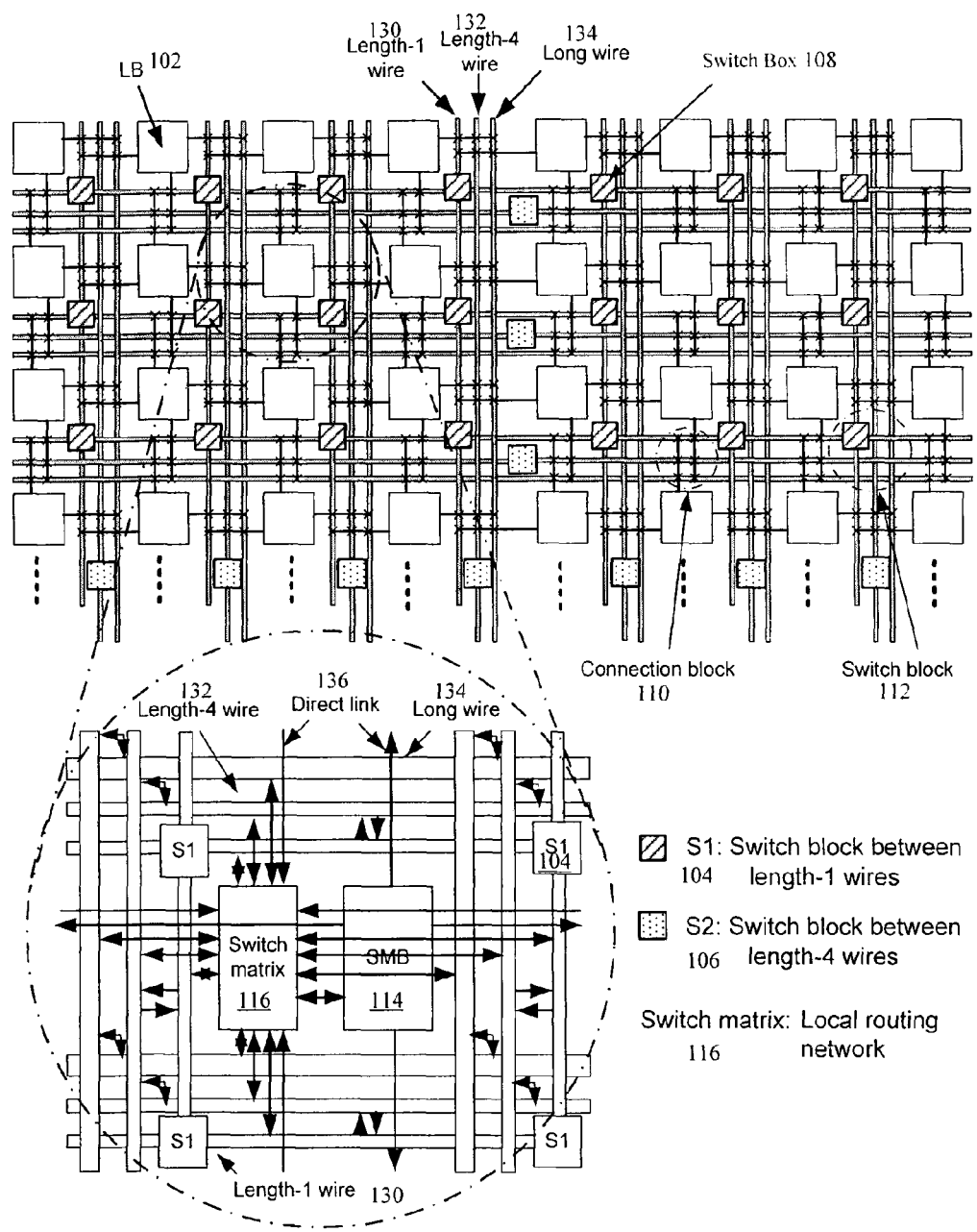
FIG. 2 schematically illustrates one embodiment of a high level view of a run-time reconfigurable computer architecture.

A high-level view of one embodiment of a reconfigurable computer architecture is shown in FIG. 2. In this embodiment, island-style logic blocks 102 (LBs) are illustrated and are connected by various levels of interconnect. Several types of wire segments are used to support local and global communications among LBs 102. S1 104 and S2 106 refer to switch boxes 108 that connect wire segments. Connection blocks 110 and switch blocks 112 are as indicated in FIG. 2. An LB 102 contains a super-macroblock (SMB) 114 and a local switch matrix 116. The inputs/outputs of an SMB 114 are connected to the interconnection network through a switch matrix 116 and neighboring SMBs 114 are also connected through direct links.

Super-Macroblock (SMB) Architecture

Figure 3:
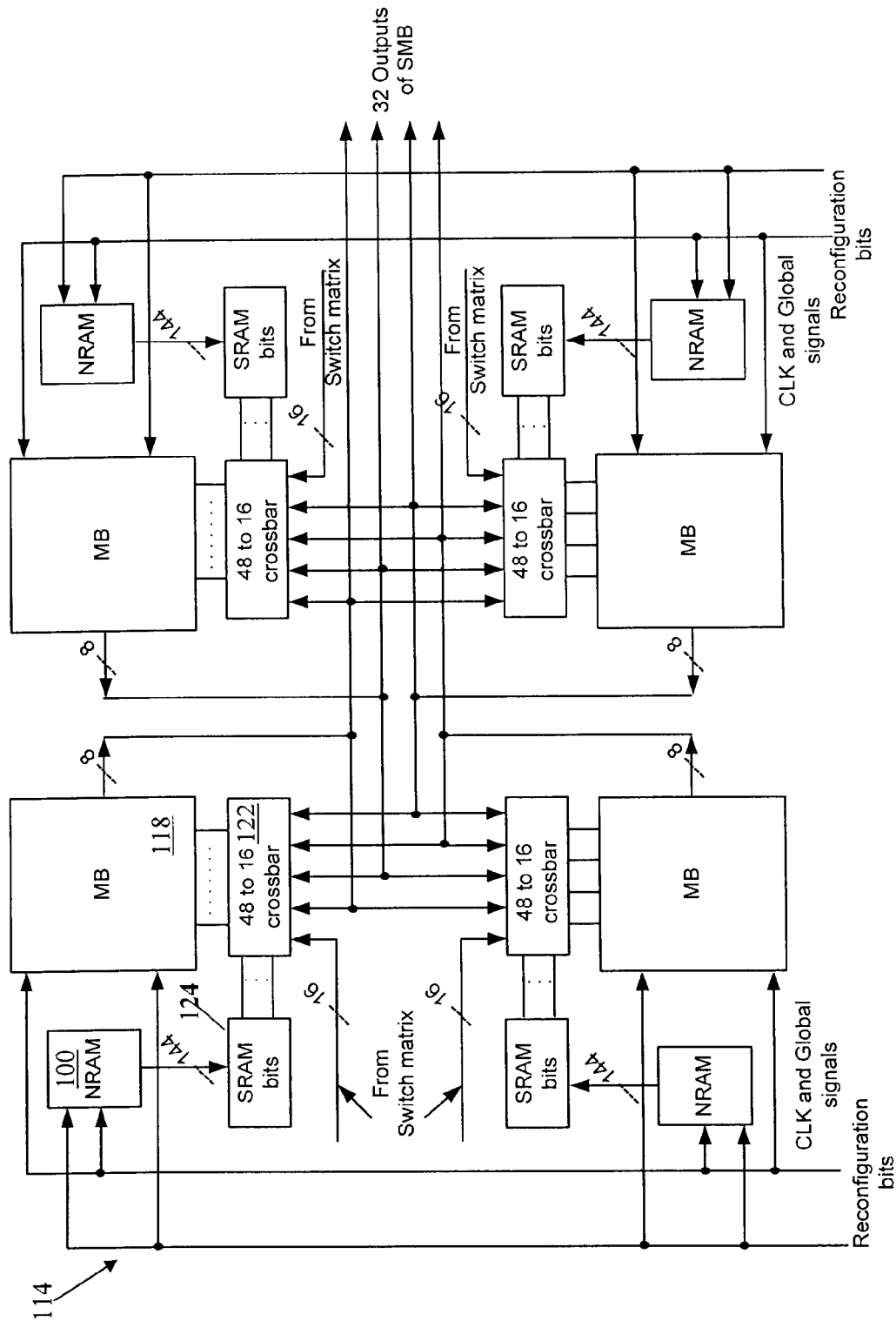
FIG. 3 schematically illustrates one embodiment of a lower level macro-block (MB).
Figure 4:
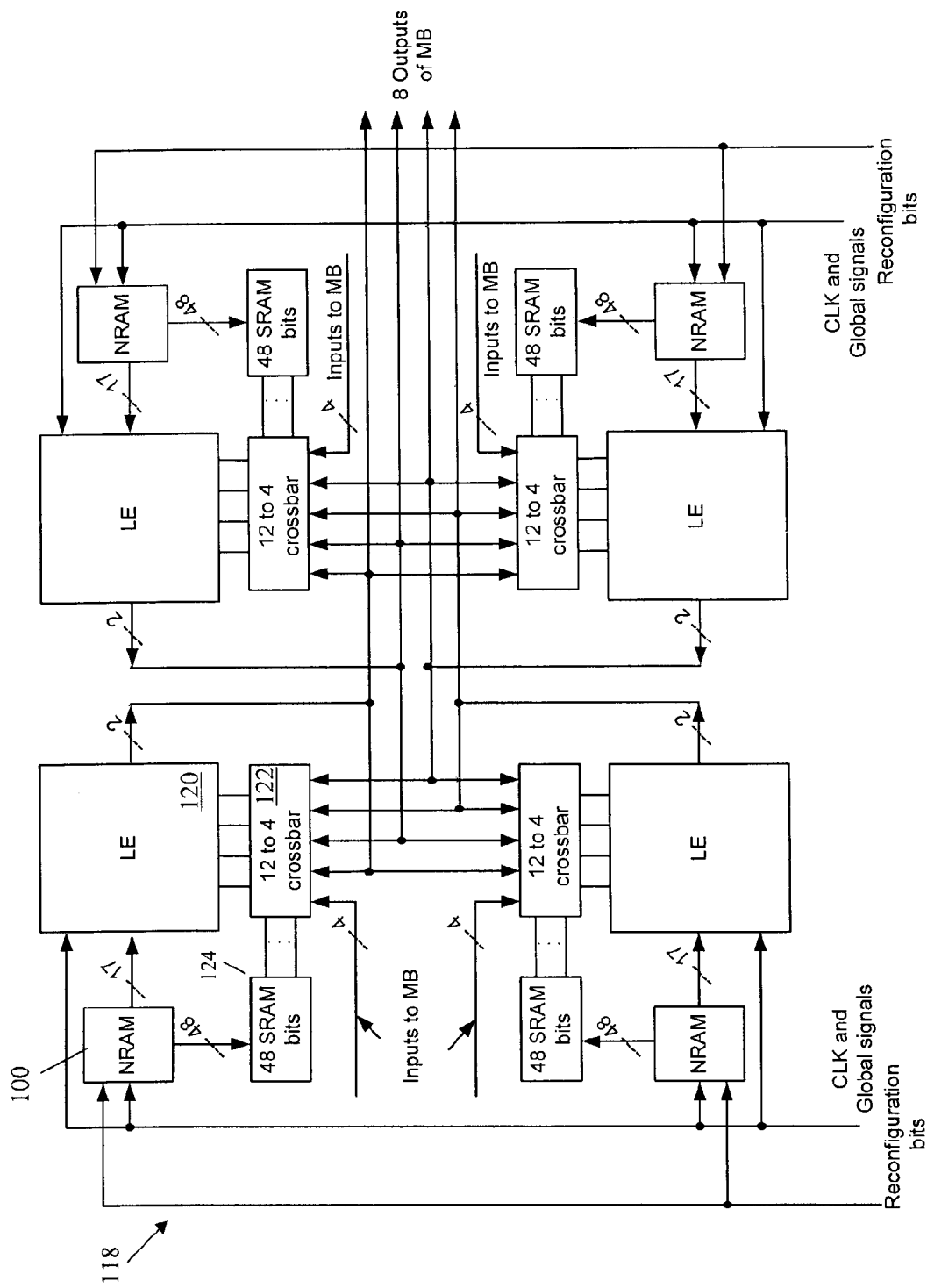
FIG. 4 schematically illustrates one embodiment of a higher level super macro-block (SMB).

The embodiments illustrated in FIGS. 2-4 present two levels of logic clusters in an LB 102 to facilitate temporal logic folding of circuits, and enable most inter-block communications to be local. As illustrated in FIG. 3, at a second (or higher level), each SMB 114 of the LB includes a cluster of one or more macroblocks (MBs) 118. In this second level, $n_2$ MBs 118 make up an SMB 114 (in FIG. 3, $n_2$=4). As illustrated in FIG. 4, at a first level (i.e., lower level), each MB 118 includes a cluster of one or more logic elements (LEs) 120. An MB 118 contains $n_1$ m-input reconfigurable logic elements (LEs) 120 (in FIG. 4, $n_1$=4). In the embodiments illustrated in FIGS. 3 and 4, each LE 120 and MB 118 is associated with (physically adjacent and connected to) a random access memory, such as a nanotube RAM 100, perhaps a NRAM® chip. Alternative embodiments may utilize other emerging non-volatile or volatile universal memories, for example, but not limited to register files, static RAMs, phase change RAMs, magnetoresistive RAMs, ferroelectric RAMs, and/or eDRAMs. Embedded dynamic random access memory (eDRAM) is a capacitor-based (and therefore volatile) dynamic random access memory which can be integrated (embedded) on the same die or in the same package as CMOS circuitry. Embedding permits higher operation speeds, and due to much higher density of DRAM in comparison to SRAM, larger amounts of memory can potentially be used within a given area. eDRAM may be manufactured by using standard CMOS processes.

Within an MB 118 or SMB 114, communications among various components can take place through a local crossbar 122. In this embodiment, a crossbar 122 is selected instead of a multiplexer at this level to speed up local communications. Since a crossbar 122 requires more SRAM 124 control bits, a slight price in area is exchanged for faster speed. However, since logic folding enables significant area savings, this area penalty is negligible. As shown in FIG. 4, the m inputs of a LE 120 can arrive from the outputs of other LEs 120 in the MB 118 or from the inputs to the MB 118. Similarly, the inputs of an MB 118 can arrive from the outputs of other MBs 118 or from the inputs to the SMB 114 through the switch matrix 116. The outputs (two in this embodiment) from an LE 120 can be used within the MB 118 or can go to the upper level SMB 114 or go to other SMBs 114 through the routing network. This logic/interconnect hierarchy maximizes local communications and provides a high level of design flexibility for mapping circuits to the architecture.

An LE 120 implements a basic computation. The LE 120 may include an m-input look up table (LUT) 126 and a flip-flop 128 (see FIG. 11(a), detailed below). The m-input LUT 126 can implement any m-variable boolean function. The flip-flop 128 stores the internal results for future use (when a circuit is temporally folded, the result of a previous stage is often needed by a subsequent stage). A pass transistor can be used to decide if the internal result will be stored or not.

Run-time Reconfiguration

Run-time reconfiguration is mainly enabled by the high-speed, high density random access memory, such as a carbon nanotube RAM 100 (or phase change RAMs, magnetoresistive RAMs, or ferroelectric RAMs) distributed throughout the architecture. The structure and operation of a carbon nanotube RAM are similar to those of a traditional memory. One minor difference is that in a carbon nanotube RAM, counters can be used instead of decoders as periphery circuits since reconfiguration bits for different logic contexts are read out in order.

A carbon nanotube RAM 100 is associated with each reconfigurable block (e.g., LE 120 or switch block 112, etc.) to store its run-time reconfiguration bits. Reconfiguration commences at one edge of the clock signal CLK, followed by computation at another edge of CLK. Reconfiguration bits are written into the carbon nanotube RAMs 100 at the time of initial configuration from off-chip storage. During run-time reconfiguration, reconfiguration bits are placed into SRAM 124 cells to configure the LE 120 or switch block 112 to implement different logic functionality or interconnections. For example, if k configuration sets are stored in a carbon nanotube RAM 100, then the associated components can be reconfigured k times during execution. As an example, for the MB 118 architecture embodiment shown in FIG. 4, 65 reconfiguration bits are required for a complete configuration set (when m=4). In this set, 16 bits are required for each 4-input LUT, and one bit for determining whether to store the internal result or not. Hence, when $n_1$=4, m=4, and k configuration sets are used, the total number of carbon nanotube RAM bits required for one MB is $65kn_1$.

Inclusion of carbon nanotube RAMs 100 (or phase change RAMs, magnetoresistive RAMs, or ferroelectric RAMs) in the LB 102 incurs area overhead. Assuming a 100 nm technology for implementing CMOS logic, 100 nm nanotube length, and k=16, the carbon nanotube RAMs 100 occupy roughly 10.6% of the LB 102 area. However, through carbon nanotube RAM-enabled logic folding, the number of LBs 102 required to implement a circuit is reduced nearly k-fold. To account for these facts, the concept of relative logic density is introduced, and is defined as the ratio of the amount of logic that architectures of the present invention can implement in a given amount of area compared to the amount of logic a traditional reconfigurable architecture can implement in the same amount of area. When k=16 and assuming the circuit being implemented can use 16 configurations (as most large circuits would), the relative logic density can be calculated as 16(1−0.106)=14.3. This means that in the same area, embodied architectures can implement roughly 14 times more logic than a traditional architecture, or equivalently need 14 times less area to implement the same functionality.

It can be seen that both the carbon nanotube RAM size and relative logic density vary with the value of k. If k is too small, more global communication may be needed. If k is too large, it may not be possible to make use of the extra configurations, thus leading to wasted carbon nanotube RAM area that could have been put to other use. Since the best k value varies with the specific design, the value of k can be obtained through a design optimization technique, such as the NanoMap embodiments, introduced below, or through design space exploration of the architecture with various values of k and mapping a large number of circuits to that instance of the architecture. In many instances, k=16 is a preferred value.

To further improve the performance of the architecture at the expense of increased area, one can use a shadow reconfiguration SRAM in some embodiments to hide the reconfiguration latency for transferring bits from the carbon nanotube RAMs to the SRAMs. This allows one group of SRAM bits to load reconfiguration bits from nanotube NRAMs, while another SRAM group supports the current computation. The performance improvement due to this feature will depend on the level of logic folding.

Interconnect Design

Reconfigurable interconnect resources are provided in reconfigurable architectures to enable communication between programmable LBs 102. Interconnect design is very important for reconfigurable architectures because routing delays can be quite large, and most of the chip area is devoted to programmable routing. Consequently, the routing architecture must be designed to be both fast and area-efficient, and to aid logic folding and local communication.

There are primarily two methods for providing both local and global routing resources: segmented routing and hierarchical routing. One embodiment of the present invention uses a hybrid of segmented and hierarchical routing. In this embodiment, within the SMB 114, the interconnect is hierarchical to aid the logic clusters and local communication. To connect SMBs 114, wire segments of various lengths are used. In segmented routing, short wires accommodate local traffic. Such wires are connected together using switch boxes to emulate long wires.

The following routing architecture features address an interconnect structure of the present invention:
  The length of each routing wire segment (i.e., how many LBs a routing wire spans before terminating);
  The number of wires (tracks) in each routing channel;
  The type of each routing switch: pass transistor, tri-state buffer or multiplexer (MUX);
  Location of routing switches and which routing wires they connect; and
  Size of transistors in the switches and the metal width and spacing of the routing wires.

For the length of each routing wire segment, since too many short wires decrease circuit performance, and too many long wires provide little routing flexibility and may waste area, one embodiment of the present invention implements a mixed wire segment scheme including length-1 130, length-4 132, and long wires 134. Length-1 130 (length-4 132) wire segments span one (four) LB(s) 102 before connecting to a switch block 112, while long wires 134 traverse the chip horizontally and vertically, connecting to each LB 102 along the way. Besides these wire segments, there are also direct links 136 from the outputs of one LB to its four neighboring LBs, further facilitating local communications.

Figure 5A:
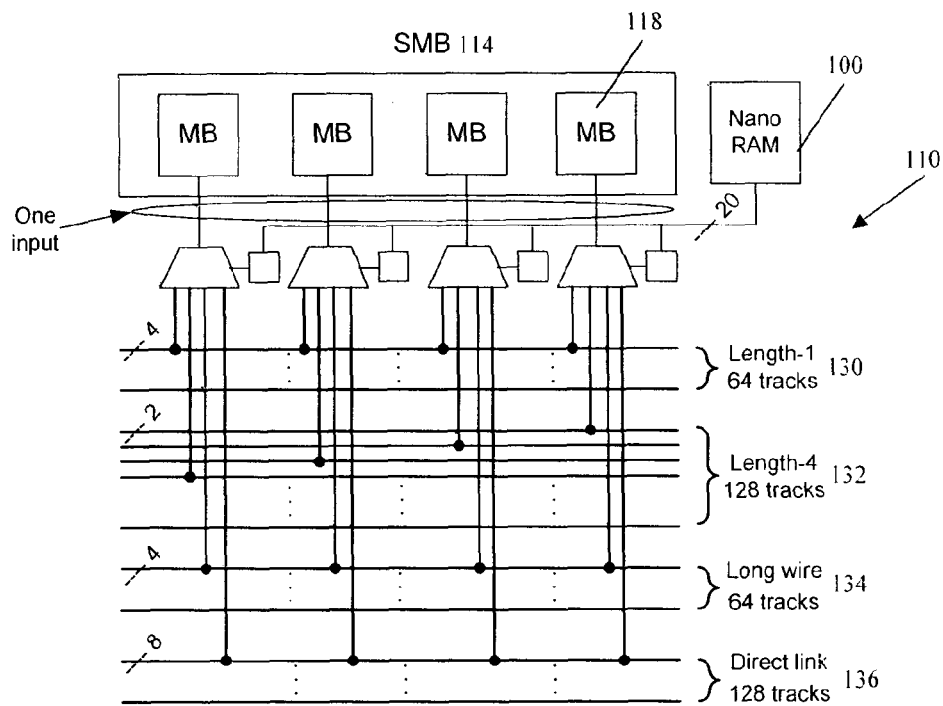
FIG. 5A schematically illustrates one embodiment of a connection block for one input of a MB.
Figure 5B:
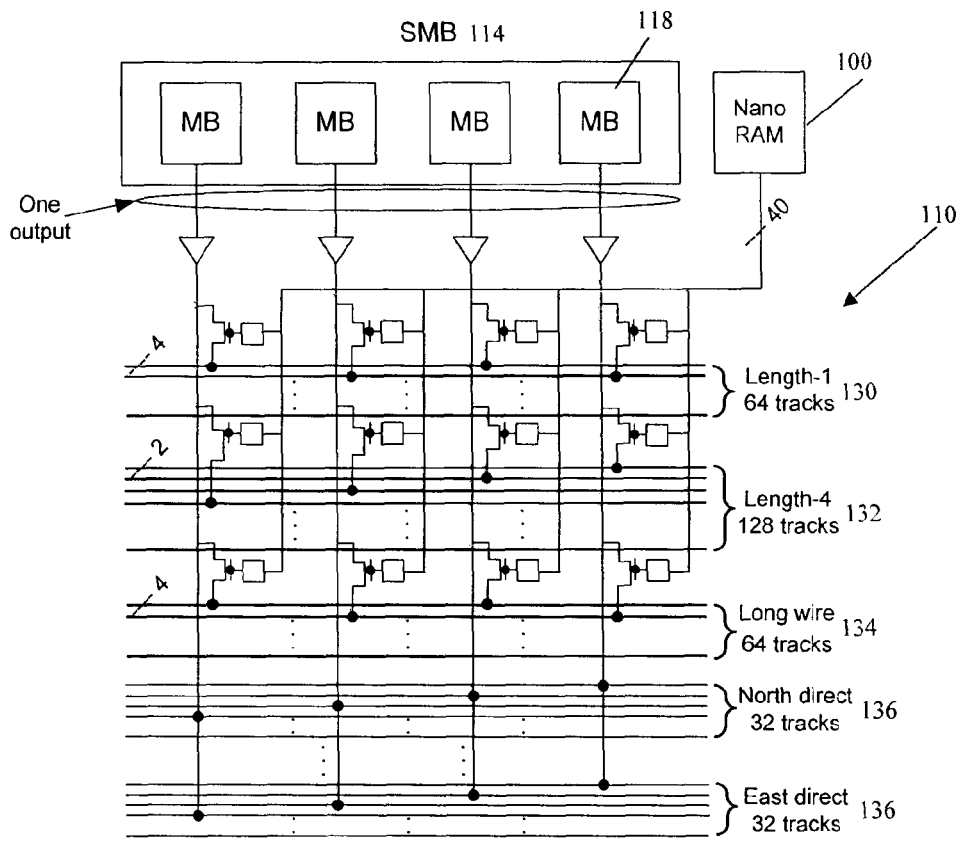
FIG. 5B schematically illustrates one embodiment of a connection block for one output from a MB.

To address the number of wires (tracks) in each routing channel, for the architecture instance in which $m=n_1=n_2=4$, I=64, and O=32 (where I/O refers to the number of inputs/outputs of an SMB), one embodiment of the invention implements 128 horizontal and vertical tracks and assume a 25%, 50%, and 25% distribution for length-1 130, length-4 132, and long wires 134, respectively, among the 128 tracks in each direction. In addition, 32 tracks are used for direct links 136 between adjacent SMBs (since O=32). FIGS. 5A and 5B illustrate different possible embodiments among many embodiments of how the inputs/outputs of an SMB 114 may connected to the routing network.

Figure 6:
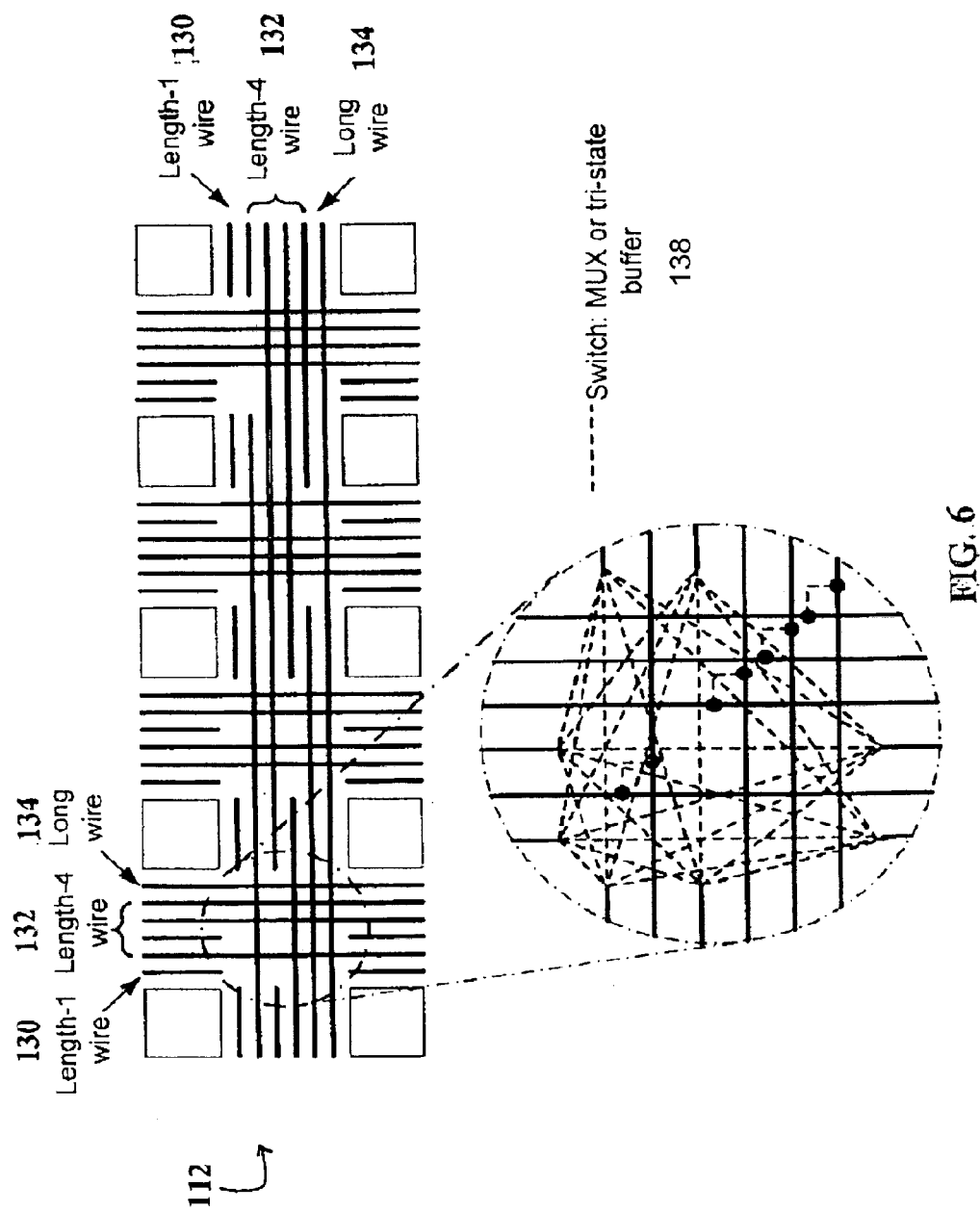
FIG. 6 schematically illustrates one embodiment of a switch block.

Next is a consideration of the design of the connection block 110, characterized by $F_c$, and switch block 112, characterized by $F_s$ ($F_c$ refers to the number of adjacent tracks a pin of an LB can connect to and $F_s$ the number of tracks to which each track entering the switch block can connect). Higher values of $F_c$ and $F_s$ result in higher routing flexibility, however, at the expense of a higher number of switches and hence more routing area. For a cluster of N LUTs, $F_c$ can be chosen as 1/N of the total number of tracks and $F_s$ should be greater than three in order to achieve routing completion while maintaining area efficiency. In one embodiment of the invention, $F_c=1/N$ and $F_s=6$ is used. Another related and important issue is whether or not the internal connection blocks or switch blocks should be populated (such a block is said to be populated if it is possible to make connections from the middle of the block to LBs or to other blocks). When both are fully populated, the number of routing tracks required to achieve routing completion can be reduced, at the expense of a larger number of switches attached to a wire (resulting in more capacitance and, hence, decrease in speed). In one embodiment of the invention, the connection blocks are depopulated and the switch blocks are populated to provide the best performance-area advantage. FIG. 6 shows an example connection of disjoint switch blocks 112.

The third feature considers the type of switch. There are typically three types of switches: pass transistor, multiplexer and tri-state buffer (although other types of switches could be used in other embodiments). Since a pass transistor has the shortest switching time, pass transistors are implemented in one embodiment of the invention for the local crossbars within the MB and SMB. A multiplexer has longer delay, but needs fewer reconfiguration bits. Therefore, a multiplexer 138 is implemented in one embodiment of the invention to connect to the inputs of a SMB 114 (e.g., see FIG. 10, detailed below). The outputs of an SMB can be connected to long interconnects through tri-state buffers in the switch matrix.

For the last feature, one embodiment of the invention uses pass transistors that are 10 times the size of a minimum-sized transistor and five times the size of a minimum-sized transistor for tri-state buffers and multiplexers. Minimum width and spacing are used for the metal wires.

Temporal Logic Folding

Temporal logic folding provides design flexibility and benefits in the present invention. The basic idea behind logic folding is that one can use run-time reconfiguration, and in one embodiment of the invention nanotube RAM-enabled run-time reconfiguration, to realize different Boolean functions in the same LE every few cycles. For example, suppose a subcircuit can be realized as a series of n serially connected LUTs. Traditional reconfigurable architectures will need n LUTs to implement the subcircuit. However, using run-time reconfiguration, at one extreme all these LUTs can be mapped to a single LE, which is configured to implement LUT1 in the first cycle, LUT2 in the second cycle, and so on, requiring n cycles for execution. Traditional reconfigurable architectures only support partial dynamic reconfiguration and do not allow such fine-grain temporal logic folding. Moreover, all communications between the LUTs mapped to the same LE are local. Hence, global communication is reduced, and routing delay is significantly reduced as well.

Logic folding occurs at the expense of reconfiguration time. However, results reveal that the time required to output the reconfiguration bits from an carbon nanotube RAM to the SRAM (i.e., the reconfiguration time to switch from one LUT to another), is only around 160 ps. This is small compared to routing delay saved. Also, by allowing use of shadow SRAM, the reconfiguration time can be hidden by overlapping computation.

Figure 7A:
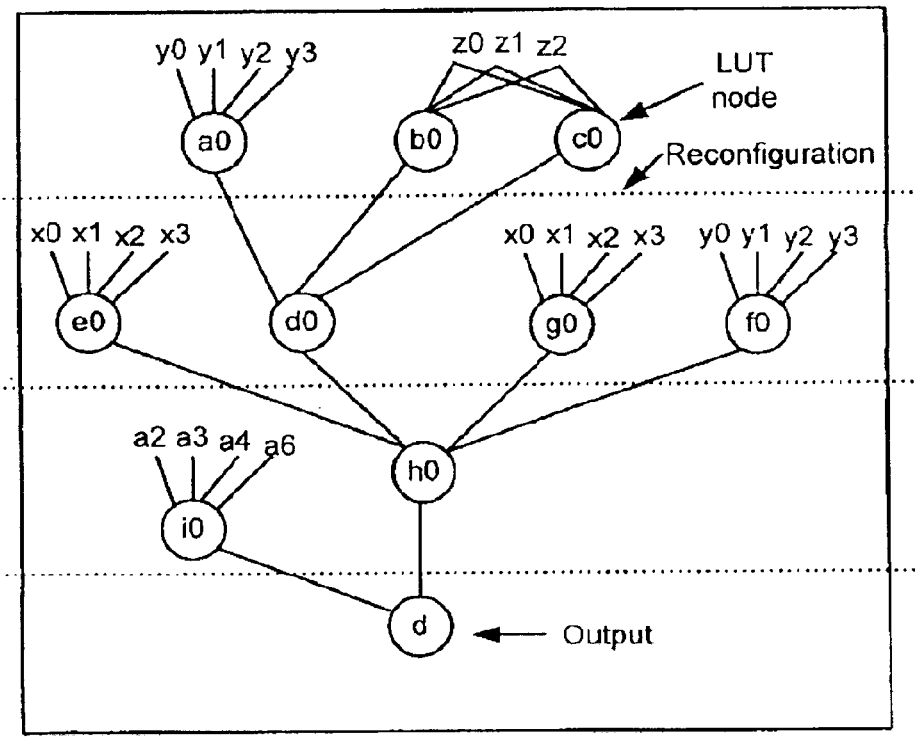
FIG. 7A schematically illustrates one embodiment of level-1 temporal logic folding.
Figure 7B:
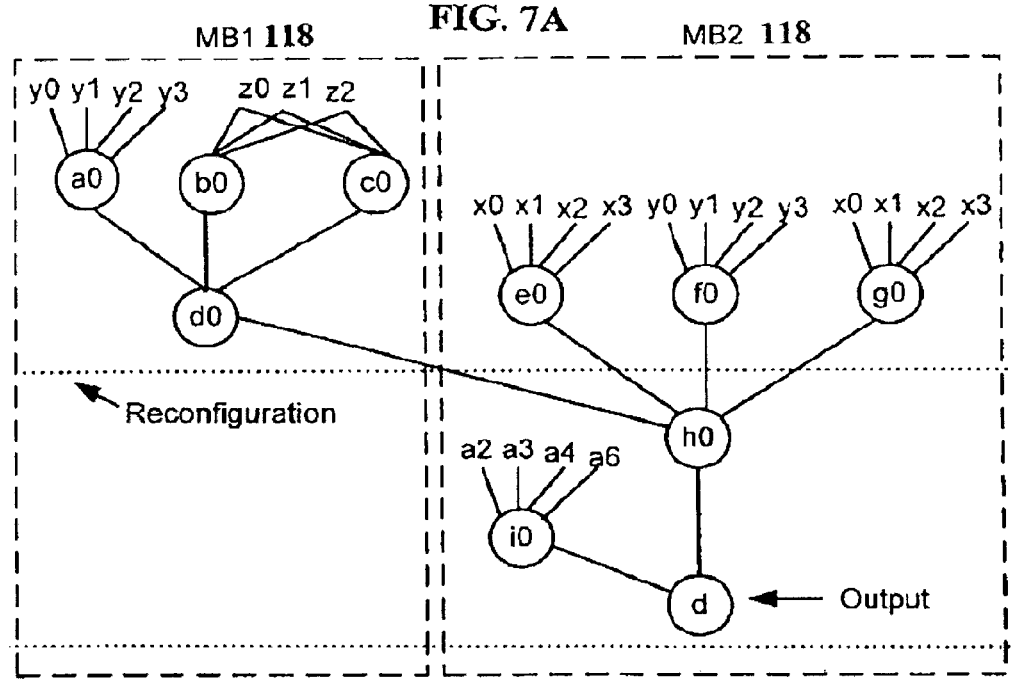
FIG. 7B schematically illustrates one embodiment of level-2 temporal logic folding.

Logic folding can be performed at different levels of granularity, providing flexibility to enable area-performance trade-offs. As an example, consider the LUT graph (in which each node denotes a LUT) shown in FIG. 7A, which denotes level-1 folding. Such a folding implies that the LEs are reconfigured after the execution of each LUT mapped to it. On the other hand, FIG. 7B shows level-2 folding, implying reconfiguration of the LE after execution of two LUT computations. A level-p folding can be similarly defined. The case of no folding corresponds to mapping of circuits to a traditional reconfigurable architecture in which spatial partitioning of the LUT graph is feasible, but not temporal folding.

There are various trade-offs involved in the choice of the folding level. First, when the folding level is large, the cycle period increases because a larger amount of computation is executed in one cycle. The number of LEs needed also increases since they are not fully time-shared. However, the total number of cycles decreases. This fact coupled with the reduction in reconfiguration time may reduce total circuit delay. However, this would generally be true when communications between LEs are still local in the folded circuit, usually within the range of several SMBs. If the area required for implementing the subcircuit is out of this range and long global communication is required in one cycle, then a small folding level may give better performance.

Another important advantage of logic folding occurs when the circuit is too large to fit into a traditional reconfigurable architecture; it could then be mapped into the embodied architectures, and their equivalents, with logic folding. In a situation where the number of available LEs is limited, factors considered for obtaining the best folding level may differ from those mentioned above. In such a case, the number of cycles required to execute the whole computation will be dependent on the number of computation nodes in the LUT graph divided by the number of available LEs. Hence, the best folding level might be one that best uses the available LEs. A smaller folding level will use LEs less efficiently, and require more cycles, while a larger folding level will increase the cycle period and result in time inefficiencies.

Experimental Results—NATURE

Various MCNC benchmarks and arithmetic circuits illustrate the benefits of the run-time reconfiguration and logic folding features described herein. Some embodiments of the reconfigurable computer architectures present a family of carbon nanotube RAM-based (and phase change RAM-based, magnetoresistive RAM-based, and ferroelectric RAM-based) reconfigurable architectures at different levels of granularity in terms of the number of LEs in an MB ($n_1$), number of MBs in an SMB ($n_2$), number of inputs per LE (m), number of configuration sets stored in the NRAM (k), etc. Accordingly, different architecture instances may be best suited for different circuit types. Since it appears that a cluster of four 4-input LUTs provides one of the best area-delay trade-offs, one embodiment (for experimental purposes) uses an architecture instance corresponding to $n_1=4$, $n_2=4$, and m=4. Parameter k is varied in order to compare implementations corresponding to selected folding levels: level-1, level-2, level-4 and no logic folding (note that the number of carbon nanotube RAM bits increases as we go from no folding to level-4 folding and towards level-1 folding since the number of LE configurations increases).

For this experiment, several small/middle sized benchmarks were manually mapped to the underlying architecture instance. The depth of the circuit LUT graph, number of LEs, circuit delay, product of number of LEs and delay (this is a proxy for the area-time product, which is reasonable since this embodiment is a regular architecture), and frequency are shown, for different levels of folding, in Table I of FIG. 8. These results are based on 100 nm CMOS technology parameters.

Area/performance trade-offs that become possible because of use of logic folding were observed. Consider the 64-bit ripple-carry adder. Its LUT graph has 64 LUTs on the critical path. Using level-1 logic folding, the complete adder can be mapped to only two LEs. This, of course, requires reconfiguration of the LEs from the local carbon nanotube RAMs at each cycle. If more LEs are allowed (as in level-2, level-4 and no folding cases), the execution time goes down because fewer reconfigurations are required (note that, in this instance, the presence of a shadow SRAM is not assumed to overlap the reconfiguration and computation times of an LE—if assumed, the execution time for level-1 folding would go down by roughly 1.6× at the expense of a doubling of SRAM area). Traditional reconfigurable architectures will require 128 LEs for such an adder (some architectures incorporate a carry generation circuit with each LE; in such a case, they will require 64 LEs although each LE will be larger due to the carry generation circuit overhead) because they cannot perform any temporal logic folding. As the number of required LEs increases, the need for using higher-level (i.e., more global) interconnects to connect them also increases. This is one of the reasons traditional reconfigurable architectures are not competitive with ASICs in terms of performance.

Next, consider the area-time product. For larger, more serially-connected circuits of larger depth, the area-time product advantage of level-1 folding relative to no folding is typically larger. For example, for the 64-bit ripple-carry adder, it is observed that the advantage is about 34×. This results from a large saving in area while maintaining competitive performance.

Table I of FIG. 8 also illustrates that the claimed invention can operate at high frequency. Peak frequency is around 3.3 GHz. From level-1 folding to no-folding, the frequency decreases because increasingly more computation is included in one cycle period.

In spite of the fact that traditional reconfigurable architectures devote a vast majority of their area to interconnects, their LE utilization may not be high (an extremely large number of routing tracks may be needed to approach 100% LE utilization). Because of the cycle-by-cycle reconfiguration features of the architecture of the claimed invention, the LE utilization and relative logic density can be very high, with a reduced need for a deep interconnect hierarchy. Thus, architecture embodiments suggest an evolutionary path for existing reconfigurable architectures, where fewer levels of interconnect hierarchy will be used and the area saved can provide for distribution of emerging universal memories (non-volatile or volatile), such as carbon nanotube RAMs, throughout the chip.

As discussed, NATURE can be characterized along a large number of varying dimensions, all of which are contemplated in the claimed invention. A non-exclusive list of exemplary characterizations are: 1) number of logic elements (LEs) per logic block; 2) number of inputs per LE; 3) size of carbon nanotube RAMs supporting each LE (this determines the granularity of reconfiguration); 4) depth of the FPGA interconnect hierarchy (localized communications can help drastically reduce this depth); 5) mix of different types of interconnects (much fewer longer interconnects are necessary); 6) number of registers per LE (because of the success of logic folding in reducing the number of LEs required for implementing the combinational logic by an order of magnitude, implementing sequential blocks now becomes the bottleneck for further area reduction); etc.

Figure 9:
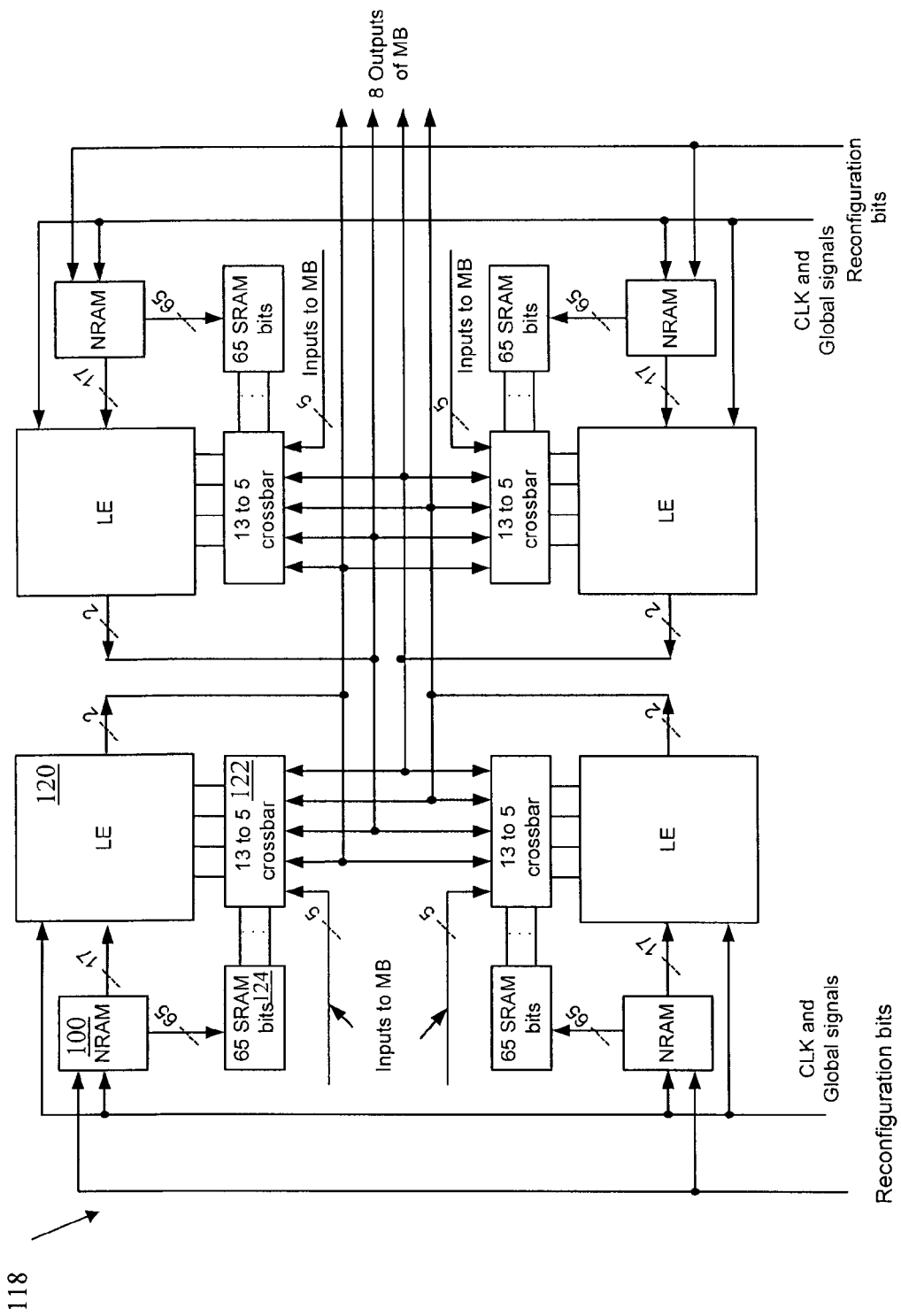
FIG. 9 schematically illustrates another embodiment of a lower level MB.
Figure 10:
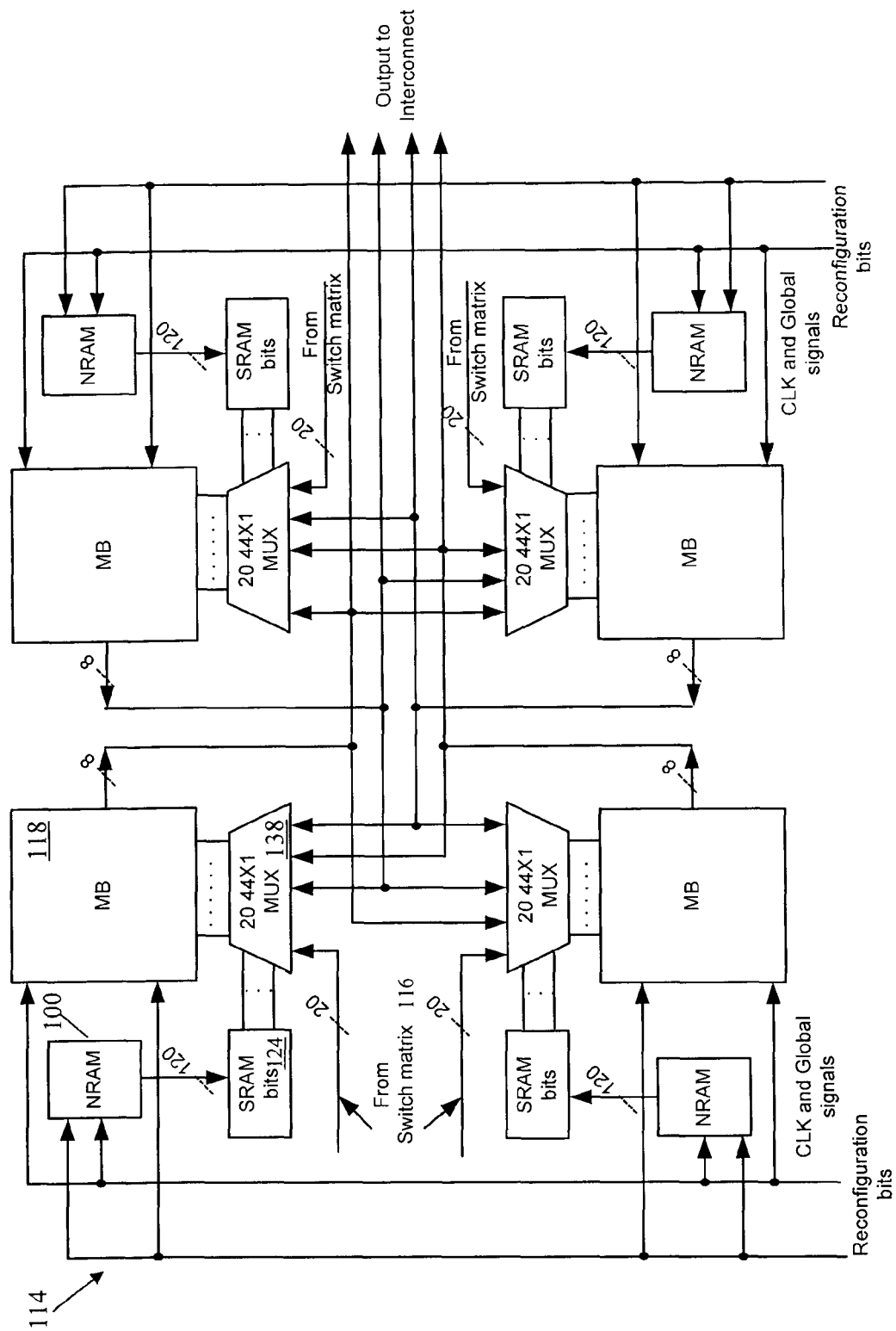
FIG. 10 schematically illustrates another embodiment of a higher level SMB.

For instance, as an extension of the high level architecture view of FIG. 2, consider an alternative embodiment SMB 114 architecture, as illustrated in FIGS. 9 and 10. The alternative SMB 114, in this embodiment, again includes two levels of logic. The first (i.e., lower) level, called the macroblock (MB) 118, is shown in FIG. 9. The MB 118 contains $n_1$ reconfigurable LEs 120 (in this embodiment, $n_1$=4). A 13 to 5 crossbar 122 is used to speed up the local communication. In the second (i.e., higher) level, $n_2$ MBs 118 comprise an SMB 114, as shown in FIG. 10 (in this embodiment, $n_2$=4). In this SMB 114, since many reconfiguration bits are necessary to configure a full crossbar 122, a multiplexer 138 is instead used for local communication. This architecture facilitates temporal logic folding of circuits and enables most inter-block communications to be local.

In the FIGS. 9 and 10 embodiments, the inputs of an MB 118 can arrive from other MBs 118 or the switch matrix 116. Similarly, the inputs of an LE 120 can arrive from other LEs 120 or MBs 118 or the switch matrix 116. The outputs from an LE 120 can be used within the MB 118 or go to the upper level SMB 114 or go to other SMBs 114 through the switch matrix 116.

Figure 11B:
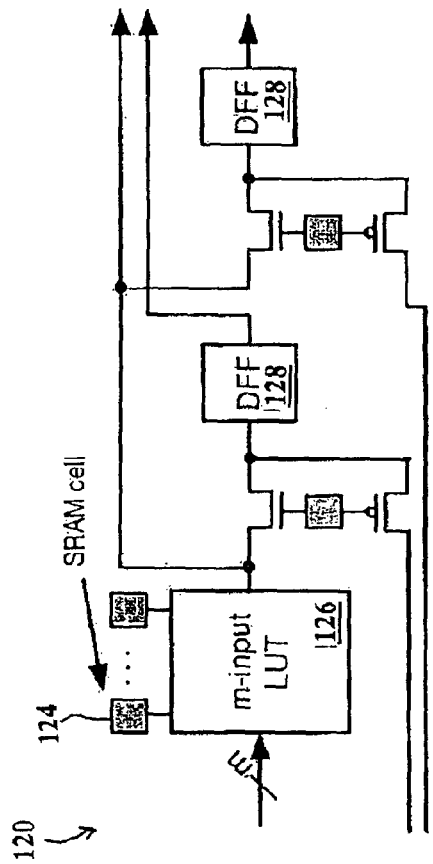
FIG. 11B schematically illustrates an embodiment of a logic element (LE) architecture having two flip-flops.
Figure 11A:
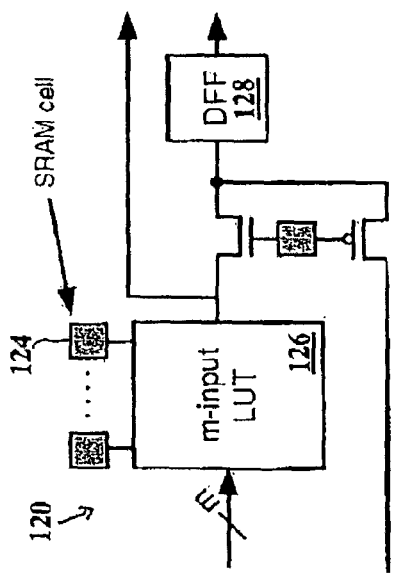
FIG. 11A schematically illustrates one embodiment of a logic element (LE) architecture having one flip-flop.

The inputs to the LE 120 include m inputs to a look-up table (LUT) 126 and one to a flip-flop 128, as shown in FIG. 11(a). In this embodiment, m=4. The flip-flop 128 can store the computation result from the LUT 126 (when a circuit is temporally folded, the result of a previous stage is often needed by a subsequent stage), or the value of a primary input. This gives the flexibility of storing a LUT computation result in the flip-flops 128 of other LEs 120. The m-input LUT 126 can implement any m-variable Boolean function.

To realize cycle-by-cycle logic reconfiguration capability, an carbon nanotube RAM 100 is again associated with each reconfigurable block (i.e., LE 120 or crossbar 122), to store the run-time reconfiguration bits. During reconfiguration, the reconfiguration bits are placed in the SRAM 124 cells to reconfigure the LE 120 or crossbar 122 to implement different logic functionality and interconnections. For example, if k configuration sets are stored in the carbon nanotube RAM 100, then k different logic functions can be realized within the same hardware resource without the need to access off-chip storage. For the MB 118 architecture shown in FIG. 9, 82 reconfiguration bits are required for a complete configuration set (when m=4). In this set, 16 bits are required for each 4-input LUT, and one bit for determining whether to store the internal result or not. Hence, when $n_1$=4, m=4, and k configuration sets are used, the total number of carbon nanotube RAM bits required for one MB 118 is $82kn_1$. A detailed layout and SPICE simulation show that a 16-set carbon nanotube RAM storage (i.e., k=16) introduces 10.6% area overhead with 160 ps on-chip reconfiguration time (i.e., the access latency of on-chip carbon nanotube RAM). Using this setup, the logic density is improved by 14× on average. In addition, logic folding constrains most communication to be local, which greatly reduces the need for global interconnect.

As a basis for relative discussions concerning other alternative NATURE architectures, the embodiment of FIGS. 9, 10 and 11A will be hereinafter referred to as the baseline design. That is, as detailed below, the baseline design describes an FPGA instance where the number of inputs per LE m=4, number of LEs per MB $n_1$=4, and number of MBs per SMB $n_2$=4, one LUT and one flip-flop per LE, and number of reconfiguration sets k=16.

Figure 12:
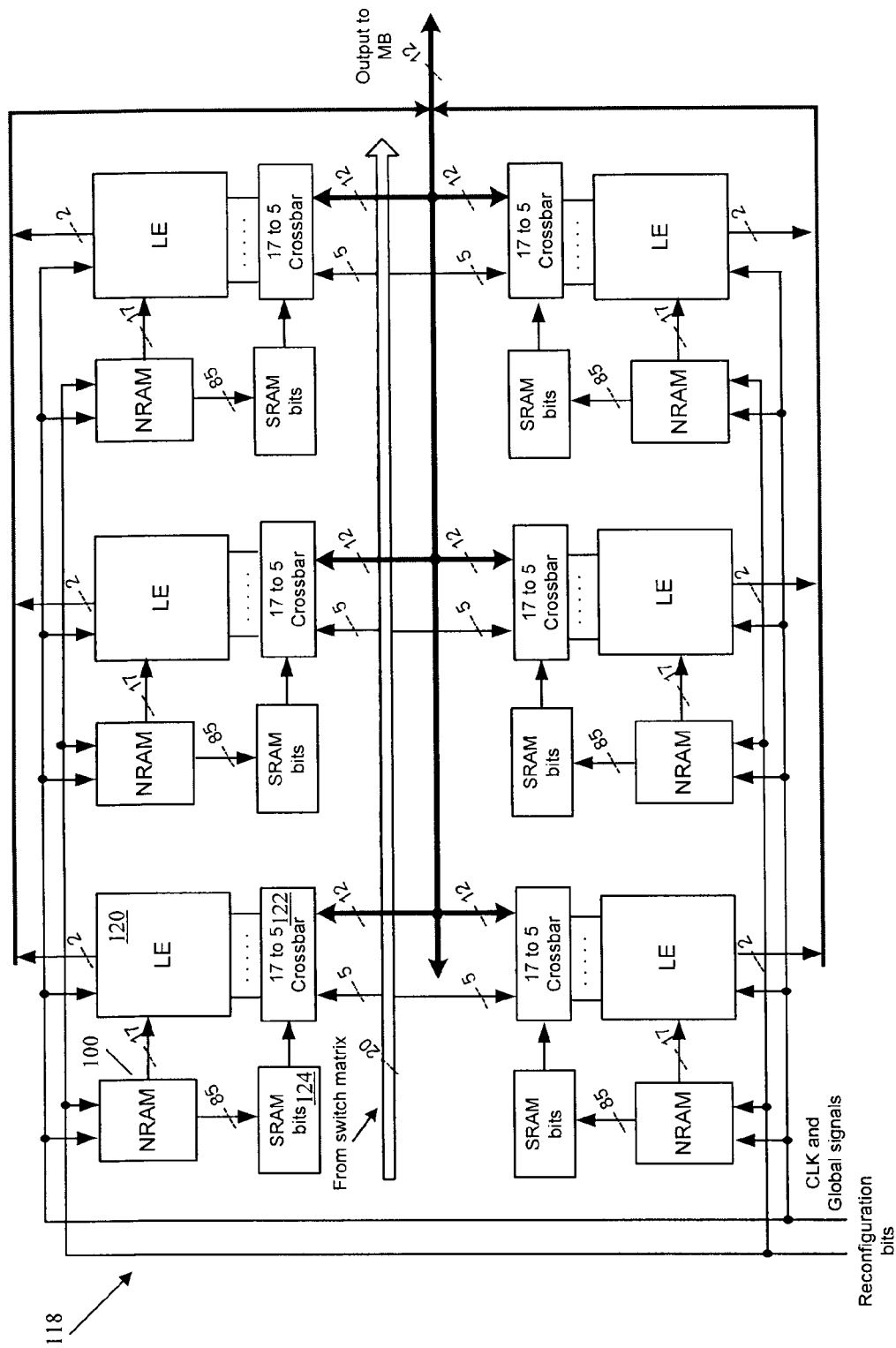
FIG. 12 schematically illustrates a further embodiment of a lower level MB.

Number of LEs $n_1$ Per MB: Changing the value of $n_1$ leads to area-delay trade-offs. For example, consider $n_1$=6, as shown in the exemplary embodiment of FIG. 12. This configuration leads to larger crossbars 122 within the MB 118, and a larger carbon nanotube RAM 100 to reconfigure it since more LE 120 outputs need to be connected to the crossbars 122. At the same time, more LEs 120 in an MB 118 increases the number of outputs from the MB 118. This also results in increases to both the size of the input multiplexers 138 to the MB 118, and the amount of interconnects associated with the MB 118, as shown in FIG. 13(a). In all, the area of an SMB increases by 1.9× for $n_1$=6, compared with $n_1$=4. Thus, relative area per LE goes up by 1.9/1.5=1.27×. The level of folding desired in a given application, and other area-delay constraints, will determine whether the increase in relative area per LE is advantageous.

Figure 14:
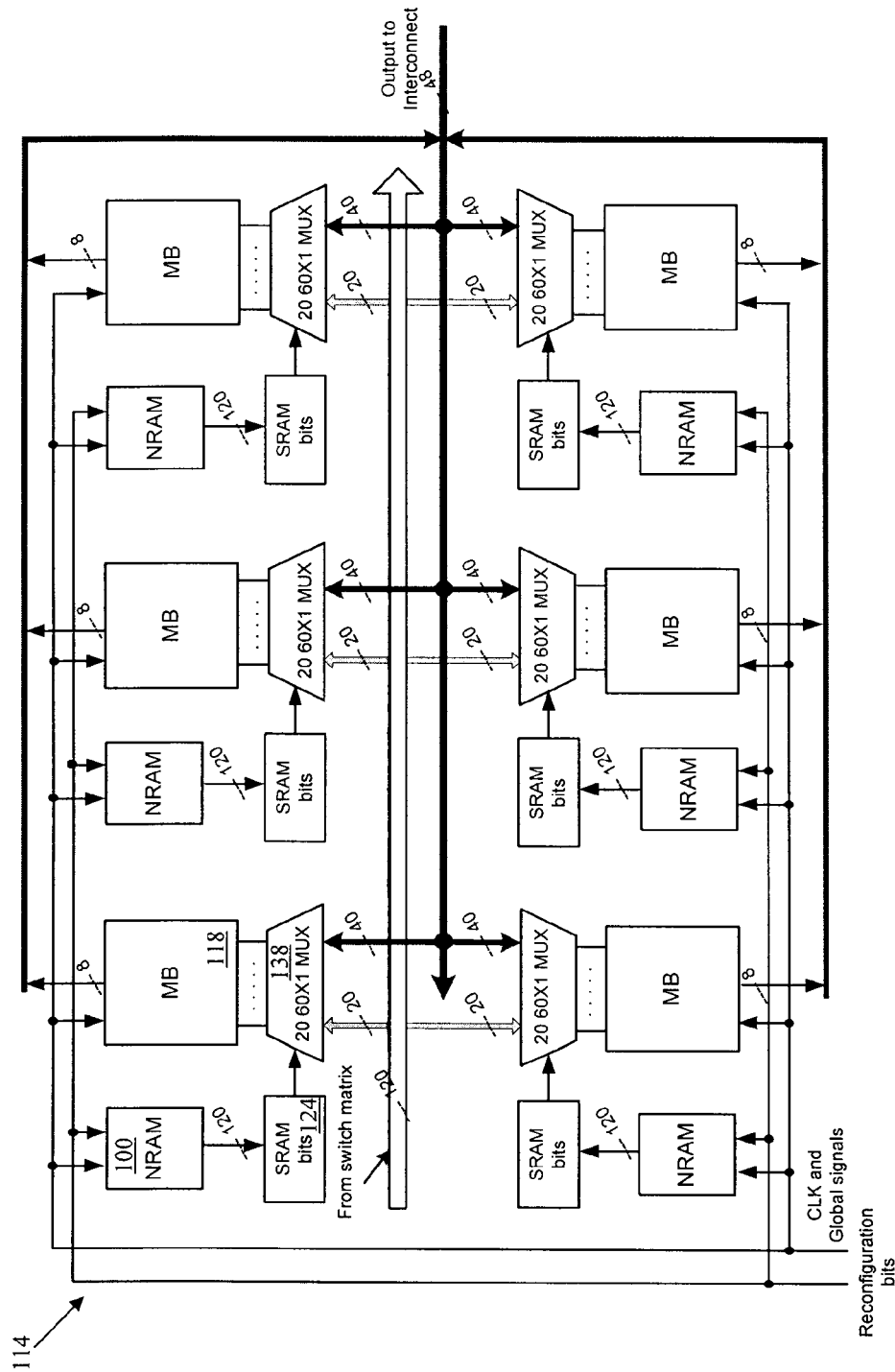
FIG. 14 schematically illustrates a further embodiment of a higher level SMB.

Number of MBs $n_2$ Per SMB: Varying $n_2$ will also result in area/delay trade-offs. Increasing $n_2$ allows more logic to be implemented in an SMB 114, and more local communications between MBs 118 within the SMB 114. Hence, circuit delay may be reduced. However, the area of the SMB 114 will increase correspondingly. Consider the case of $n_2$=6, as shown in the exemplary embodiment of FIG. 14, and for which the high-level LB 102 view is shown in FIG. 13(b). Since there are 1.5× more MBs, and the MB architecture is unchanged, the number of outputs of the SMB increases by 1.5×, in turn resulting in a 1.5× increase in the number of interconnect tracks necessary to connect all the SMB outputs while maintaining the same $F_c$ as the baseline design. Consequently, the size of the switch matrix will also increase since the inputs of the SMB will be selected from more interconnect tracks. When $n_2$ increases from four to six, the area of the LB again increases to 1.9×, and relative area per LE increases by 1.9/1.5=1.27×. Depending on the particular application, and respective level of folding, the corresponding reduction in circuit delay would need to be evaluated against the above-identified increase in relative area to determine if this embodiment is desirable.

Figure 15:
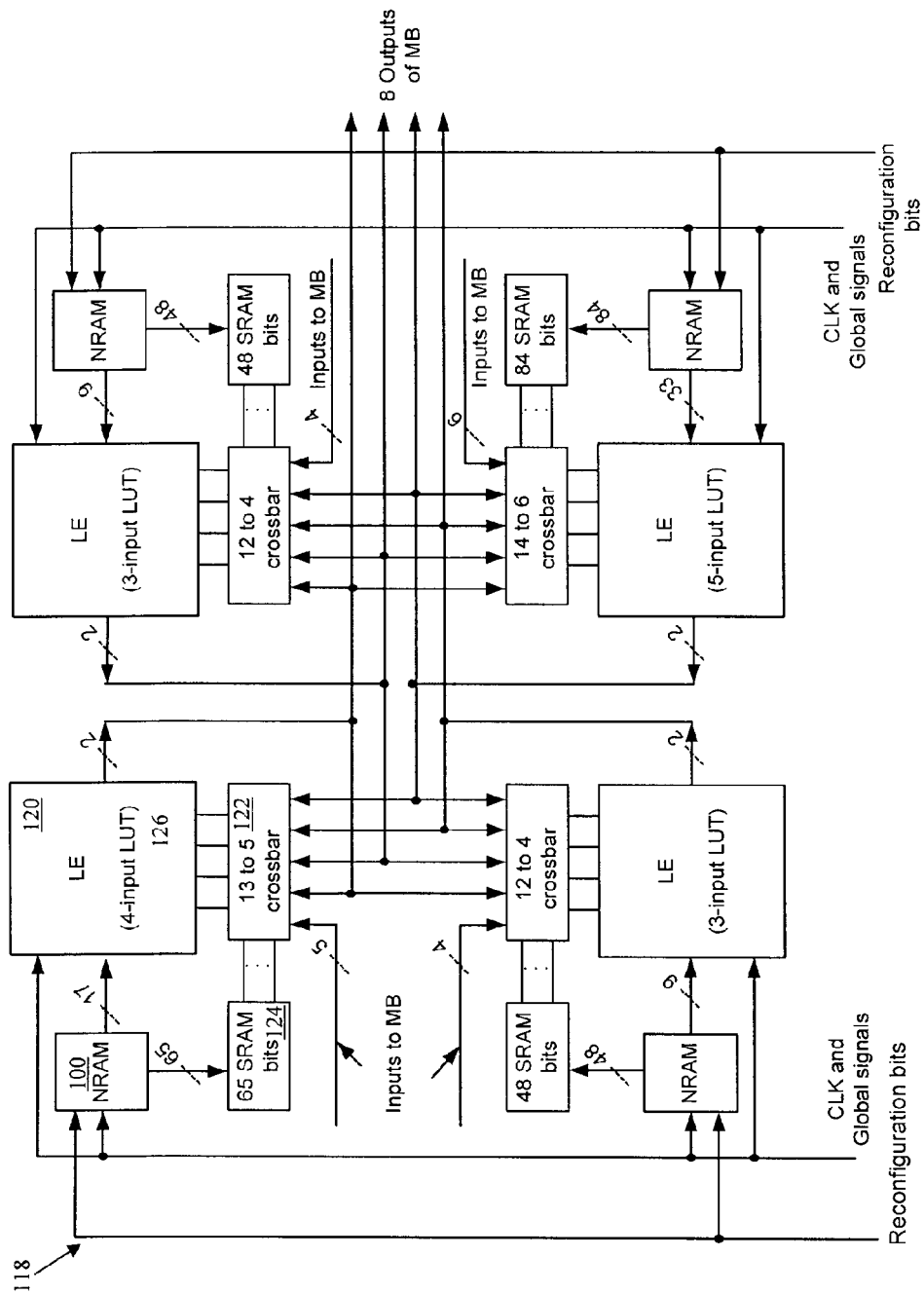
FIG. 15 schematically illustrates a further embodiment of a lower level MB where the number of inputs vary for any given LUT of each LE.

Number of Inputs m Per LUT: The number of inputs m for each LUT is a very important consideration for any FPGA architecture. If m is too large, and the application cannot always make use of all the inputs of each LUT, area is wasted. If m is too small, a larger number of LUTs are required and, therefore, more MBs, SMBs and more interconnect communications. For example, if m=5, the SMB area increases to 1.25×. In an instance where most LUTs only require four inputs, the mapped number of SMBs remains nearly the same. Hence, the mapped area increases by 1.25×. However, random logic (such as a controller) may benefit from a larger m. Because of the ability of FPGAs in the present invention to implement temporal logic folding, the value of m most suitable to conventional FPGAs may not be the same as in the present invention. Further, depending on the application, and desired folding level, the present invention contemplates that different inputs can exist for any given LUT 126 for each LE 120 of a MB 118. An exemplary embodiment is shown in FIG. 15.

Number of Flip-Flops Per LE: Since temporal logic folding may reduce the combinational logic by more than an order of magnitude, the number of registers in the circuit may now become the bottleneck of further area reduction. Thus, as opposed to traditional LEs that include only one flip-flop, the present invention includes embodiments having more flip-flops per LE to further reduce the number of LEs required. However, if the inputs to the flip-flops are separately accessed, the number of inputs/outputs of an LE will increase as the number of flip-flops in an LE increases. Then, as discussed above, the communication network within and outside the SMB may grow very fast due to the increase in the number of inputs/outputs per LE, MB and SMB. Hence, the SMB size may increase significantly. If flip-flops in each LE are not used efficiently, area may be wasted.

For example, assume two flip-flops 128 per LE 120 as shown in FIG. 11B. The input for each flip-flop 128 is distinct in this embodiment, providing that different values are stored in each of the two flip-flops 128 at the same time. This arrangement results in an increase: 1) in the size of the crossbar 2 in an MB 118; in the size of the input multiplexer 138 in an SMB 114; and 3) in the number of inputs to each SMB 114. The area of the SMB thereby increases by 1.5×.

In an instance of level-1 folding with configuration sets k=16, significant area savings were realized (i.e., reduced number of LEs). However, increasing the number of flip-flops to three per LE could result, in the same instance, in an area increase. Since area saving depends on the value of k, simultaneously consideration of these two parameters are necessary.

Number of Reconfiguration Sets k: The value of k determines the amount of logic folding possible. If k is too small, more LEs are needed to perform a mapping. If k is too large, use of the extra configurations may not be possible, thus resulting in wasted carbon nanotube RAM area that could have been put to other use. Complicating this fact is that the best value of k varies with a change in the optimization objective (e.g., area, delay or area-delay product).

Figure 16:
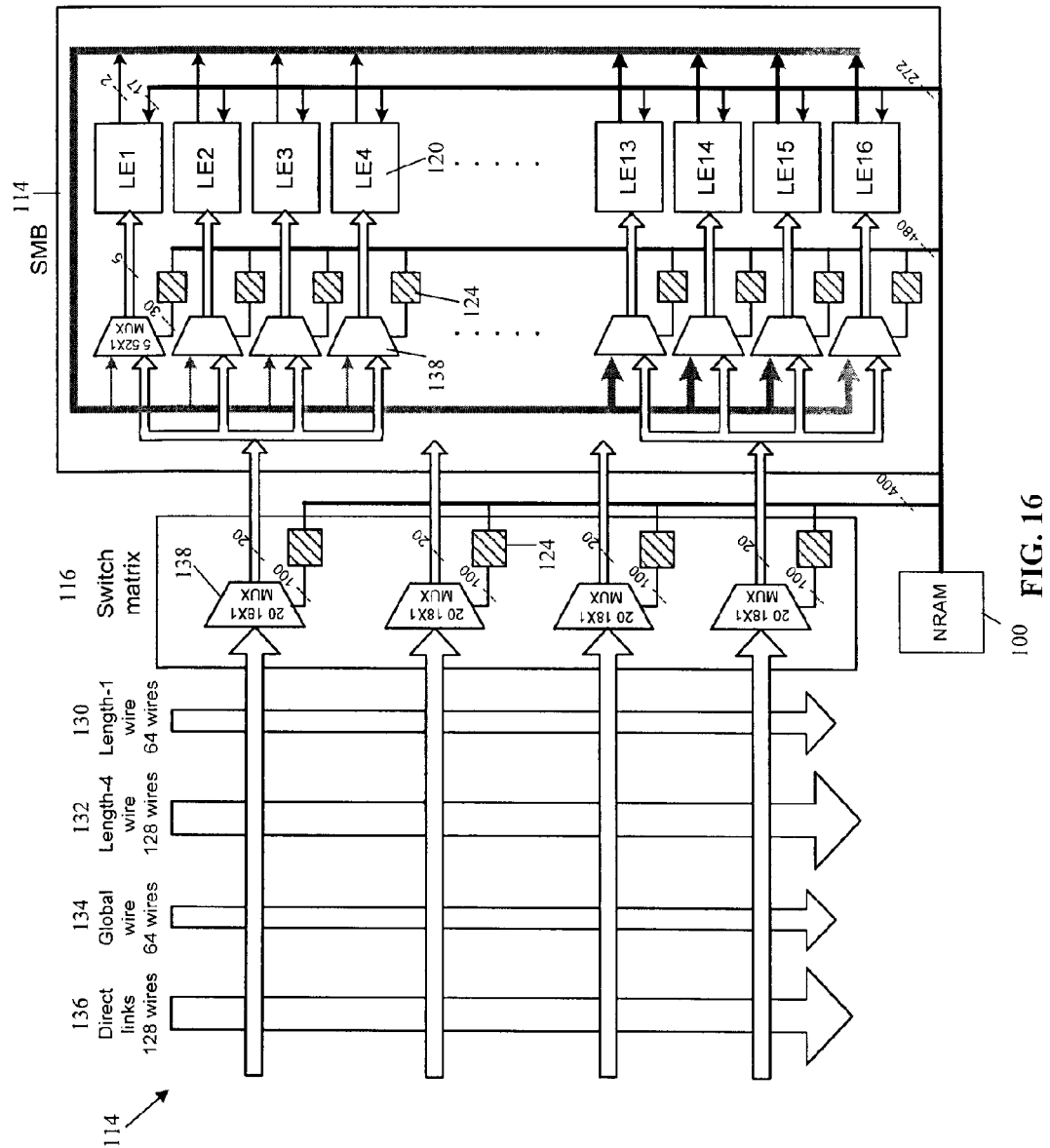
FIG. 16 schematically illustrates one embodiment of a SMB architecture with one level of folding.

Number of Logic Levels Per SMB: In the baseline design, two levels of logic are used in an SMB (i.e., SMB→MB and MB→LE) to facilitate local communication. However, since any communication between two LEs in different SMBs has to traverse two levels of interconnect, the communication delay is larger compared with that within just one level of logic. In addition, a two-level logic structure requires more implementation area than a one-level logic structure. Hence, a one-level structure has an advantage in area and inter-SMB delay, but a disadvantage in intra-SMB delay. FIG. 16 shows the structure of a flattened SMB 114 with one level of logic. An input of an LE 120 is now directly selected from the inputs from the switch matrix 116 and the outputs of other LEs 120. In the FIG. 16 embodiment, area is reduced by 1.1×.

Interconnect Parameters: In the embodied architectures, inter-LE communications may become much more local. Hence, the interconnect hierarchy can be sharply reduced. Currently, the baseline sets Fc=W/N and Fs=6, where N is the number of LEs in an SMB and W is the number of interconnect tracks per channel. A larger Fc and Fs can provide more routing flexibility, but at the cost of more routing area. The values for Fc and Fs can also be varied to achieve an optimal trade-off between routability and area efficiency.

Figure 17:
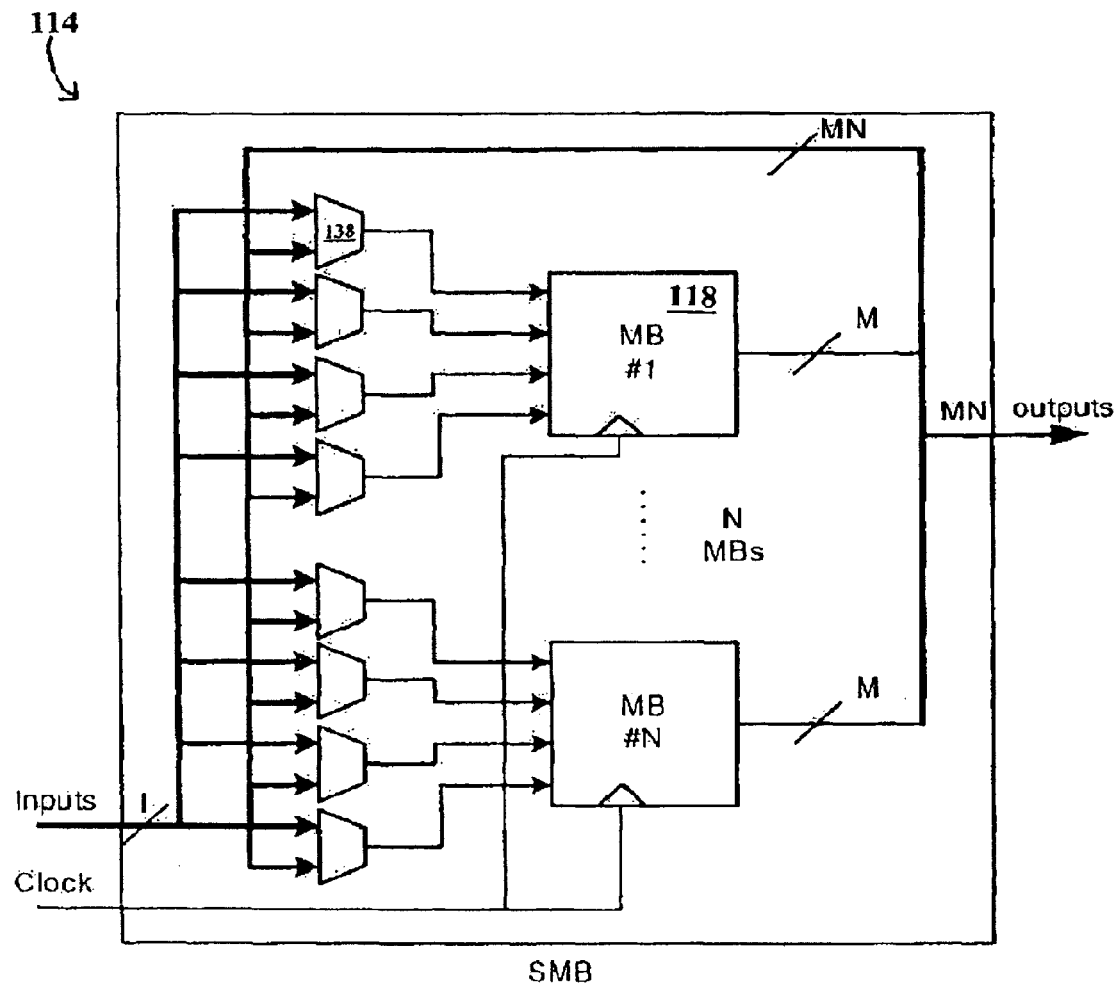
FIG. 17 schematically illustrates one embodiment of routing about a general SMB structure including from one to n MBs.

Moreover, in most embodiments, every input in the SMB 114 is accessible from the interconnect, with full routability within an SMB 114. However, complete routability within an SMB 114 may not be necessary. Both I and M (see FIG. 17) could potentially be reduced while keeping LE usage high, to thereby reduce the size of input multiplexers 138 in an SMB 114. Since multiplexers 138 contribute most to the area of an SMB 114, multiplexer size could result in a reduction in the size of an LB 102. For example, if I=0.6 and M=1 (i.e., full routability assumed within the SMB), the size of the LB 102 reduces to 76%.

NanoMap Design Optimization

An integrated design optimization method and platform for NATURE is also provided, embodiments of the optimization method being referred to as NanoMap. NanoMap conducts design optimization from the RTL down to the physical level. Given an input design specified in RTL and/or gate-level VHDL, NanoMap optimizes and implements the design on NATURE through logic mapping, temporal clustering, placement, and routing. These design optimization techniques exploit the design flexibilities enabled by fine-grain temporal logic folding. Given user-specified area and performance constraints, the mapping method and system of NanoMap embodiments can automatically explore and identify the best logic folding configuration, and make appropriate tradeoffs between performance and area efficiency. The optimization methods and their equivalents can be implemented by a processor configured to read a computer readable storage medium having instructions for the method stored thereon. When the instructions are executed by the processor, the processor is transformed into a specific optimizing device which can carry out embodiments of the optimizing process. Suitable non-limiting examples of a processor include a computer, a laptop, a personal digital assistant (PDA), ASIC, a microprocessor, digital circuitry, analog circuitry, or any combination and/or plurality thereof.

To demonstrate one embodiment of a design optimization flow of NanoMap, an example RTL circuit 140 will be provided, and concepts associated therewith are first introduced for ease of exposition. Given an RTL circuit 140, the registers contained therein are first levelized. The logic between two levels of registers is referred to as a plane. The registers associated with the plane are called plane registers. The propagation cycle of a plane is called plane cycle. Using temporal logic folding, each plane is further partitioned into folding stages. Resources can be shared among different folding stages within a plane or across planes. The propagation cycle of a single folding stage is defined as folding cycle. Note that different planes should consist of the same number of folding stages to guarantee global synchronization. Thus, the key issue is to determine how many planes are folded together and to determine the appropriate folding level (i.e., the number of folding stages in one plane necessary to achieve the best area-performance tradeoff under specified design constraints).

FIG. 18A shows an example comprising a four-bit controller-datapath consisting of a single plane. The controller consists of flip-flops s0 and s1, and LUTs LUT1-LUT4. The datapath consists of registers reg1-reg3, a ripple-carry adder and parallel multiplier module, requiring in all 100 LUTs and 14 flip-flops. The ripple-carry adder consists of eight LUTs with a logic depth (i.e., the number of LUTs along the critical path) of four. The parallel multiplier consists of 38 LUTs with a logic depth of seven. The control logic consists of four LUTs. Suppose the optimization objective is to minimize circuit delay under a total area constraint of 20 LEs. We assume each LE contains one LUT and two flip-flops. Hence, 20 LEs equal 20 LUTs along with 40 flip-flops. Since the number of available flip-flops is more than required, we concentrate on the LUT constraint.

Embodiments of the optimization process may use an iterative optimization flow. As a smaller number of folding stages leads to better performance, NanoMap starts with a guessed folding level, resulting in a minimal number of folding stages under the given area constraint, and gradually refines it. In the FIG. 18 example, the minimal number of folding stages is equal to the total number of LUTs divided by the LUT constraint, |50/20|=3 (i.e., at least three folding stages are required to meet the LUT constraint). The folding level is obtained by the maximum logic depth divided by the number of folding stages, which equals |4+7/3|=4.

Next, based on the chosen folding level, the adder and multiplier modules are partitioned into a series of connected LUT clusters in a way that if the folding level is p, then all the LUTs at a depth less than or equal to p in the module are grouped into the first cluster, all the LUTs at a depth larger than p but less than or equal to 2p are grouped into the second cluster, and so on. The LUT cluster can be considered in its entirety with its logic depth being less than or equal to the folding level. This implies that one LUT cluster can be executed within one folding cycle, thereby being contained in one folding stage. By dealing with LUT clusters instead of a group of single LUTs, the logic mapping procedure can be greatly sped up. FIG. 18B shows the partition for the multiplier module 142 with level-4 folding. However, note that the first LUT cluster of the multiplier already needs 32 LUTs, exceeding the area constraint. Thus, the folding level has to be further decreased to level-2 to guarantee that each LUT cluster can be accommodated within the available LEs. Correspondingly, the number of folding stages increases to six.

Next, after choosing a suitable folding level, Force Directive Scheduling (FDS) is used to determine the folding cycle assignment of each LUT and LUT cluster to balance the resource usage across the six folding stages. If the number of LUTs and flip-flops required by every folding stage is below the area constraint (i.e., 20 LEs) the solution is valid and offers the best possible performance. Otherwise, the folding level is reduced by one, followed by another round of optimization. This process continues until the area constraint is met, assuming the area constraint can be satisfied.

FIG. 18(c) illustrates the mapping result 144 for level-2 folding for the first three folding stages of the total of six folding stages. Note that plane registers, which provide inputs to the plane, need to exist through all the folding stages in the plane. The first folding cycle requires 14 LEs. Four LEs are required for mapping LUT cluster 1 of the adder, which is depicted as add: c1 in FIG. 18(c). Flip-flops s0 and s1 are mapped to the available flip-flops inside the LEs assigned to adder cluster 1. Four LEs are also required for LUT1-LUT4 computation, and to store the respective computation results. The four-bit registers, reg1, reg2 and reg3, need two LEs each to accommodate their four flip-flops. Similarly, in folding cycle 2, four LEs are needed for adder cluster 2 computation and resulting storage. Four LEs are required for maintaining the LUT1-LUT4 computation results, which need to be preserved until folding cycle 6 to control the loading of registers, and six LEs for reg1-reg3. Folding cycle 3 requires the maximum number of LEs, since multiplier cluster 1 needs 16 LUTs, which occupy 16 LEs. The number of LEs needed by the last three folding levels (not shown), are 16, 12 and 12, respectively. Hence, the number of LEs for mapping this RTL circuit is the maximum required across all the folding cycles (i.e., 16). This is within the area constraint.

Next, clustering, which groups LEs into SMBs, placement and routing are performed to produce the final layout of the implementation and obtain the best possible circuit delay under the given constraint. When performing clustering, inter-stage relationships are honored, since some computation results need to be preserved through several folding cycles. Once the results are assigned to some flip-flops in an SMB, they are not assigned to other SMBs in other folding cycles. In the FIG. 18 example, assume there are four LEs in an MB and four MBs in an SMB. Thus, the 14 LEs in folding cycle 1 can be accommodated into one SMB. Suppose LUT1-LUT4 are assigned to MB1. Then their computation results storage1-4 will be present in MB1 through all the folding cycles before being overwritten by new results.

Automated Optimization Flow of NanoMap

Figure 19:
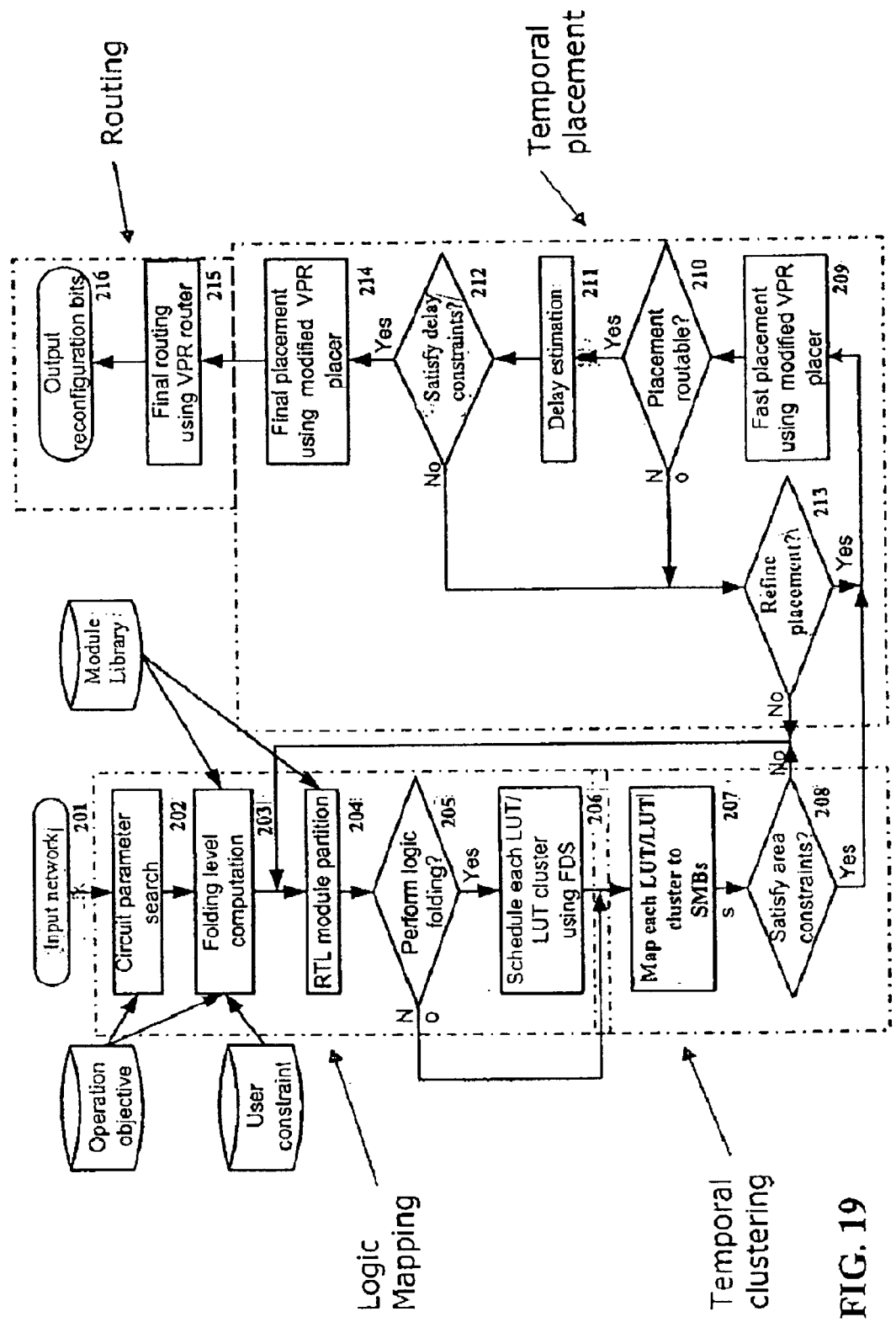
FIG. 19 illustrates one embodiment of an optimization method, referred to in its various embodiments as NanoMap.

FIG. 19 illustrates one embodiment of an integrated design optimization flow for NATURE. Given an input design 201 specified in mixed RTL and gate-level VHDL, NanoMap conducts logic mapping, temporal clustering, temporal placement and routing, and produces a configuration bitmap for NATURE.

Logic Mapping: (Steps 202-206) Steps 202-206 of FIG. 19 use an iterative approach to identify the best folding level based on user-specified design constraints, optimization objectives, and input circuit structure. FDS techniques, detailed below, are used to assign LUTs and LUT clusters to folding stages and balance inter-folding stage resource usage, and to produce the LUT network of each temporal folding stage.

Temporal Clustering: (Steps 207-208) Steps 207-208 of FIG. 19 take the flattened LUT network as input, and cluster the LUTs into MBs and SMBs to minimize the need for global interconnect, and to simplify placement and routing. As opposed to the traditional clustering problem, each hardware resource (i.e., LE, MB, or SMB) is temporally shared by logic from different temporal folding stages. Temporal folding necessitates that both intrastage and inter-stage data dependencies be jointly considered during LUT clustering. Folding stages need not be limited to one plane; temporal clustering can span planes. After clustering, verifying satisfaction of the area constraint is performed. If the area constraint is satisfied, placement is invoked. Otherwise, NanoMap returns to logic mapping.

Temporal Placement: (Steps 209-214) Steps 209-214 of FIG. 19 perform physical placement and minimize the average length of inter-SMB interconnects. Physical placement and interconnect minimization is implemented on top of VPR, an FPGA place-and-route tool, detailed and referenced below, to provide inter-folding stage resource sharing. Placement is performed in two steps. First, a fast placement is used to derive an initial placement. A low-precision routability and delay analysis is then performed. If the analysis indicates success, a detailed placement is invoked to derive the final placement. Otherwise, several attempts are made to refine the placement and if the analysis still does not indicate success, NanoMap returns to logic mapping.

Routing: (Step 215) Step 215 of FIG. 19 uses the VPR router to generate intra-SMB and inter-SMB routing. After routing, the layout for each folding stage is obtained and the configuration bitmap generated 216 for each folding cycle.

The following details the above steps. For logic mapping, focus is provided on folding level determination and FDS technique.

Choosing the Folding Level

The folding level choice is critical to achieving the best area-performance tradeoff. As previously noted, the best folding level depends on input circuit structure, obtained by identifying each plane and obtaining the circuit parameters within each plane. The following outlines the necessary circuit parameters:

Number of planes in input circuit: num_plane
Number of LUTs in plane i: num_LUT$_i$
Logic depth of plane i: depth$_i$
Maximum number of LUTs among all the planes:

LUT_max=max{num_LUT$_i$} for i=1, . . . , num_plane

Maximum logic depth among all the planes:

Depth_max=max{depth$_i$} for i=1, . . . , num_plane

Area constraint, e.g., the available number of LEs: available_LE
Number of reconfiguration copies in each carbon nanotube RAM: num_reconf Given the specified optimization objective and constraint (e.g., circuit delay minimization under area constraint or area minimization under delay constraint, etc.), the best folding level is computed using above parameters. The following details a targeting of one of the design objectives. Similar procedures can target other objectives.

Suppose the optimization goal is to minimize circuit delay. If there is no area constraint, we can use no-folding to obtain the shortest delay. If an area constraint is given, it is satisfied first, then the best possible delay obtained. There are two scenarios considered:

1) Multiple Planes are Allowed to Share Resources: Since circuit delay is equal to plane cycle times the number of planes in the circuit, plane cycle has to be minimized under the area constraint. First, all the planes together are stacked (i.e., resources are shared across all planes, since this does not increase circuit delay but reduces area). Suppose the area used up at this point is LUT_max. If LUT_max is larger than available_LE, logic folding is required to reduce the area within each plane. The minimum required number of folding stages within each plane is given by:

$$\text{\# folding\_stages} = \left\lceil \frac{\text{LUT\_max}}{\text{available\_LE}} \right\rceil \qquad (1)$$

Since the number of folding cycles should be kept the same in each plane, maximum logic depth is used to compute the folding level:

$$\text{folding\_level} = \left\lceil \frac{\text{depth\_max}}{\text{\# folding\_stages}} \right\rceil \qquad (2)$$

Using the chosen folding level, the present invention uses FDS and temporal clustering to obtain the area required. If the area constraint is not satisfied, the folding level is decreased by one. NanoMap then iterates until the area constraint is met or the folding level reduces to the minimum allowed, min_level, which is limited by num_reconf:

$$\text{min\_level} = \left\lceil \frac{\text{depth\_max} * \text{num\_plane}}{\text{num\_reconf}} \right\rceil \qquad (3)$$

Figure 20:
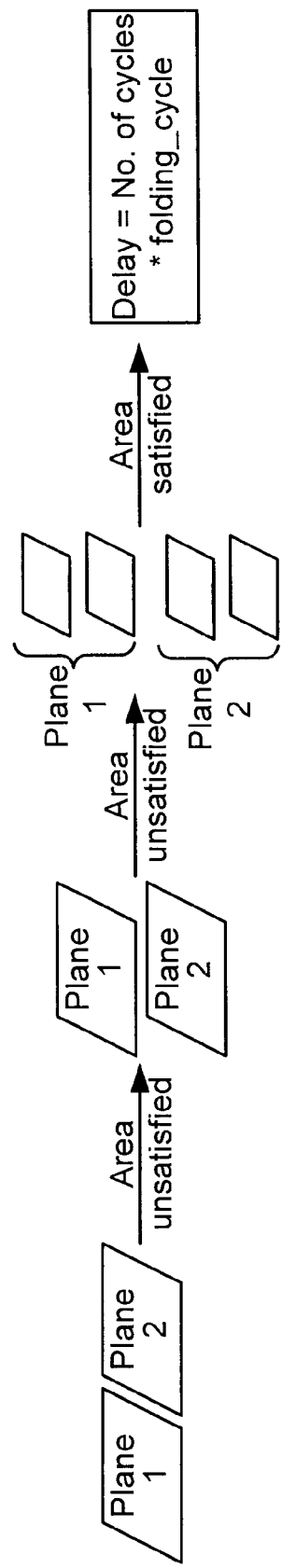
FIG. 20 illustrates one embodiment of delay optimization procedure under area constraint, assuming across-plane resource sharing, to choose folding level.

FIG. 20 illustrates the optimization procedure.

2) Multiple Planes are not Allowed to Share Resources: Such a scenario is possible if the RTL circuit is pipelined and, hence, the different pipeline stages need to be resident in the FPGA simultaneously. In this scenario, temporal logic folding can only be performed within each plane. Then the folding level requested can be directly computed by the following equation:

$$\text{folding\_level} = \left\lceil \frac{\text{depth\_max} * \text{available\_LE}}{\sum_i \text{num\_LUT}_i} \right\rceil \qquad (4)$$

After an appropriate folding level is chosen, the RTL module is partitioned into LUT clusters accordingly. The original mixed module/LUT network is transformed to an equivalent LUT/(LUT cluster) network which is fed to FDS.

Force-Directed Scheduling (FDS)

Different folding stages share the same set of LEs temporally. Overall LE use is then determined by the folding stage using the maximum number of LEs. To optimize overall resource use in each plane, a modified Force-Deflected Scheduling (FDS) method is implemented to assign the LUT or LUT cluster to folding stages and balance the resource use of the folding stages.

Force-Deflected Scheduling (FDS) is described in the following, which is incorporated herein by reference for its useful background information:

P. G. Paulin and J. P. Knight, "Force-Directed Scheduling for the Behavioral Synthesis of ASIC's," *IEEE Trans. Computer-Aided Design*, vol. 8, pp. 661-679, June 1989.

FDS is a popular scheduling technique in high-level synthesis. However, the present invention uses FDS in another scenario. FDS uses an iterative approach to determine the schedule of operations, to minimize overall resource use. The resource use is modeled as a force. The scheduling of an operation to some time slot, which results in the minimum force, indicates a minimum increase in resource use. The force is calculated based on distribution graphs (DGs), which describe the probability of resource use for a type of operation in each time slot.

In the present invention, since the LE use in each folding cycle is dependent on both the LUT computations and register storage operations conducted in parallel, two DGs must be assembled: one describing the resource use of the LUT computation; and another for register storage use. The following details: 1) how DGs are created; and 2) how forces are calculated based on the two created DGs.

1) Creation of DGs: First, to build the LUT computation DG, the time frame of each LUT or LUT cluster needs to be determined. For a LUT or LUT cluster i, its time frame time_frame$_i$, or feasible time interval, is defined as the span from the folding cycle it is assigned to in the ASAP schedule to the folding cycle it is assigned to in the ALAP schedule. From the ASAP/ALAP schedules shown in FIG. 21 for the ongoing example, we can see that time frame$_{LUT2}$ spans folding cycles 1 to 3. Here, clus$_i$ denotes LUT cluster i. If a uniform probability distribution is assumed, the probability that this computation is assigned to a feasible folding cycle j within its time frame equals $1/|\text{time\_frame}_i|$ for j∈time_frame$_i$.

Following a definition similar to that given by P. G. Paulin and J. P. Knight, above, a LUT computation DG models the aggregated probability distribution of the potential concurrency of N LUT/(LUT cluster) computations within each folding cycle j, whose value LUT_DG(j) is the sum of the probabilities of all the computations assigned to this folding cycle, as follows:

$$\text{LUT\_DG}(j) = \sum_{i=1}^{N} \frac{1}{|\text{time\_frame}_i|} * \text{weight}_i, \ j \in \text{time\_frame}_i$$

where $\text{weight}_i$ is one for a LUT and equal to the number of LUTs in a LUT cluster.

To build the register storage DG, which models the distribution of register storage usage, a procedure similar to that of P. G. Paulin and J. P. Knight, above, is adopted. A storage operation is created at the output of every source computation that transfers a value to one or more destination computations in a later folding cycle. If both the source and destinations of a storage operation are scheduled, the distribution of the storage operation equals its lifetime, which begins from the folding cycle of the source and ends at the folding cycle of the last destination. Here, it is assumed the results are stored at the beginning of each folding cycle. If one or more of the source or destinations are not scheduled, a probabilistic distribution is obtained.

The following heuristic is used to quickly estimate the resulting storage distribution. First, ALAP_life and ALAP_life of a storage operation are defined as its lifetime in the ASAP and ALAP schedules, respectively. For example, in FIG. 22, the output of source computation LUT2 is denoted as storage S. S transfers the value to destination computation LUT3 and LUT4. In the ASAP schedule, S begins at folding cycle 2 and ends at folding cycle 3. Hence, $\text{ASAP\_life}_S = [2, 3]$ and the length of ASAP_life: $|\text{ASAP life}_S| = 2$. Similarly, in the ALAP schedule, S begins at folding cycle 4 and ends at folding cycle 4, which results in $|\text{ALAP\_life}_S| = 1$.

The longest possible lifetime max_life for the storage operation is the union of its ASAP_life and ALAP_life, whose length is obtained as:

$$|\text{max\_life}| = (\text{ALAP\_life end} - \text{ASAP\_life\_begin} + 1) \quad (6)$$

For the ongoing example, S begins in folding cycle 2 in the ASAP schedule (i.e., $\text{ASAP\_life\_begin}_S = 2$). Its lifetime ends in cycle 4 in the ALAP schedule (i.e., $\text{ALAP\_life\_end}_S = 4$). Thus, the length of the maximum lifetime for S (e.g., $|\text{max\_life}_S| = 3$).

If ASAP_life overlaps with ALAP_life, the overlap time, overlap, is the intersection of ASAP_life and ALAP_life, whose length is similarly obtained as:

$$|\text{overlap}| = (\text{ASAP life end} - \text{ALAP life begin} + 1) \quad (7)$$

Within the overlap time, a storage operation must exist with probability 1. For the example, there is no overlap time for S. Then an estimate of the average length of all possible lifetimes can be obtained by:

$$\text{avg\_life} = \frac{|\text{ASAP\_life}| + |\text{ALAP\_life}| + |\text{max\_life}|}{3} \quad (8)$$

Next, the probability of a storage operation performed for a LUT or LUT cluster computation i in folding cycle j can be calculated as follows:

when j is outside of $\text{overlap}_i$ and $j \in \text{max\_life}_i$:

$$\text{storage}_i(j) = \frac{\text{avg\_life} - |\text{overlap}_i|}{|\text{max\_life}_i| - |\text{overlap}_i|} * \text{weight}_i \quad (9)$$

when j is within $\text{overlap}_i$, which means a storage operation must be performed:

$$\text{storage}_i(j) = \text{weight}_i \quad (10)$$

The process is carried out for all the storage operations, and the separate probabilities due to N LUTs and LUT clusters in folding cycle j are added to obtain a single storage DG as follows:

$$\text{storage\_DG}(j) = \sum_{i=1}^{N} \text{storage}_i(j) \, j \in \text{max\_life}_i \quad (11)$$

Figure 21B:
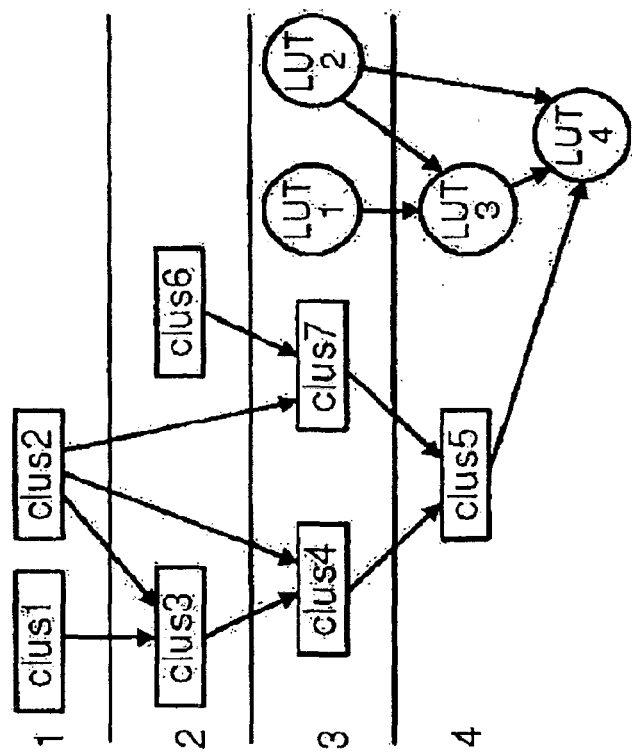
FIG. 21B illustrates one embodiment of an ALAP schedule, for LUTs and LUT clusters in a plane, for distribution graph (DG) creation during a force-directed scheduling (FDS) implementation.
Figure 21A:
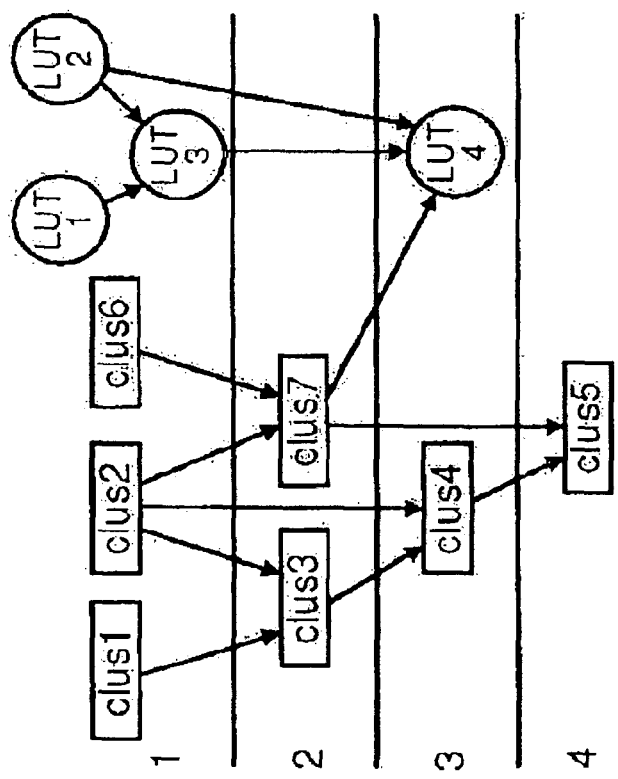
FIG. 21A illustrates one embodiment of an ASAP schedule for LUTs and LUT clusters in a plane, for distribution graph (DG) creation during a force-directed scheduling (FDS) implementation.
Figure 23B:
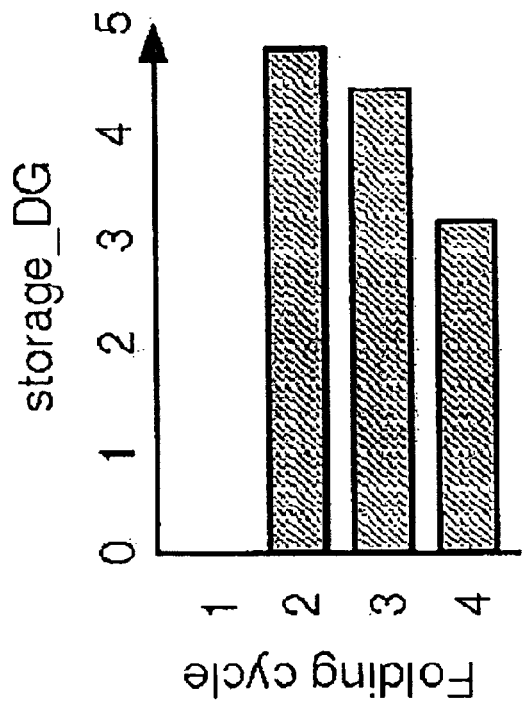
FIG. 23B illustrates one embodiment of a register storage DG for the ongoing example of FIG. 18, demonstrating one embodiment of a design optimization method and system.
Figure 23A:
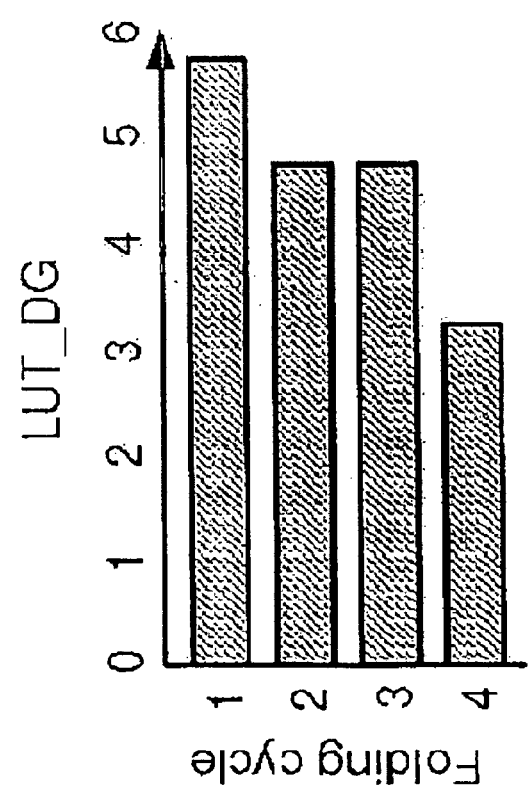
FIG. 23A illustrates one embodiment of a LUT computation Distribution Graph (DG).

The two DGs obtained for the example in FIG. 21 are shown in FIG. 23.

2) Calculation of Forces: In the FDS algorithm, force is used to model the impact of scheduling operations on resource use. A higher force implies higher concurrency of run-time operations, which requires more resources in parallel. The force is calculated based on DGs, which present the probability of resource usage concurrency. For a given computation with time frame spanning folding cycles a to b, the force in cycle j is calculated by:

$$\text{force}(j) = DG(j) * x(j) \quad (12)$$

where DG(j) is either LUT_DG(j) or storage_DG(j) in our case, and x(j) is the increase (or decrease) in the probability of computation in cycle j due to the scheduling of the computation. For example, before scheduling, the computation has a uniform probability of being scheduled in each folding cycle in its time frame. If in a scheduling attempt, the computation is scheduled in folding cycle a, the probability of the computation being scheduled in folding cycle a will increase to 1 and the probability of the computation being scheduled in other folding cycles will decrease to 0. The self-force associated with the assignment of a computation i, whose time frame spans folding cycles a to b, to folding cycle j is defined as the sum of all the resulting forces in each folding cycle in its time frame:

$$\text{self\_force}_i(j) = \sum_{k=a}^{b} \text{force}(k) = DG(j) * x(j) + \sum_{k=a, k \neq j}^{b} |DG(k) * x(k)|, \quad (13)$$

$$j \in |a, b|$$

$$x(j) = \frac{(|\text{time\_frame}_i| - 1)}{|\text{time\_frame}_i|}$$

$$x(k) = \frac{-1}{|\text{time\_frame}_i|}$$

In the approach of the present invention, the resource use can be dictated by either LUT computations or storage operations. Assume there are h LUTs and l flipflops in one LE, then the self-force for scheduling a LUT or LUT cluster i in folding cycle j is determined by $$\max \left\{ \frac{\text{LUT\_self\_force}_i(j)}{h}, \frac{\text{storage\_self\_force}_i(j)}{l} \right\}$$

where $\text{LUT\_self\_force}_i(j)$ and $\text{storage\_self\_force}_i(j)$ are computed using Equation (13) based on the LUT computation and storage DGs.

Assigning a LUT computation to a specific folding cycle will often affect the time frame of its predecessors and successors, which in turn creates additional forces affecting the original move. Equation (13) is used to compute the force exerted by each predecessor or successor. The overall force is then the sum of the self-force and the forces of predecessors and successors. Then the total forces under each schedule for a computation are compared and the computation is scheduled into the folding cycle with the lowest force, which will result in the least concurrency.

3) Summary of the FDS Process: The pseudo-code of the proposed FDS technique is shown in Process 1 below. Process 1 uses an iterative approach to schedule one computation in each iteration. In each iteration, the LUT computation and register storage DGs are obtained. The LUT or LUT cluster with the minimum force is chosen, and assigned to the folding cycle with the minimum force. This procedure continues until all the LUT or LUT cluster computations are scheduled.

---
Process 1 - Force-Directed Scheduling (FDS)
---
1: for LUT/(LUT cluster) computations to be scheduled do
2:     evaluate its time frame using ASAP and ALAP scheduling
3:     create the LUT computation distribution graph and storage operation distribution graph
4:     for each unscheduled LUT/(LUT cluster) computation i do
5:         for each feasible clock cycle j it can be assigned to do
6:             calculate the self-force of assigning node i to cycle j
7:             add predecessor and successor forces to self-forces to get the total force for node i in cycle j
8:         end for
9:         select the cycle with the lowest total force for node i
10:    end for
11:    Pick the node with the lowest total force and schedule it in the selected cycle
12: end for Temporal Clustering After scheduling, a network of LUTs is assigned to each folding stage. For each folding stage, we use a constructive algorithm to assign LUTs to LEs and pack LEs into MBs and SMBs. To construct each SMB, an unpacked LUT with the maximal number of inputs is first selected as an initial seed. Then, new LUTs with high attractions to the seed LUT are chosen and assigned to the SMB. The attraction between a LUT i and the seed LUT, $Attraction_{i,seed}$, depends on timing criticality and input pin sharing [17], as follows:

$$Attraction_{i,seed} = \alpha * Criticality_i + (1-\alpha) * \frac{Nets_{i,seed}}{G} \quad (15)$$

and as described in the following, which is incorporated herein by reference for its useful background information:
  A. S. Marquardt, V. Betz, and J. Rose, "Using Cluster-Based Logic Blocks and Timing-Driven Packing to Improve FPGA Speed and Density," in *Proc. Int. Symp. FPGA*, February 1999, pp. 37-46.

In Equation 15, $Criticality_i$ models the timing criticality of LUT i (e.g., the number of critical paths that this LUT is on), $Nets_{i,seed}$ is the number of shared I/Os between these two LUTs, and G is the number of I/Os per LE. α is a parameter that allows a tradeoff between timing criticality and interconnect demand.

Figures 24A, 24B:
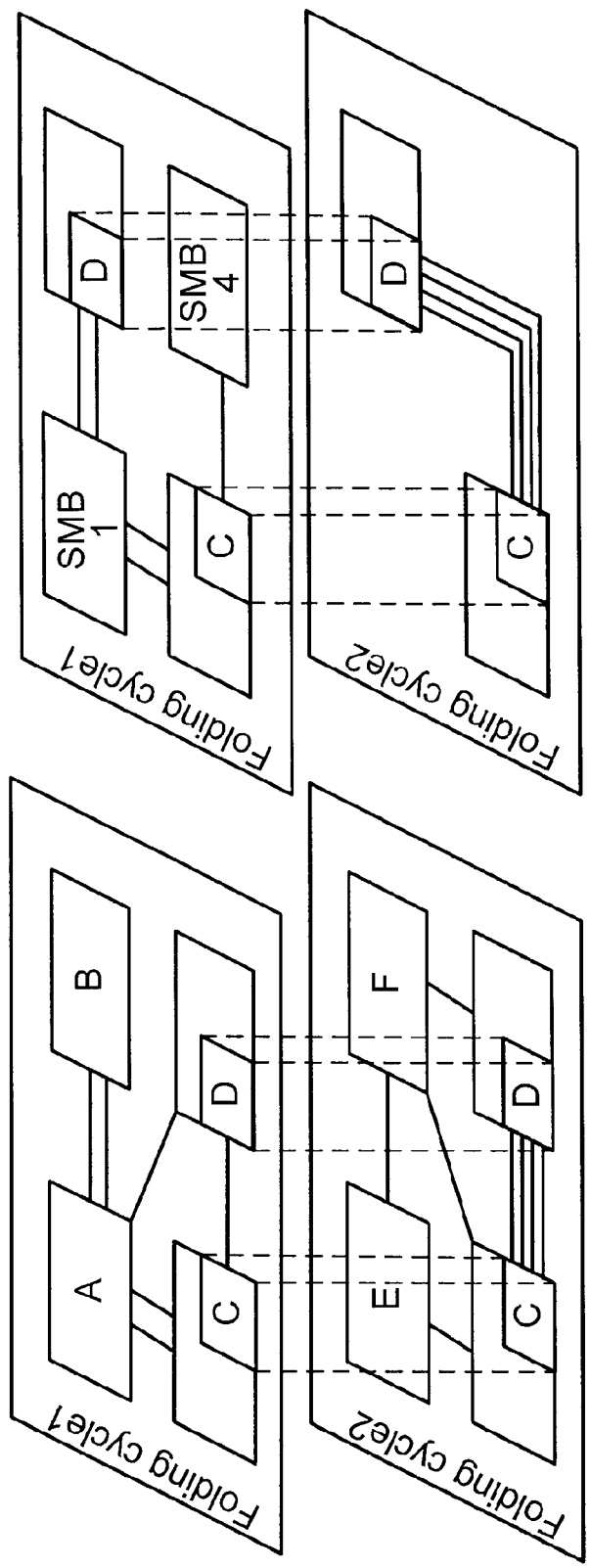
FIG. 24A schematically illustrates clustering in an example of temporal logic folding.
FIG. 24B schematically illustrates placement in an example of temporal logic folding.

To support temporal logic folding, inter-folding stage resource sharing needs to be considered during clustering. Since due to logic folding, several folding stages may be mapped to a set of LEs, some of the LEs may be used to store the internal results and transfer them to another folding cycle. Such LEs may perform this job over several cycles and feed other LEs in each folding cycle. As illustrated in FIG. 24A, in an earlier folding cycle, two LUTs may have very few attractions between them (C and D in FIG. 24A), but may have a large number of attractions in a later cycle. When performing temporal clustering, the attractions of two LUTs over all the cycles need to be accounted for. Thus, the attraction of such a LUT is set to the maximum of its attractions over all the cycles.

Placement and Routing

In the present invention, placement and routing is performed by a modified VPR. VPR refers to the techniques of the following, which is incorporated herein by reference for its useful background information:
  V. Betz and J. Rose, "VPR: A New Packing, Placement and Routing Tool for FPGA Research," *Proc. Int. Wkshp. FPGA*, August 1997, pp. 213-222.

Placement uses a two-step simulated annealing approach. Placement starts with a fast low-precision placement. Routability analysis and delay estimation are then used to evaluate the quality of the initial placement. For routability analysis, a highly-efficient empirical estimation technique is used, as described in the following, which is incorporated herein by reference for its useful background information:
  C. L. E. Chang, "VRISA: Accurate and Efficient Placement Routability Modeling," in *Proc. Int. Conf. Computer-Aided Design*, November 1994, pp. 690-695.

The routing demand for the interconnect resources for horizontal and vertical channels, $D_k^{j,horizontal}$ and $D_k^{j,vertical}$, of each net k is estimated as:

$$D_k^{j,horisontal} = q * \frac{1}{Y}; D_k^{j,vertical} = q * \frac{1}{X} \quad (16)$$

where (X, Y) are the dimensions of the net bounding box for net k, and q is a pin-count dependent net-weight, as detailed in C. L. E. Chang. The sum of the demands of all the nets is then compared to the per-channel routing resources of NATURE to make sure the resources are adequate. Delay estimation is based on the timing analysis step of VPR. Routability analysis and delay estimation results are then used to evaluate the feasibility of the initial placement, which determines whether a high-precision placement or another round of logic folding should be invoked.

VPR placer was modified in the present invention to support temporal logic folding. Such temporal folding introduces inter-folding stage dependencies. Consider the example in FIG. 24(b). In folding cycle 1, since there are few connections between C and D, they may be placed far apart. However, such a placement would not be good for folding cycle 2 in which C and D communicate a lot. The Manhattan distance is computed between each pair of SMBs belonging to different temporal folding stages. The net bounding box in other unplaced cycles are estimated using this Manhattan distance and added to the cost function for the current cycle to guide placement. Routing is conducted in a hierarchical fashion, first using length-1, then length-4 and finally global interconnects (i.e., the three types of interconnects in NATURE, above). Note that a length-i interconnect spans i SMBs.

Experimental Results—An Instance of NATURE Using NanoMap

Presented here are experimental results for the mapping of seven RTL/gate-level benchmarks to an instance of NATURE using an embodiment of NanoMap to illustrate the benefits of run-time reconfiguration and logic folding. NATURE is a family of architectures, which may vary in the number of inputs and registers in an LE, number of LEs in an MB, number of MBs in an SMB, etc. In this experimental instance, an architecture having one four-input LUT in an LE, four LEs in an MB, and four MBs in an SMB, were selected to obtain good area-delay trade-offs. Observations show that temporal logic folding greatly reduces the area for implementing logic, so much so that the number of registers in the design becomes the bottleneck for area reduction. Thus, as opposed to traditional LEs that include only one register, the present invention, in this example, includes two registers per LE, which increases an SMB's area to 1.5× (all experiments are based on a 100 nm technology). However, the LE area increase is more than offset by the significant reduction in overall area. To fully explore the potential of logic folding, we assume that a varying number of reconfiguration sets, k, is available in carbon nanotube RAMs depending on the application. We also show the tradeoffs when the size of carbon nanotube RAM is instead fixed to 16.

Among the seven benchmarks targeted, ex1 is the circuit shown in FIG. 18, but with a bit-width of 16. Paulin is a differential-equation solver, and FIR and Biquad are two types of digital filters. ASPP4 is an application-specific programmable processor. c5315 is a gate-level ALU implementation from the ISCAS'85 benchmark suite. NanoMap was run on a 2 GHz PC with 1 GB of DRAM under RedHat Linux 9. The mapping CPU times were less than a minute for all the benchmarks.

First, all benchmarks were mapped under the area-time (AT) product minimization objective to show the logic density benefits of temporal logic folding against the traditional no-folding case. Table II of FIG. 25 shows the mapping results. The first five columns describe the benchmark name and structure. Columns 6 and 7 of Table II of FIG. 25 show the number of LEs required and circuit delay for the no-folding case. Columns 8 and 12 show the best folding level established by the NanoMap optimization embodiment, for AT product optimization without and with limitations on k. AT product optimization is achieved with folding level-1 in all the cases when there is no restriction on k, since an increase in circuit delay is more than overcome by the dramatic reduction in area when using level-1 folding.

The corresponding area (where the number of LEs is used as a proxy for area due to the regular architecture), circuit delay and AT product improvement with respect to the no-folding case for examples without and with limitations on k are shown in Table II—Columns 9-11 and 13-15, respectively. The average reduction in the number of LEs is 14.8× (9.2×) and in the AT product 11.0× (7.8×), at the price of a 31.8% (19.4%) increase in circuit delay for large enough k (with k limited to 16).

Accordingly, the embodiments described herein (and their equivalents) can target many different optimization objectives: (i) minim different optimization objectives for different benchmarks are selected, with results presented in Table III. Objectives are noted in Column 2 of Table III of FIG. 25, and the constraint (i.e., area or delay) is noted in Columns 3 and 4 of Table III. Table III of FIG. 25 illustrates the versatility of NATURE and NanoMap embodiments. Further, a significant side-benefit of area reductions made possible by logic folding is the associated reduction for a deep interconnection hierarchy in NATURE. Since cycle-by-cycle reconfiguration makes LE utilization very high, the need for global communication greatly reduces. Global interconnect use was reduced by more than 50% when using level-1 folding as opposed to no-folding, due to trading interconnect area for increased carbon nanotube RAM area in NATURE.ization of circuit delay with or without an area constraint; (ii) minimization of area with or without a delay constraint; (iii) minimization of the AT product; and (iv) finding a feasible implementation under both area and delay constraints.

Alternate Designs for a Logic Element (LE)

As part of the previously described embodiments of NATURE, a full connection of local interconnects within the SMB was assumed in order to guarantee routability. However, this results in a fast growth of SMB size with an increase in the number of LEs per SMB or number of flip-flops per LE. In order to improve the design, three alternative embodiments for an LE were examined. All the experiments were conducted using the disclosed SMB structure based on 65 nm CMOS technology.

Design I

Figure 26A:
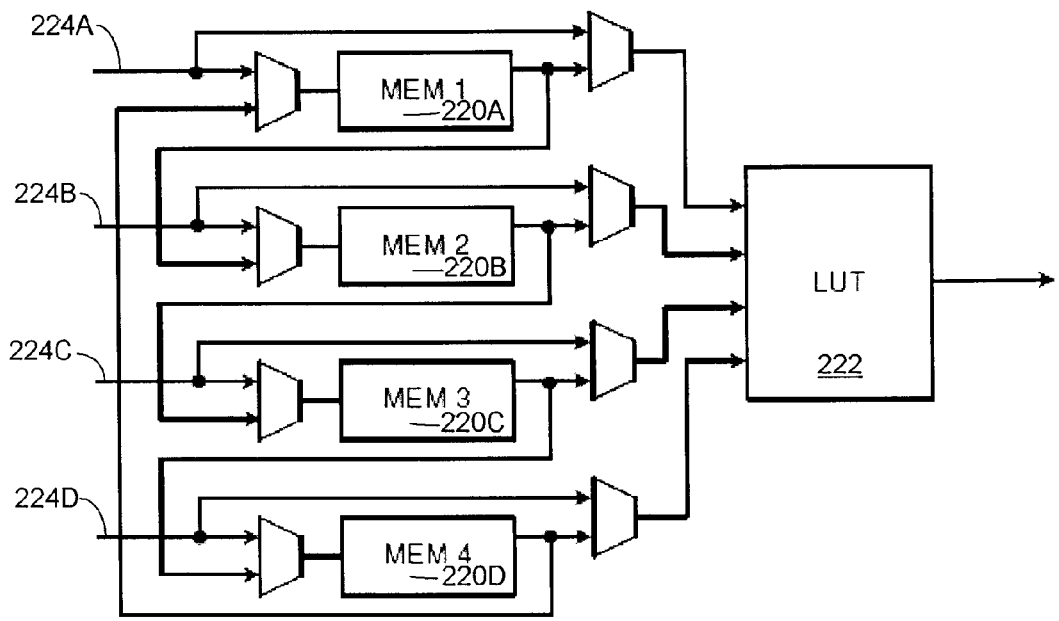
FIG. 26A schematically illustrates another embodiment of a logic element (LE).

Using logic folding, the temporary results computed in previous cycles can be used in later cycles. Such results need to be stored in storage elements, then fed to the LEs which use them as inputs in later cycles. In the previous embodiments used in NATURE (see FIGS. 11A and 11B), the results were stored in the flip-flops at the LUT output. An alternative way is to register them at the inputs of the LUT as illustrated in FIG. 26A.

Figure 26B:
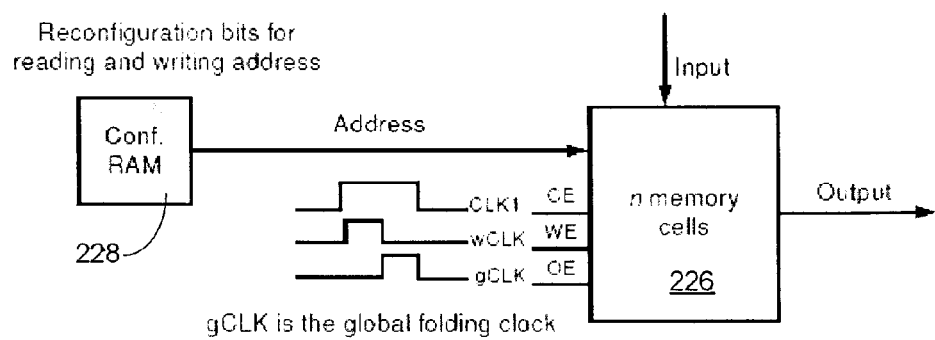
FIG. 26B schematically illustrates an embodiment of chip enable, read enable, and write enable control signals FIG. 27 schematically illustrates another embodiment of an LE.

In this design, the computational result from a LUT is transferred to and registered at the input of the LUTs which use the result in later cycles. Through experiments, it was found that around 50 storage elements are needed for large benchmarks. Hence, a small memory block is used instead of a group of flip-flops to save area. As shown in the figure, there is a memory block 220A-D connected to each input of the LUT 222, feeding the input value to the LUT in the corresponding cycle. The input to the LUT 222 can be selected from the memory output or the primary input 224A-D. There is a connection between the memory output and another memory's input to enable the mapping of registers, such as shift-registers. In this embodiment, each of the memory blocks 220A-D contains 17 memory cells and, hence, can hold 17, temporary results at the same time. The address line is configured by the reconfiguration bits in the associated configuration memory. As illustrated in FIG. 26B, the control signals are chip enable CE, read enable OE, write enable WE. They synchronize memory read and write with the global folding clock gCLK and wCLK which is a shift of gCLK. Multiple clock signals are needed, as seen in FIG. 26B. At the end of each folding cycle, temporary results are written into the memory 226, controlled by the wCLK clock. Then at the beginning of each cycle, the required values are read out of the memory 226. Hence, the configuration RAM 228, which supplies the memory address, operates at a frequency twice that of the global clock.

The advantage of this design is that its SMB size is relatively small. Since there is only one input to the memory and one output from the LE, the total number of inputs and outputs of the LE is only five. This results in a large reduction in the local interconnect and SMB size. On the other hand, the limited number of inputs and outputs of the LE may create difficulties for mapping arbitrary circuits to the corresponding architecture. If multiple results need to be stored in the same cycle, they may compete with each other at the inputs of the LEs. To avoid this conflict, more LEs will be needed for the mapping. If the total area required to map the circuit increases, the interconnect delay will also increase and, hence, the total circuit delay. On the other hand, if the number of inputs/outputs per LE is allowed to grow, the SMB size may grow so much that it overshadows the benefits obtained from the reduction of total LE usage. Hence, a careful evaluation of design trade-offs is recommended when utilizing the LE embodiment of FIG. 26A.

Design II

Figure 27:
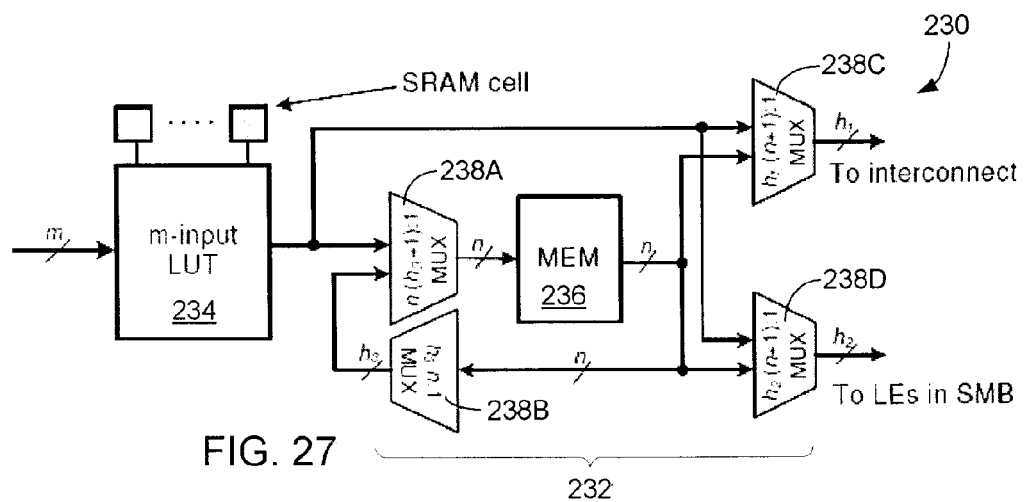

In contrast to Design I, the Design II LE embodiment 230 illustrated in FIG. 27 stores temporary results in the memory block 232 at the output of the LUTs 234. In this LE embodiment, all the computational results from the LUT 234 are stored in the storage elements locally in its own LE 230 in order to reduce the communication delay. Since a large number of results need to be stored from all the folds of the circuit, once again, a memory block 232 (comprising a memory 236 and multiplexers 238A-D) is used instead of flip-flops, and n memory cells are contained in it. (n=50 was found to be beneficial in the experiments, however it should be understood that other values of n may be used, depending on the embodiment). This embodiment allows three sets of outputs from the memory block. h1 outputs connect with interconnects surrounding the LB and h2 outputs go to other LEs in the SMB. There are also h3 outputs that get fed back to the memory block input in order to ease the mapping of registers to the LE 230. Since the SMB size increases quickly with the local interconnect, it is recommended, but not strictly necessary, that h2 should be set as small as possible. Through experiments, h2=3 is found to be adequate. h1 may need to vary with circuit size in order to enable sufficient communications with other SMBs and reduce the total number of LEs required. For medium-size applications (with around 5000 LUTs), h1 can also be set 3. For large-size applications (with around 10000 LUTs), h1 can be set to a larger value, such as 6. Generally, h3=2 works well for most benchmarks. Hence, for the design space exploration, we set h1=3, h2=3 and h3=2. In this embodiment, multiplexers are used at the memory output and input to reduce the number of configuration bits needed. Although they add extra area to the LE 230, limiting the number of inputs and outputs per LE helps keep the SMB size moderate. The memory can be viewed as one word by n bits, thus allowing multiple bits to be read or written simultaneously. Hence, there is no need for an address line. The other control signals are the same as in Design I.

Design III

Figure 28:
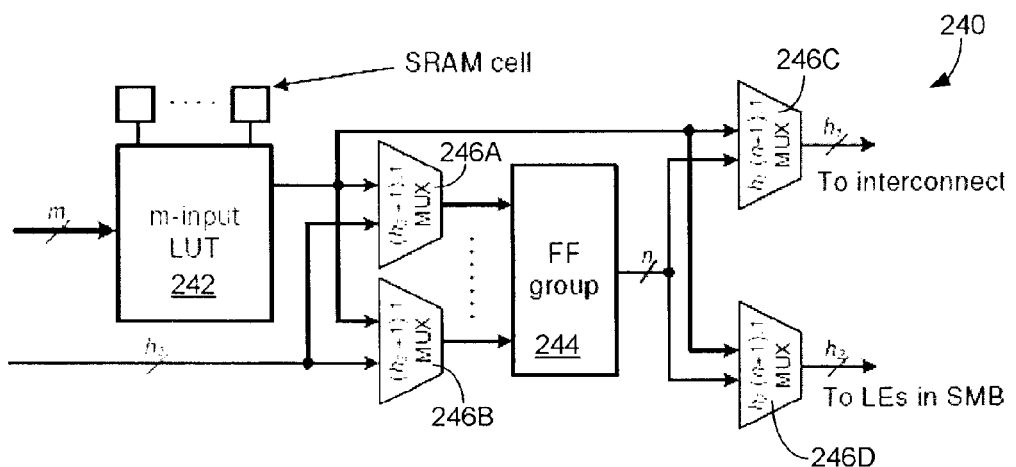
FIG. 28 schematically illustrates a further embodiment of an LE.

The Design III LE embodiment 240 illustrated in FIG. 28 increases the number of flip-flops available for each LE, but limits the total number of inputs and outputs to retain the SMB size. It also stores the temporary results at the LUT 242 output. However, as opposed to Design II, there are separate inputs for flip-flops. The results to be stored in the flip-flops 244 can be from the local LUT 242 output or from the outputs of other LUTs. Hence, global computational results can be stored in the available storage elements. This allows the required number of flip-flops per LE to be no more than 20 for most benchmarks. If an even larger number of flip-flops is needed, memory cells can be used to replace the flip-flops. However, note that flip-flop operations are faster than memory read and write. As in Design II, multiplexers 246A-D are added to select the inputs (outputs) to (from) the flip-flops, and h1, h2, and h3 are set to be 3, 3, and 2, respectively, in the exploration. For large applications, h1 and h3 can be larger, for example, h1=6, h3=5. Due to global sharing, the LE usage is best in this design. The disadvantage of an architecture based on such an LE is that if the temporary results are stored in an LE different from the one that produced it or uses it, then the interconnect delay will increase.

Comparison of the Three Alternate LE Designs

To show the design trade-offs of the three LE designs, we mapped eight benchmarks to the corresponding architecture using NanoMap. The mapping results are shown in the tables of FIGS. 29, 30, and 31, respectively. Of the eight benchmarks, Paulin and Diffeq are two differential-equation solvers, and Biquad is a digital filter. ASPP4 is an application-specific programmable processor. Wavelet and DCT are two mathematical functions implementing wavelet transform and discrete cosine transform computations, respectively. Motion is a behavior that performs video compression during video stream encoding, and Matrix is a standard multiplication algorithm often used in multimedia processing. The mapping area and circuit delay of these benchmarks for different folding levels are presented in columns 2-7. Column 8 shows the best folding level for area-delay product optimization and column 9 gives the area-delay product improvement obtained compared to no folding.

From the discussion in the previous sections, the SMB size of Design I is the smallest among the three designs. The SMB sizes of Design II and Design III are 1.6× and 1.55× of the SMB size of Design I. As we can see from the three tables of FIGS. 29, 30, and 31, due to the limitation on the number of inputs/outputs of the LE, which creates a difficulty in storing temporary results, Design I typically requires more LEs than the other two designs, especially for smaller folding levels. This increases the interconnect delay and total delay when temporal logic folding is employed. However, this typically gives the least delay for the no-folding case due to the small SMB size and simplification of the internal interconnect inside the SMB.

Considering Designs II and III, they both provide a significant improvement over Design I in the area-delay product (here, the number of LEs is taken as a proxy for area because of the regularity of the reconfigurable architecture). Since Design II stores computation results directly at the current LUT output without going through interconnects outside, it typically helps reduce the delay for the logic folding case with small folding levels, such as level-1 folding. However, since Design III has more flexibility in temporary result storage, it makes the clustering of LUTs in the architecture using Design III LEs less affected by limitations on the number of inputs and outputs. Hence, Design III typically provides better delay for medium and large folding levels than Design II does. Due to the limited number of available reconfiguration copies, large applications usually need a medium level of logic folding. Since Design III provides the best logic density and area-delay product improvement in this case, this is the embodiment currently employ in the reconfigurable architecture.

SMB Architecture Exploration

Based on the discussion in the previous section, we saw that LE Design III with storage elements at the LUT output is a good choice. Next, using this selected LE design, NATURE's architecture is optimized for one embodiment in terms of the number of logic levels, number of LEs in an SMB and the surrounding interconnect architecture.

A. Number of Logic Levels in an SMB

Figure 32:
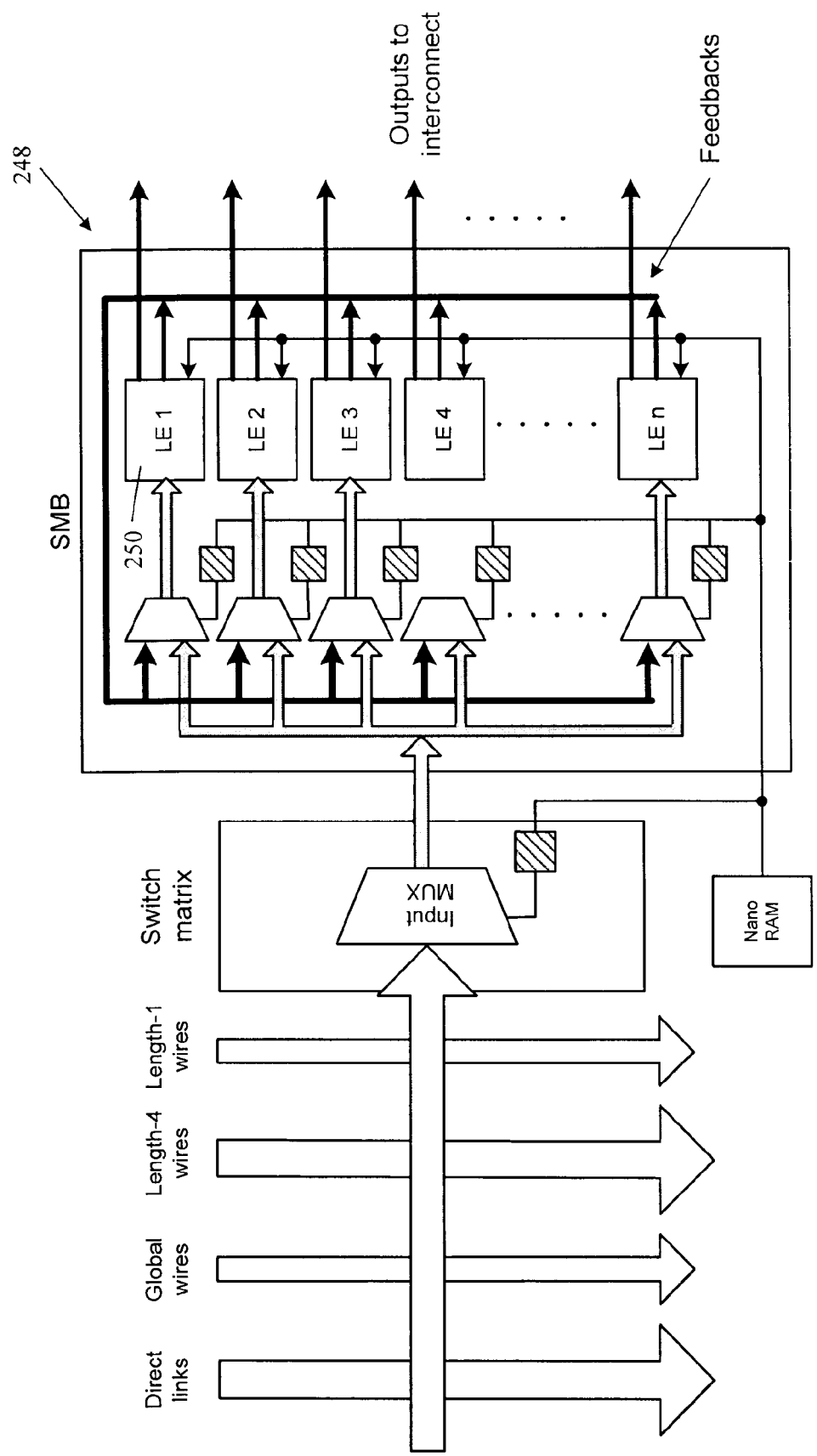
FIG. 32 schematically illustrates one embodiment of a flattened SMB.
Figure 33A:
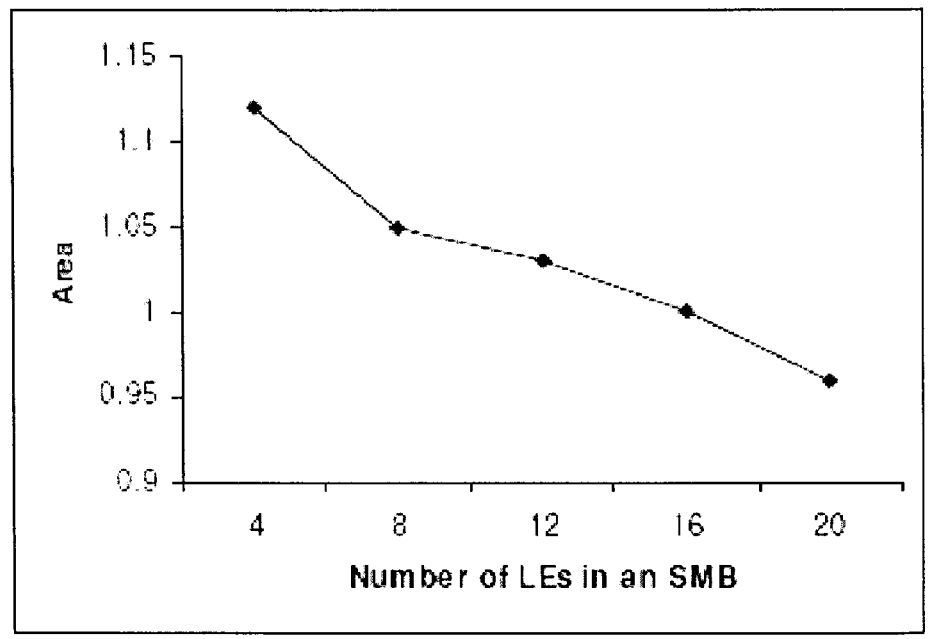
FIG. 33A illustrates one example of an area comparison based on number of LEs in an SMB.
Figure 33B:
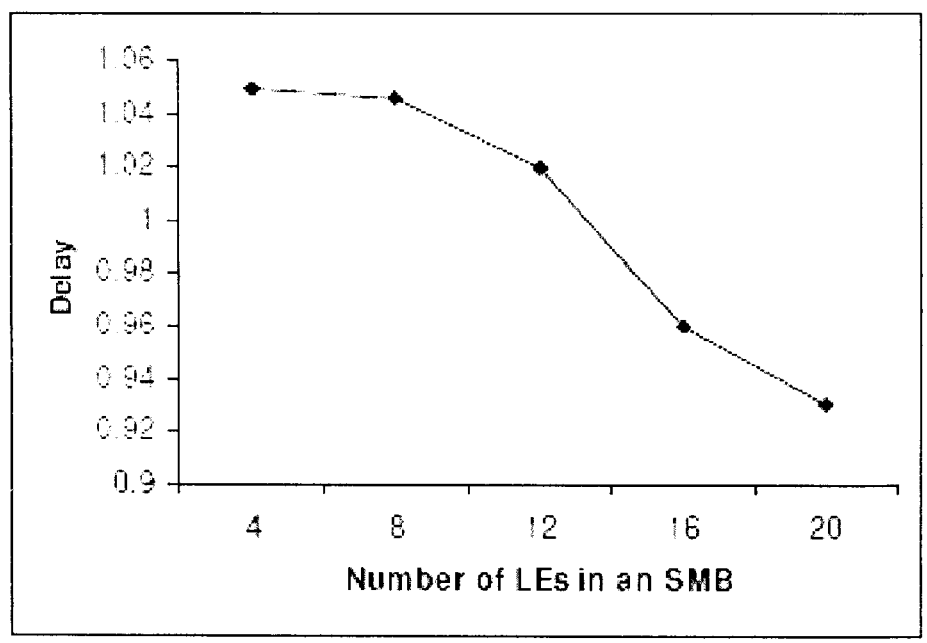
FIG. 33B illustrates one example of a delay comparison based on number of LEs in an SMB.

In some of the embodiments of NATURE discussed above, an SMB includes two levels of logic. In this hierarchical architecture, there are $n_2$ MBs in the first (i.e., higher) level, and $n_1$ LEs in the second level. This architecture facilitates local communication inside the SMB, however, increases the delay from outside of the SMB to an inside LE. The architecture can be flattened such that there is only one level of logic, i.e., an SMB contains $n_1 \times n_2$ LEs. In such an architecture, all the LEs can communicate with each other through a large multiplexer matrix, for example, such as is used in the Logic Array Block in Altera FPGAs viewable within the www/altera.com website. FIG. 32 illustrates a flattened SMB 248. As seen from FIG. 32, all the outputs of the LEs 250 are fed back to their inputs. The inputs of each LE 250 can be selected from the common inputs of the SMB 248 and the feedbacks. The common inputs, which are part of the total number of inputs needed, serve as the inputs to all the LEs 250 in an SMB. According to the discussion in the article entitled, "How much logic should go into an FPGA logic block"

published by V. Betz and J. Rose in the January-March 1998 issue of *IEEE Design and Test of Computers*, vol. 15, pp 10-15, and hereby incorporated by reference, 50-60% of the total number of inputs are enough as common inputs for the no-folding case. For the logic folding case, we found that 70%-80% of the inputs are enough. Hence, we assume 70% common inputs in our flattened design. It should be noted that other embodiments may use higher or lower percentages. This design reduces the delay from the outside interconnect to the inside LE, while increasing the delay between LEs. FIGS. 33A and 33B show the area and delay comparisons, respectively, between the two structures (hierarchical vs. flattened) using the benchmarks mentioned in the previous section. The results are normalized to the flattened structure for the same number of LEs in an SMB. We can see from the figure that with an increase in the number of LEs, the SMB size for the flattened structure gradually exceeds that of the hierarchical structure, due to the fast growth of multiplexer size in the flattened structure. Similarly, on an average, the flattened structure gives better delay for smaller SMB size (#LE<=12) and worse delay for larger SMB size (#LE>12), also because of the large multiplexer delay. Note that the two levels of logic in an SMB should be balanced, i.e., the difference between $n_1$ and $n_2$ should be as small as possible. Hence, based on the chosen SMB size, which is discussed further in the next section, the appropriate SMB architecture can be chosen.

B. Number of LEs in an SMB

Figure 34A:
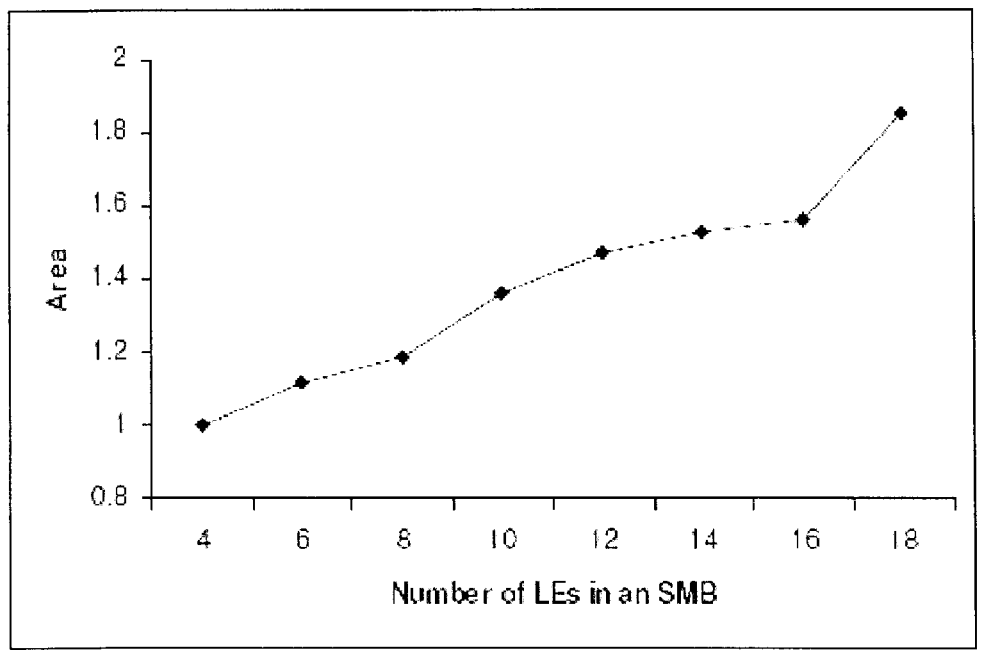
FIG. 34A illustrates another example of an area comparison based on number of LEs in another SMB.
Figure 34B:
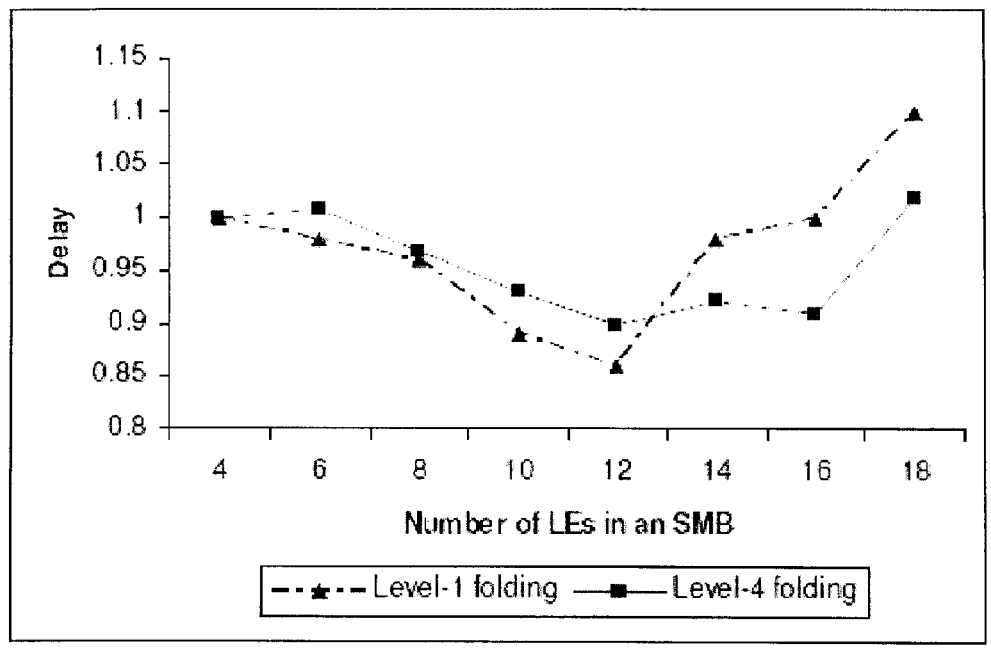
FIG. 34B illustrates another example of a delay comparison based on number of LEs in another SMB.

Choosing an appropriate number of LEs in an SMB is important for improving the area and delay of circuits mapped to the reconfigurable architecture. Different architectures and folding levels may require different optimal SMB sizes. In this section, we investigate the appropriate number of LEs in an SMB for both SMB structures at different folding levels. We assume there are enough routing tracks available to meet the routing demands. An input and output pin connects to the same number of interconnect tracks. The area (i.e., number of LEs) and delay results for different LE cluster sizes in an SMB for the flattened structure are shown in FIGS. 34A and 34B, respectively. Area results are normalized relative to #LE=4. A smaller cluster size reduces both the interconnect inside the SMB and its interface with the outside interconnect. Hence, it reduces the SMB size. However, it increases the total number of SMBs needed. Overall, as shown in FIG. 34A, a smaller cluster has higher area efficiency, which agrees with the results in the Betz and Rose article cited above. For different folding levels, the circuit delay results are also normalized relative to #LE=4 for each case to show the trend. When the SMB size is too small, more SMBs imply the need for more global interconnect. However, when the SMB size is too large, the local interconnect inside the SMB becomes so large that its size is comparable to or even larger than the outside interconnect. Hence, this increases the delay too. Thus, logic folding favors medium-sized SMBs (for example, with number of LEs, N, around 8 to 16), since they balance interconnect delays inside and outside the SMB well and give the best overall performance.

For the hierarchical structure, similar results were obtained. For the logic folding case, N can be chosen between 8 and 16, where $n_1$ can be between 2 and 4, and $n_2$ either 3 or 4. Note that, for the same number of LEs in an SMB, a smaller $n_1$ than $n_2$ results in a smaller SMB size and better delay, since a larger MB results in a larger local interconnect and, hence, harms performance. For example, if the cluster size is 8, then a better hierarchical structure is that with four MBs in an SMB (i.e., $n_2$=4) and two LEs in an MB (i.e., $n_1$=2). Generally speaking, it is good to keep the MB size relatively small.

C. Interconnect Design

Based on the chosen SMB size, there are three key parameters to be determined for designing the interconnect. These include W (the number of tracks in each routing channel), Fc (the number of routing tracks to which each SMB pin can connect), and Fs (the number of routing tracks to which each switch in the switch box can connect). First, based on the above discussions, we assume the connection box to be populated and switch box to be unpopulated (a block is said to be populated if it is possible to make connections from the middle of the block to LBs or other such blocks). Then, based on the number of inputs/outputs of an SMB, the least needed value of W can be computed. Thereafter, experiments can be conducted to find the appropriate W, which satisfies the routing demands and balances the routing area and delay well. For example, W=160 is good for an SMB size of 16 LEs. Fs can be set to three as done in many traditional designs, whereas Fc can be set to W/N, where N is the number of LEs in an SMB. Finally, an exploration is needed to find the optimal wire segment distribution. Table VII, illustrated in FIG. 35 shows comparisons of average delays of benchmarks for different wire segment distributions under the assumption of 16 LEs in an SMB. Other SMB sizes give similar results. The results are normalized relative to the first distribution in the table. We can see that, generally, length-4 and long wires can help improve the delay for a larger folding level or no-folding, whereas length-1 wires benefit a smaller folding level. Note that since direct links are available, which are not included in length-1 wires, to connect adjacent LBs, logic folding does not need a very high percentage of length-1 wires. Through exploration, we found a distribution of approximately 30%-40% for length-1, approximately 40%-60% for length-4 and approximately 10%-20% for long wires gives the best average performance.

D. Nano RAM

Currently, NRAM is used as on-chip memory in some embodiments of the NATURE architecture due to its outstanding properties. However, as we mentioned in the background section, nano RAMs are evolving fast and many other RAMs are potential candidates. We evaluated the performance of several candidates in an embodiment of NATURE and present a summary in Table VIII illustrated in FIG. 36. The reconfiguration time and memory cell size for each type of nano RAM are presented in the second and third columns of the table, where F denotes the technology node (F is 65 nm for our experiments). The average delay of benchmarks using different types of nano RAMs for different folding levels are presented in columns 4-6. To show the comparison with NRAM clearly, the results are normalized relative to the NRAM case. According to International Technology Roadmap for Semiconductors (ITRS), all the nano RAM cells are expected to be more than an order of magnitude smaller than an SRAM cell. Moreover, their reconfiguration times for small on-chip configuration memories, (e.g., kilobits in size), obtained through SPICE simulation are as small as several hundred picoseconds. Since the interconnect delay dominates circuit delay, a small increase in the reconfiguration delay compared to the NRAM does not affect the total circuit delay much, especially for a larger folding level. Hence, the improvement in the area-delay product is still significant when utilizing MRAM, PCM, or other fast embedded RAMs. It should be noted that in addition to the non-volatile RAM described previously, volatile RAM could be used in some embodiments in place of the non-volatile RAM.

Embedded Memory Architecture

Modern FPGA architectures are able to accommodate an entire system. Features, such as embedded multiplier blocks and block RAM modules, are often included in such FPGAs. They use SRAM blocks as on-chip buffers or caches. Due to the large cell size of an SRAM, their use as on-chip memory is limited. However, the high-density, fast-access nano RAMs make it possible to dramatically enlarge the on-chip memory capacity. We incorporated distributed data nano RAMs (as opposed to just configuration nano RAMs) into NATURE to improve its ability to implement both logic-intensive and memory-intensive applications. We discuss the embedded data memory structure next.

A. Distributed Data Memory Structure

Figure 37:
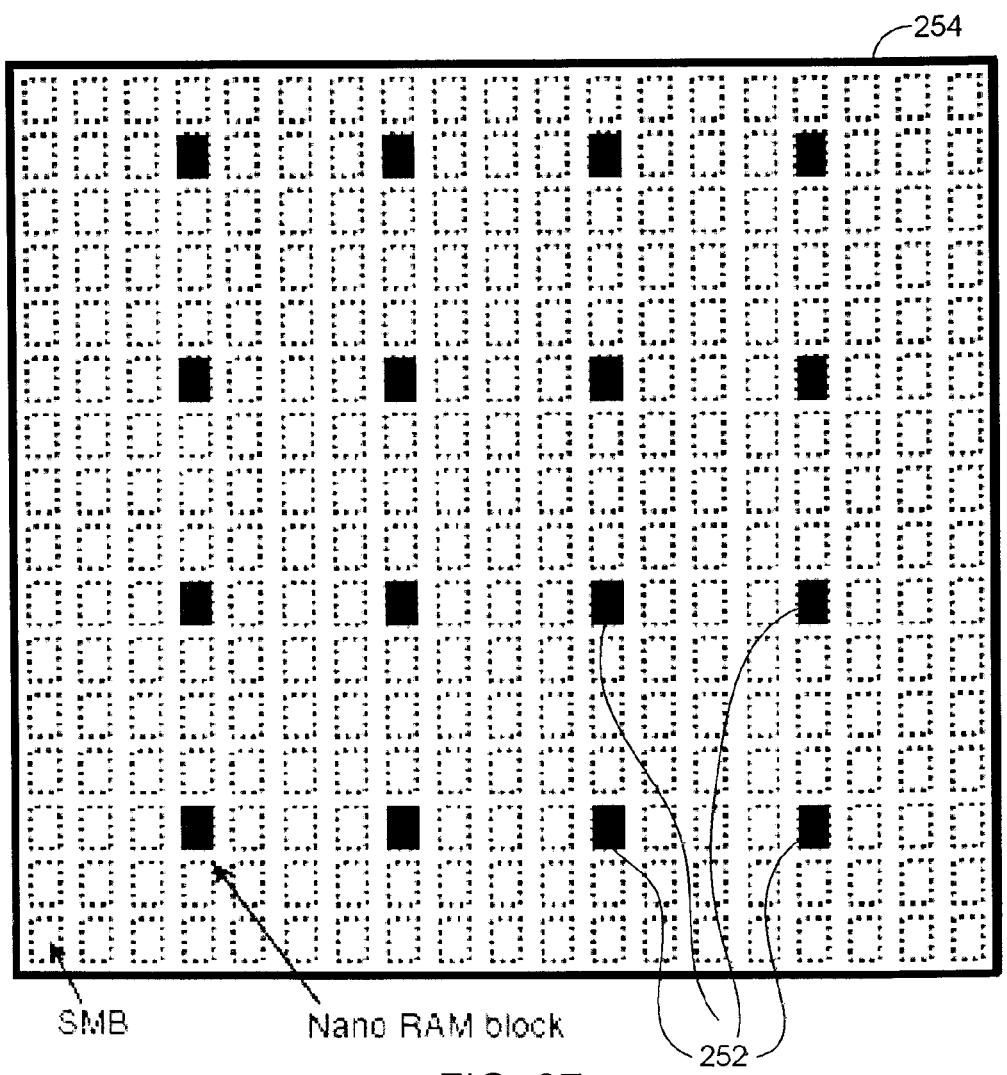
FIG. 37 schematically illustrates an embodiment of a reconfigurable computer architecture with uniformly distributed data RAM blocks.

Current FPGAs typically incorporate their embedded memory in two columns. This aggregated design can enlarge the SRAM capacity and reduce the peripheral circuit overhead. However, it increases the memory access time and interconnect delay between the logic and memory. In our design, due to the large density of nano RAM blocks, the RAM capacity is no longer the main concern. As opposed to traditional architectures, we uniformly distribute the data RAM blocks 252 into the chip 254, as illustrated in FIG. 37, in order to improve the communication delay between the logic and embedded RAMs 252. Using nano RAMs, the on-chip memory capacity can be greatly enlarged. For example, a 128 Kbit NRAM can be embedded in an area required by an LB. Based on the discussion in the article entitled, "Carbon nanotube based memory development and testing" published by R. F. Smith et al. in the March 2007 *Proc. Aerospace Conf.*, pp 1-5, and hereby incorporated by reference, the access time for such an NRAM can be found to be around 3 ns, which is roughly equal to one folding cycle for small folding levels. The memory operation is synchronized with the global clock in the case of logic folding.

Figure 38:
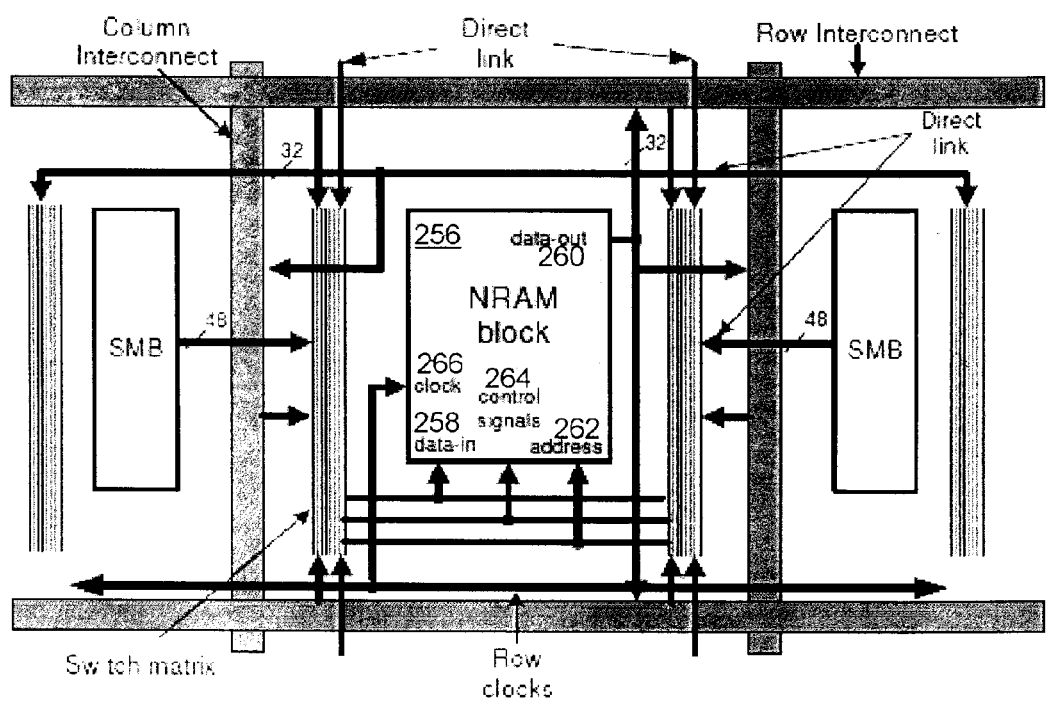
FIG. 38 schematically illustrates one embodiment of a data RAM block and its interface with surrounding logic.

We assume one data RAM block has the same size as one LB. FIG. 38 shows the detail of the data RAM block 256 and its interface with surrounding logic. The RAM block has one read port 258, one write port 260, address lines 262, read/write enable lines and clear/set line 264 and clock 266. It operates like a dual-port SRAM. The figure also shows the memory interface, wherein the address, input/output, and control signals are generated by the corresponding logic, and the memory outputs can be transferred to the SMBs which use them. We do not use special tracks to connect the RAM blocks 256. Instead, the RAM blocks 256 communicate with other blocks using the general interconnect in the same way as SMBs do. There are direct links between RAM blocks 256 and adjacent LBs to aid local RAM usage.

Figure 39A:
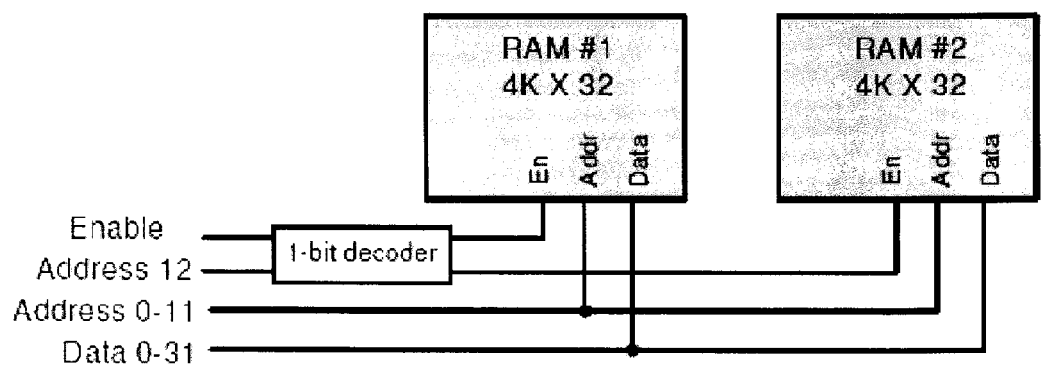
FIGS. 39A and 39B schematically illustrate an embodiment of combining multiple data RAM blocks.
Figure 39B:
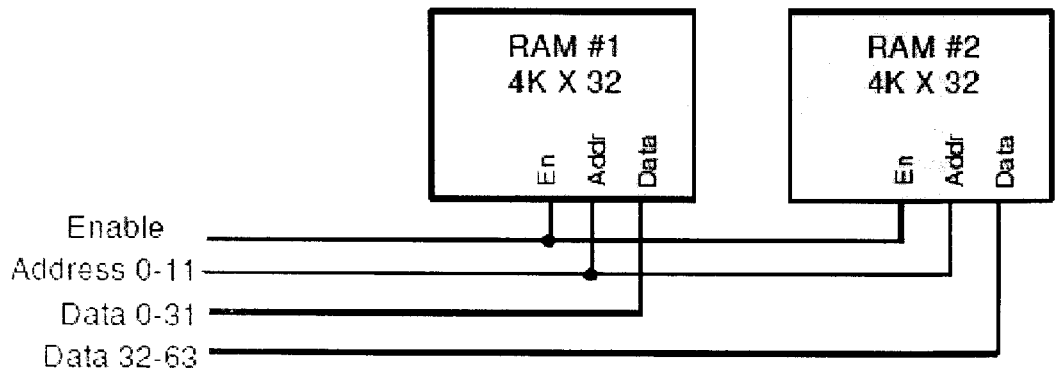

The primary difference between standard memory and embedded memory in FPGAs is that the latter will be used in many different contexts and, therefore, should be flexible. For example, the 128K RAM can be configured as 128K×1, 64K× 2, 32K×4, 16K×8, 8K×16, or 4K×32. The RAM blocks can also be combined to form a larger memory if needed. For example, FIGS. 39A and 39B show two non-limiting ways in which two 128 Kbit memory blocks can be combined. Finally, note that a nano RAM may require different writing and reading voltages. For example, an NRAM needs 1-1.2V for reading and 3-5V for writing. Hence, extra switches between reading and writing power lines need to be added, controlled by the reading or writing enable line.

B. Circuit Mapping Exploiting Embedded Memories

Figure 40:
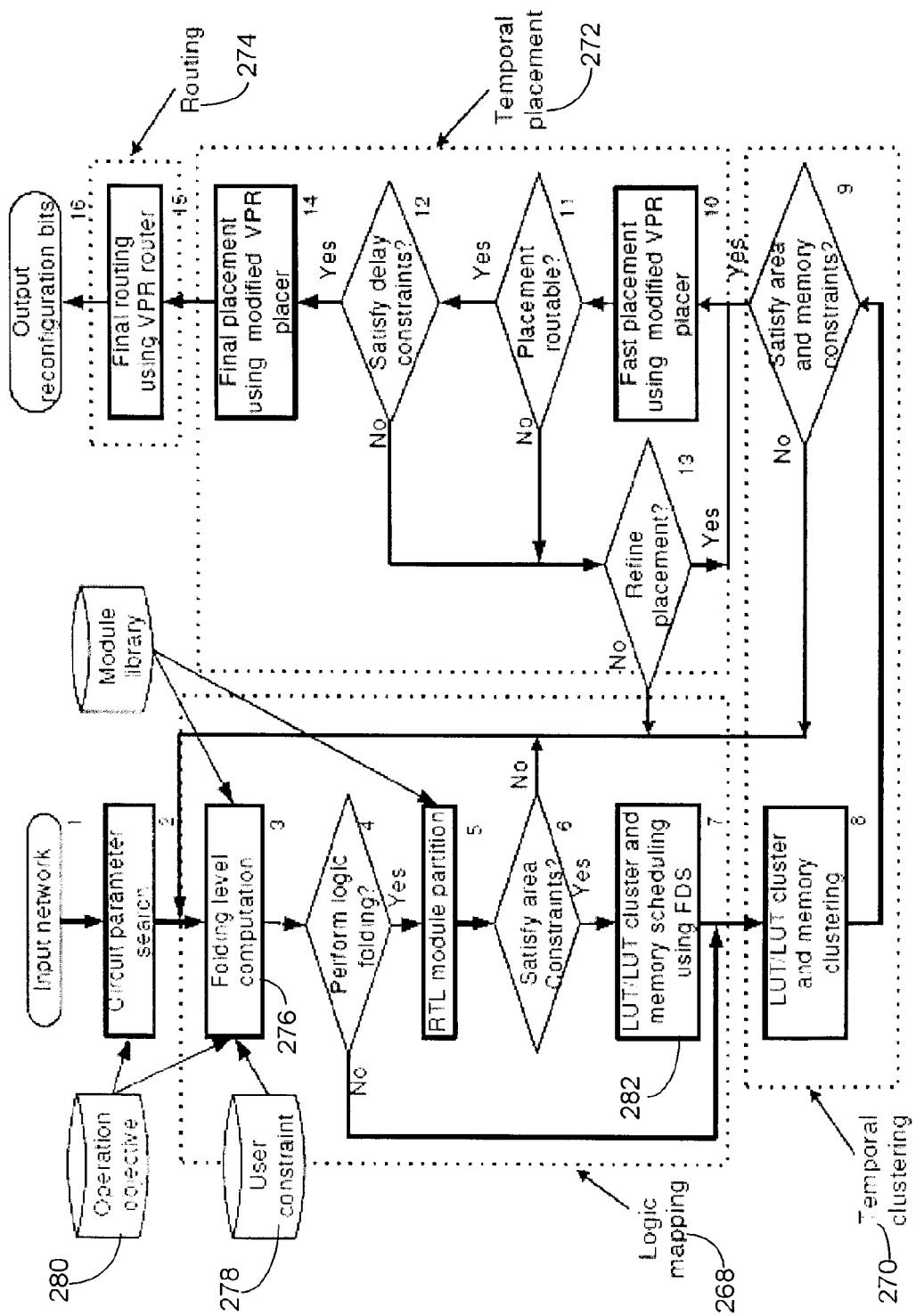
FIG. 40 illustrates another embodiment of an optimization method, referred to in its various embodiments as NanoMap, after adding data memory mapping.

An embodiment of integrated design optimization flow for NATURE, was discussed above with respect to FIG. 19, and referred-to as NanoMap. It can automatically choose the optimal logic folding level and implement the design in NATURE, targeting different optimization objectives. The input to NanoMap can be an RTL description or gate-level LUT netlist. For architecture embodiments which add data RAMs into the NATURE architecture, the optimization flow can be modified in order to take memory mapping into consideration, as illustrated in the embodiment of FIG. 40. NanoMap comprises four major steps: logic mapping 268, temporal clustering 270, temporal placement 272, and routing 274. Logic mapping automatically identifies 276 the best folding level based on the user-specified design constraints 278 and optimization objective 280. Then force-directed scheduling 282 is performed to assign LUTs and LUT clusters to appropriate folding stages (such a stage comprises all the LUTs in one folding cycle) in order to minimize overall resource usage. Temporal clustering 270 packs the LUT network into SMBs and temporal placement 272 places the SMBs into NATURE. Finally, the routing step 274 routes among SMBs. Memory mapping needs to be considered in all the steps.

The memory specification given in the input file to NanoMap contains the total size and word width of each RAM block needed. First, NanoMap maps them into one or more data RAM blocks. If the memory size needed exceeds 128 Kbit, multiple RAM blocks have to be combined to realize the requirement in the way shown in FIGS. 39A and 39B. Even if the required memory can be accommodated in a RAM block, each memory requirement is first mapped individually to separate RAM blocks during logic mapping to help minimize logic usage. Then they are clustered into fewer RAM blocks in the clustering steps to reduce memory usage. The modified NanoMap flow, after adding data memory mapping, is shown in FIG. 40. We discuss next how to include memory mapping in each step.

Figure 41:
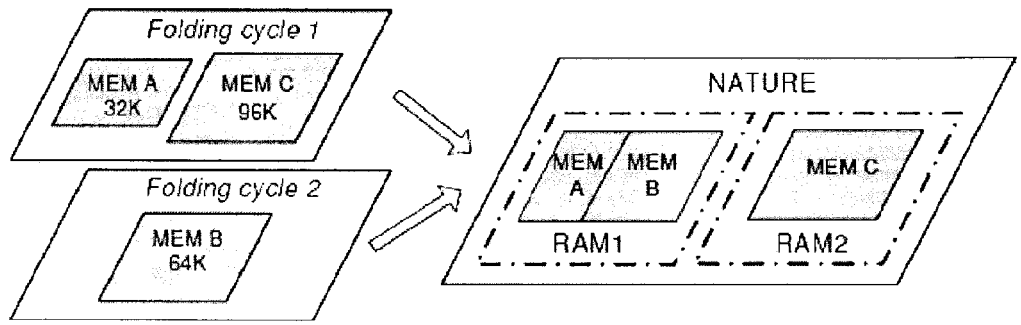
FIG. 41 schematically illustrates one example where the sum of sizes of a memory requirement A and a memory requirement B is less than the size of a RAM block embodiment.

Logic mapping: Memories are treated as modules and scheduled similarly as LUT clusters. However, a memory operation may span several folding cycles, based on the current folding level. Note that a data RAM block cannot be reconfigured during run-time reconfiguration. However, they can be shared in different folding cycles. For example, in FIG. 41, the sum of sizes of memory requirement A and memory requirement B is less than the size of a RAM block, where the memory requirement refers to the memory required by the application that is being mapped. Since they are accessed in different clock cycles, they can be mapped to one RAM block and share it across cycles. However, memory requirement C needs a full RAM block and has to be mapped separately. It will remain in the system through all the clock cycles. Since the memory requirements in the same clock cycle cannot share a given RAM block due to the need for simultaneous accesses, it is better to schedule memories whose sizes are less than that of a full RAM block into different clock cycles in order to reduce the total number of RAM blocks used. This is equivalent to minimizing the concurrent number of memories used in one cycle. Hence, force-directed scheduling (FDS) is also applicable in this scenario. To guide memory scheduling, distribution graphs (DGs), which describe resource usage for each type of operation, need to be built first. DGs for LUT computation and register storage can be built as described above. The memory distribution graph can be built similarly to a LUT distribution graph with the weight for each memory being set to its relative size compared to one data RAM block. In each scheduling attempt, the force, which indicates the change of overall resource usage due to the current schedule, is computed based on the DGs. FDS tries to minimize the force in the scheduling. Since a memory requirement of a full RAM block size precludes sharing of such a block by other memory requirements, it can be excluded from the memory distribution graph and the memory scheduling process. When dealing with different types of applications, memory mapping can be performed accordingly. If the application is logic-intensive, and the on-chip RAM capacity for the memory requirements is sufficient, we can focus on logic area minimization. In this case, memory scheduling is performed after LUT/LUT cluster scheduling. If the application is memory-intensive and mapping each memory requirement individually is not possible, then memory scheduling should be done first.

Figure 42A:
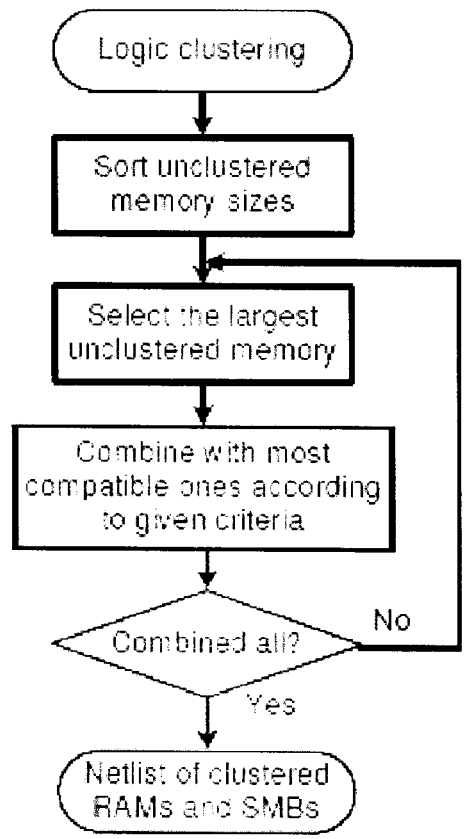
FIG. 42A illustrates one embodiment of a memory clustering process.
Figure 42B:
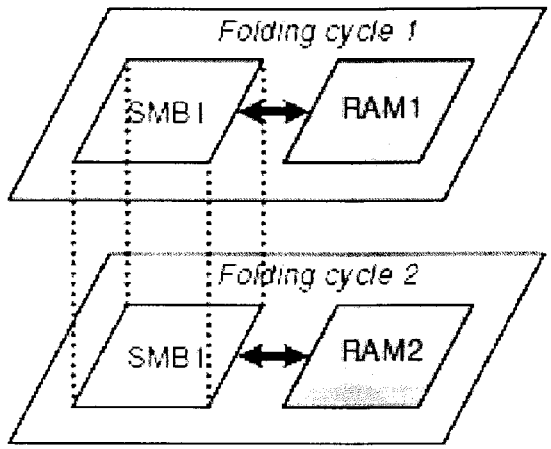
FIG. 42B schematically illustrates one embodiment of connections between two memories.

Temporal clustering: After scheduling, in the clustering step, LUTs are packed into SMBs and small memory requirements are combined to share RAM blocks. Memory clustering can be delay optimization oriented or area optimization oriented. First, the logic is clustered in each folding cycle, as described above. Then the memories are sorted according to their sizes. For each unclustered memory, from large to small, based on the criteria determined by the optimization objective, appropriate memory requirements are selected such that they can share a RAM block. The flow is illustrated in FIG. 42A. If clustering is targeting delay optimization, the criterion is the number of connections between two memories, defined as the number of inputs (outputs) from (to) the common SMBs, as illustrated in FIG. 42B. The memories with the most connections are clustered together. This leads to the most reduction in delay between the logic and memory. If the objective is area optimization, a greedy bin packing solution can be used. The criterion for selection is just the memory size in this case. Note that the combined memory requirements may not have the same input/output bandwidth requirement. Hence, the memory configuration circuit inside the RAM block may need to be reconfigured in corresponding cycles.

Temporal placement and routing: The VPR placer and router, as described in an article entitled, "VPR: A new packing, placement and routing tool for FPGA research" by V. Betz and J. Rose in the August 1997 *Proc. Int. Wkshp. FPGA*, pp 213-222, and hereby incorporated by reference, were modified to support placement containing RAM blocks. The RAM block distribution is specified in the input parameter file to VPR. RAM placement is performed similarly to that for SMBs. However, the positions for RAMs are specified and need be honored during placement. Also, an SMB cannot be placed in a position occupied by RAM blocks. For routing, since the RAM interconnect interface is the same as that for SMBs, the VPR router can route RAM blocks and LBs similarly.

C. Experimental Results

Incorporating data memory into NATURE leads to significant efficiencies in processing logic-intensive and memory-intensive applications, such as video and image processing. To establish the efficacy of the NATURE architecture, eight benchmarks, which include several memory accesses, were mapped to NATURE. Among them, Haar and Jacobian are algorithms implementing Haar and Jacobian transformations. The Haar and Jacobian transformations are described in an article entitled, "Synthesis of heterogeneous distributed architectures for memory intensive applications" by C. Huang et al. published in the November 2003 *Proc. Int. Conf. Computer-Aided Design*, pp 46-53, and hereby incorporated by reference. Matrix, Wavelet and Motion are described in the previous section. YUV2RGB implements image conversion from the YUV mode to the RGB mode. Finally, finite impulse response (FIR) filter and infinite impulse response (IIR) filter are well-known digital signal processing benchmarks. (Also described in the C. Huang et al reference incorporated above). They are all widely used algorithms in multimedia processing.

To set up the experiments, Design III was chosen as the LE, as discussed above, and parameters were set as h1=3, h2=3, h3=2. Based on the design space exploration results, a medium-size SMB is a good choice when logic folding is targeted. Hence, we included 16 LEs in an SMB and assumed a two-level logic structure. For the interconnect structure, we accordingly assumed that W=160, Fc=8 and Fs=3. The wire segment distribution is as discussed above. Since the memory requirements for the benchmarks are not large, we assumed the data RAM density to be 1/16, which means there is one data RAM block among 16 SMBs. Finally, the available number of reconfiguration copies k; was assumed to be 32. The corresponding chip area overhead for these reconfiguration nano RAMs is around 26%. Note that this chip area overhead is easily recouped because NATURE requires much less chip area devoted to interconnects due to most communications being local owing to logic folding. (by contrast, in traditional FPGAs, interconnects may occupy 90% of chip area) The modified NanoMap was then used to map the benchmarks to NATURE. The experimental results are provided in Table IX of FIG. 43. Columns 1-4 describe the benchmarks, including the total number of LUTs contained, number of memory access requirements and their total size. Columns 5-8 present the best folding level, and area, delay, and memory mapping results when targeting area-delay product optimization. Column 9 shows the improvement in the area-delay product relative to no-folding (which is the traditional way to map a circuit to an FPGA). From the table, we can see that due to limiting k to 32, only a medium folding level is possible (i.e., enough reconfiguration copies are not available to make folding level 1, 2 or 3 possible). The maximum area-delay product improvement is 6.5× (average of 5.1×). This implies that for the same delay, NATURE, on an average, requires only 1/5th the area required by a traditional FPGA. For example, Motion requires 664 LEs (42 SMBs) to process a pair of 32-bit pixels based on folding level 4. If the chip capacity is 200×100 LBs, NATURE can process (200×100)/42=476 pairs of pixels simultaneously. Since its area-delay product improvement is 6.5×, for the same delay, a traditional FPGA would be able to process only 476/6.5=73 pairs of pixels within the above chip capacity.

Nano RAMs make available much larger on-chip memory than SRAMs can. This allows for the possibility of storing much larger image data on-chip, avoiding the need to frequently transfer data on-chip from an external memory. For example. if an image used in a medical application requires a resolution of 1024×1024 pixels, each 32-bit wide, then it requires roughly 32 Mb of storage. Assuming a data RAM density of 1/16 each data RAM block of size 128 Kb, and the above capacity of 200×100 LBs, we have (200×100)/16×128 Kb=160 Mb of on-chip memory available at the same technology node. Thus, roughly five such images can be stored on-chip in NATURE. As a point of comparison, the FPGA with the largest on-chip memory currently available, i.e., Virtex-6, can only store one image of this type. Thus, the combination of logic folding and on-chip nano RAMs provides tremendous advantages to NATURE relative to traditional FPGAs.

D. Memory Density Exploration

Figure 44:
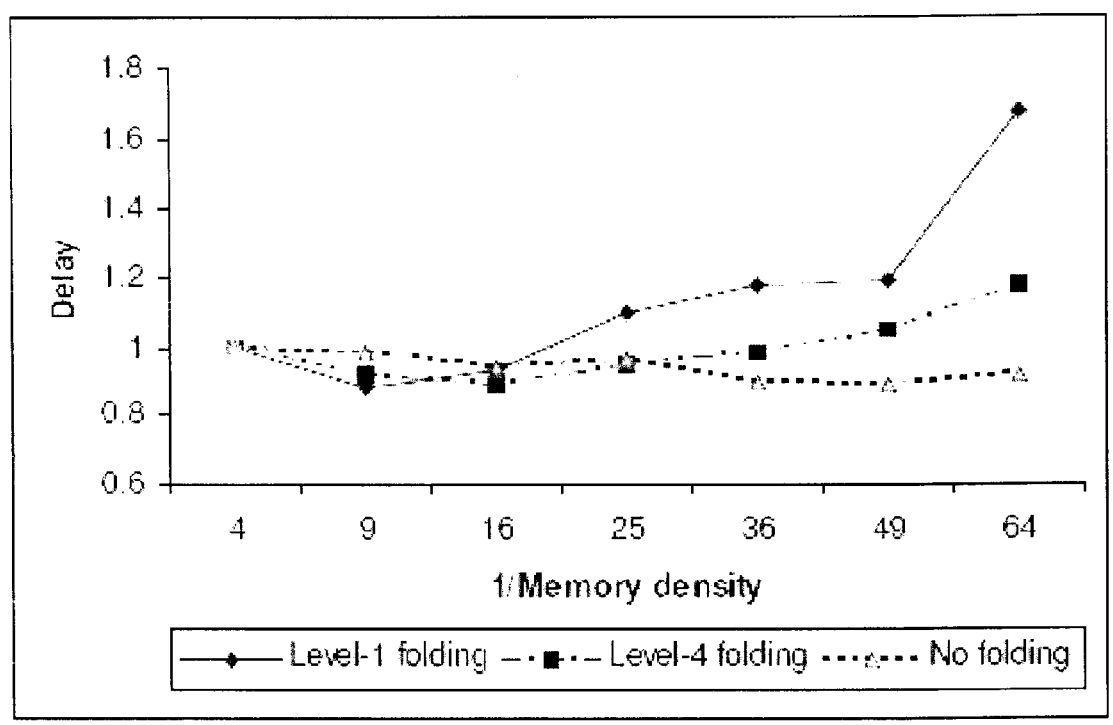
FIG. 44 illustrates one embodiment of a relationship between circuit delay and memory density for various folding levels.

How much on-chip data RAM capacity is needed depends on the memory requirements of applications. If the application is memory-intensive, there should be sufficient number of data RAM blocks to store the data. If the application is logic-intensive, the number of on-chip RAM blocks should be reduced to leave space for LBs. The circuit delay is also affected by the memory density. If the data RAM blocks are sparse, the communication delay between the logic and memory will increase. If they are too dense, it will also create a difficulty for NanoMap to map logic close to them. The relationship between circuit delay and memory density is shown in FIG. 44. The results are normalized to the case when memory density is ¼. We can see that when using small folding levels, the logic is folded significantly enough that the ratio of logic to memory is small. Hence, a larger memory density is preferable in this case. When large folding levels or no-folding are used, there is much more logic needed than memory in any clock cycle. Hence, a sparse memory structure, i.e., a smaller memory density, gives better results. Hence, an instance of the NATURE family can be chosen with an appropriate memory density, based on the memory requirements of the application and the selected folding level. In our experiments, for applications with small-to-medium memory requirements, we found that a memory density of 1/16 (one data RAM block every 16 LBs) gave good results.

Low Power 3D Reconfigurable Architecture

The embodiments of the NATURE design described above include fine-grain logic blocks. Since NATURE's high logic density makes it possible to implement large applications in a small chip area, NATURE is particularly attractive for data-dominated applications. The throughput of the data-parallel applications can be boosted by running their parallel implementations on different data. However, the computation power of NATURE can be further enhanced by incorporating coarse-grain DSP modules, optimized for commonly occurring DSP functions. Modern FPGAs, such as Xilinx and Altera, contain specially-designed DSP blocks to speed up processing. Further embodiments of the reconfigurable NATURE architecture may incorporate coarse-grain DSP blocks, together with the embedded data RAM blocks described previously.

As discussed previously, in NATURE, high-speed nano RAMs may be distributed on the chip to support run-time reconfiguration and logic folding. The nano RAMs, which can be deployed in NATURE, can be of various types, e.g., register files, static RAM (sRAM), carbon nanotube RAM (NRAM), phase-changing memory (PCM), magnetroresistive RAM (MRAM) or embedded DRAM (eDRAM). However, although these nano RAMs are CMOS fabrication-compatible, the fabrication of some types of nano RAMs is still not mature enough for fine-grain integration with CMOS. Hence, to implement some embodiments of NATURE, 3D integration may be employed, in which the nano RAMs are implemented in a separate wafer layer on top of the 2D NATURE logic layer. The two wafer layers can be bonded through various bonding approaches known to those skilled in the art. Using 3D design not only eases NATURE's fabrication, but also reduces chip area and improves performance. During run-time reconfiguration, the reconfiguration bits can be dynamically loaded into the lower logic layer and support the current computation. Since a separate memory layer is able to accommodate more copies of reconfiguration bits, deeper logic folding is enabled and further logic density and area-delay product improvement can be achieved simultaneously. Note that if relatively mature nano RAMs are used in the architecture, such as eDRAM, the new design can be fabricated immediately. The RAM used may be non-volatile or volatile.

In order to scale NATURE to deep nanometer technology nodes, besides performance, it is also important to reduce its power consumption. However, as technology scales further, bulk CMOS designs are facing significant challenges due to shortchannel effects, sub-threshold leakage, gate-dielectric leakage and device-to-device variations. The use of double-gate CMOS technologies can significantly alleviate many of these problems. FinFETs are one popular double-gate CMOS technology due to their ease of fabrication. In addition, for 3D designs, since a large number of active devices is packed in a small volume, thermal issues are much more important to address than in the corresponding 2D designs. In some embodiments, temperature can be reduced by lowering the power density of the design. To address the above challenges, an embodiment is presented to implement NATURE in FinFET technology and optimize its power consumption and density. FinFETs have two gates: back and front. Biasing of the back gate can change the threshold voltage of the front gate. This can be done statically at design time or dynamically at run-time. This allows speed vs. leakage power trade-offs. Since leakage power is a substantial part of overall power in FinFET designs, such a mechanism can be very useful. If the back gates of FinFETs on the non-critical path are reverse-biased, the leakage power can be greatly reduced without degrading performance.

Unified Fine-Grain/Coarse-Grain Architecture

FPGAs can be roughly divided into two subclasses: coarse-grain and fine-grain, depending on the granularity of the logic modules. Fine-grain FPGAs are usually based on LUT clusters, which are suitable for general-purpose data-dominated applications. However, many current FPGAs are coarse-grain, and include relatively complicated and optimized logic blocks, embedded memory blocks and specific function modules to enable the implementation of complex systems. For example, modern FPGAs are widely used for DSP applications, especially multimedia processing, due to its higher throughput compared to digital signal processors and general-purpose processors, and lower cost and higher flexibility compared to application-specific integrated circuits (ASICs). Today's leading-edge FPGA chips can perform tens of billions of multiply-and-accumulate (MAC) operations per second, which is a common operation in multimedia processing. Fast processing is derived from dedicated high-performance coarse-grain blocks optimized for DSP applications. The computational power of a fine-grain NATURE embodiment may be significantly enhanced by adding to it a set of simple coarse-grain DSP blocks. This results in a unified fine-grain/coarse-grain architecture.

A. DSP Block Design

Since the goal of a DSP block is to speed up signal processing, it should be able to implement basic computation functions, such as multiplication, addition, subtraction, accumulation, dynamic shift, etc. Then such blocks can be configured to build larger computationally-intensive subsystems, such as finite impulse response (FIR) filters, infinite impulse response (IIR) filters, fast Fourier transform (FFT) functions, discrete cosine transform (DCT) functions, etc. Commercial FPGAs, such as those from Xilinx and Altera, include sophisticated and complicated DSP blocks for such subsystem implementations. However, the ability to perform fine-grain reconfiguration (potentially every clock cycle) in NATURE implies that the coarse-grain DSP block that is included need not be very sophisticated. Such blocks can implement basic functions and fine-grain reconfiguration can be used to interconnect such blocks among themselves or with the LUTs to realize the desired subsystem functionality.

Figure 45:
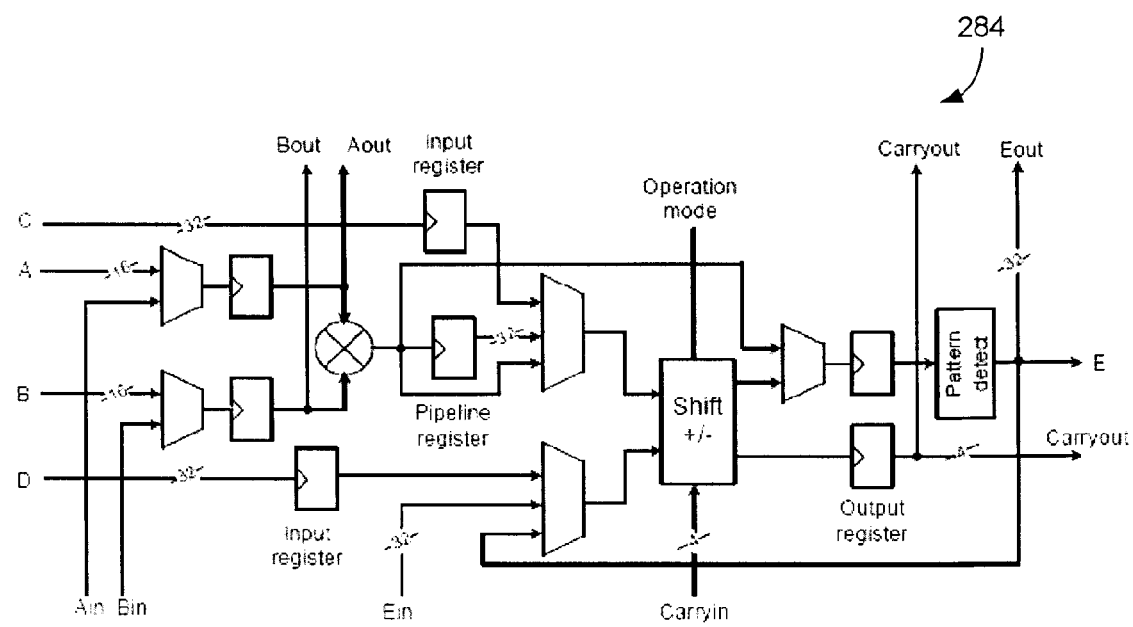
FIG. 45 schematically illustrates one embodiment of a DSP block include an embodiment of a reconfigurable computer architecture.

The architecture of the DSP block 284 we include in unified NATURE is shown in FIG. 45. Its features are summarized next.

- The DSP block contains a 16-bit multiplier and a 32-bit adder/subtractor to support fast MAC operation which computes the product of two numbers and adds that product to an accumulator.
- The adder/subtractor is configured by the control variable "operation mode" to implement either addition or subtraction.

Its inputs can be shifted by up to 16 bits to enable the building of wider multipliers. The control variable can be derived from a pre-stored value in the associated nano RAM or from a signal computed at run-time.

The output of the DSP block is fed back to the input of the adder/subtractor to realize accumulation as well as support block reuse during logic folding.

Dedicated internal interconnects are used to build large functions using multiple DSP blocks. Connections among input registers "Ain", "Aout", "Bin", and "Bout" help form shift registers. Cascade signals "Carryin", "Carryout", "Ein", and "Eout" support the building of wider adder/subtractors and multipliers.

The optional pipeline register can enable pipe lining of the DSP block.

MUXes at the input/output of functional units enable input/output selection flexibility. The select signals can be derived from pre-stored bits in the associated nano RAM or from user-supplied input.

The pattern detector at the DSP output can detect convergent rounding and overflow/underflow for saturation arithmetic.

An output/accumulate register is included for the multiplier or adder/subtractor output.

B. Unified Architecture

Figure 46:
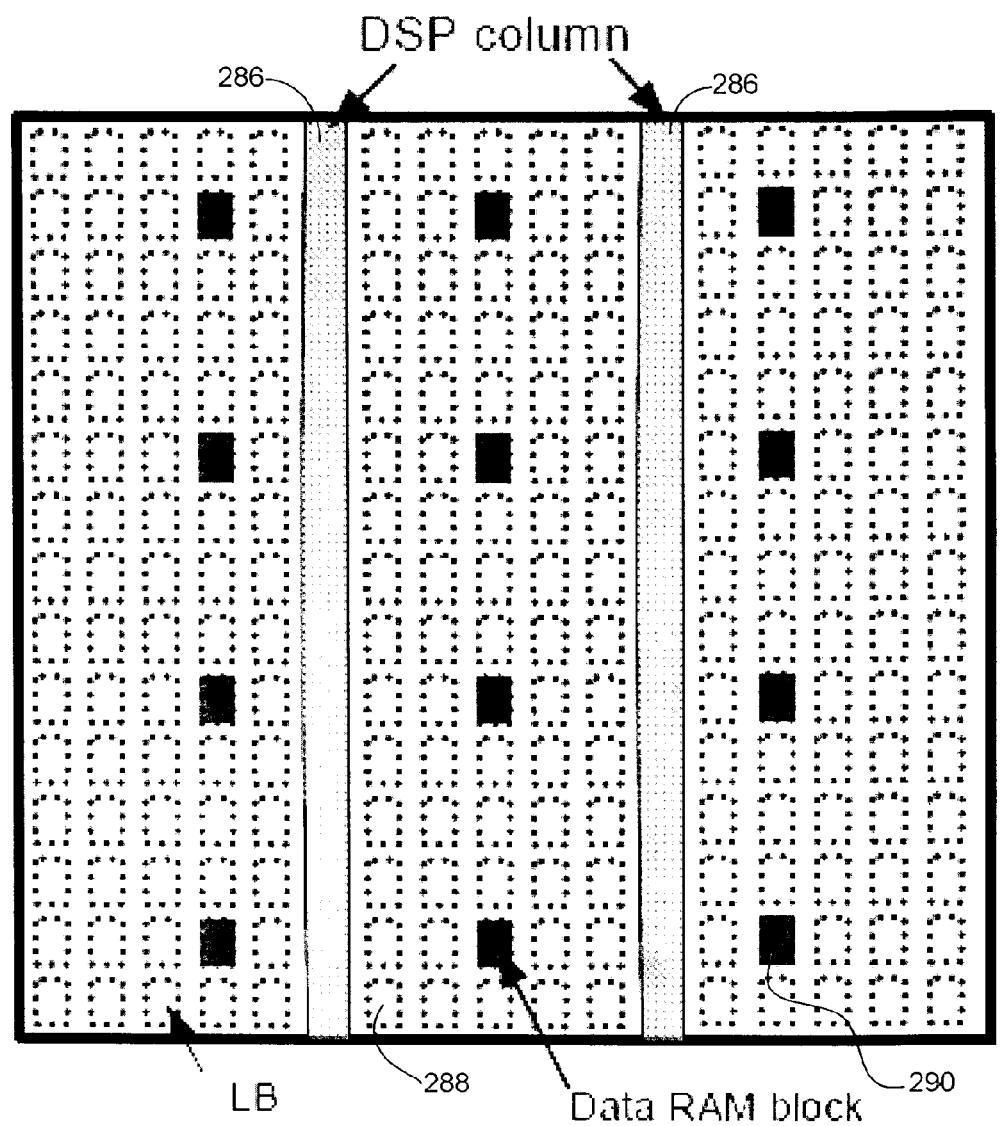
FIG. 46 schematically illustrates an embodiment of a unified reconfigurable computing architecture containing fine-grain logic blocks, distributed data RAM blocks and stacked DSP blocks.

The size of a DSP block is made the same as that of one SMB and its delay for executing multiplication and addition is found to be 6 ns through SPICE simulation in a 32 nm technology. The DSP block has 96 primary inputs, 11 control bits (4 bits for adder/subtractor control, 7 select bits for MUXes), and 36 outputs (32 primary outputs and 4-bit carry-out). Since the number of inputs/outputs of the DSP block is similar to the number of inputs/outputs of an SMB, the DSP block can be connected with general reconfigurable chip interconnects in the same fashion as an SMB connects to the surrounding interconnect. The DSP blocks are stacked vertically in a DSP column 286 to ease cascade connections among DSP blocks. An embodiment of the unified architecture containing fine-grain logic blocks 288, distributed data RAM blocks 290, and stacked DSP blocks 286 is illustrated in FIG. 46. Incorporation of data RAM blocks 290 in NATURE was described above. Automatic mapping of register-transfer level (RTL) or gate-level circuits to such a unified architecture will be discussed later in this text.

3D Nature Architecture Design 3D integration is a well-accepted approach for the so-called "More than Moore" applications, since it enables circuits realized in a non-CMOS technology to be fabricated in a separate wafer layer and integrated with the CMOS layer to form an advanced hybrid system. Since in our design, we employ nano RAMs for the storage of reconfiguration bits, in order to better implement the unified architecture, we employ 3D integration to place the nano RAMs on a separate memory layer on top of the CMOS logic layer. In this section, we first provide background material on 3D integration and nano RAMs. Then we show how 2D NATURE can be extended to a 3D architecture.

Background on 3D Integration

Figure 47:
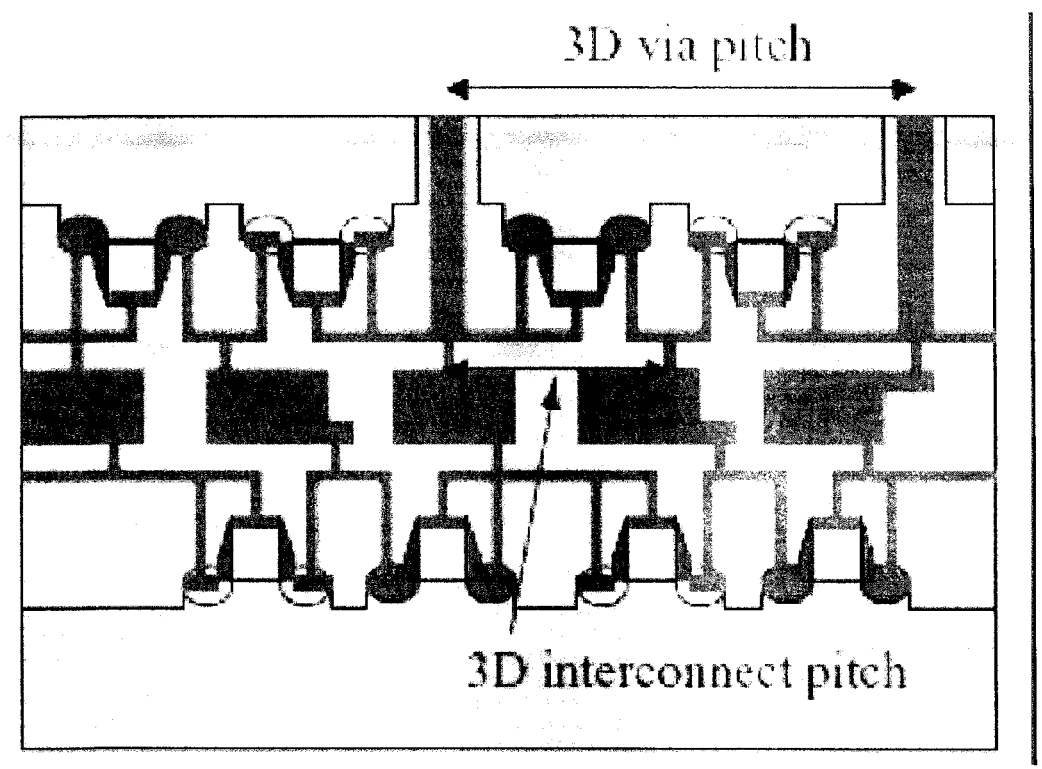
FIG. 47 schematically illustrates one embodiment of a 3D integration using face-to-face integration.

Recently, advancements in technology have made the fabrication of a single chip with multiple device layers (wafers) stacked on top of each other technically and economically feasible. This is commonly referred to as 3D integration. 3D vias that connect (or electrically couple) these layers thus form an inter-layer interconnect. Wafer-level integration can be done through several approaches, e.g., dielectric bonding, metal bonding and metal/dielectric bonding. FIG. 47 illustrates a 3D integration example using face-to-face integration. For wafer-scale integration of circuits, including wafer thinning, alignment and bonding, results for interconnections between silicon levels yield dimensions as small as 0.14 μm for diameter, 1.6 μm for height, and 0.4 μm for pitch. Interconnection densities of $10^8/cm^2$ have been reported. Layer-to-layer vias provide a high-density and low-latency interface. They can be treated like regular on-chip metal due to their small size and small delay (tens of picoseconds). The increased device density, reduced interconnect length, improved interconnect delay and power consumption provide new opportunities for architecture design. The challenges that 3D integration faces mainly include bonding quality and thermal management. Misalignment among wafers may increase bonding defects and limit via density. However, with continuous improvements in bonding techniques, wafer alignment precision has now advanced to less than 1.5 μm and thermal effects seem to be manageable.

Background on Nano RAMs

As discussed previously, there are several types of promising nano RAMs, which are possible candidates for on-chip memory in NATURE, including register files, SRAM, NRAM, MRAM, PCM, and eDRAM. NRAM is a non-volatile memory being developed by a startup company, called Nantero. The NRAM cell is mainly composed of control wires and suspended nanotubes. The memory state is determined by the state of the suspended nanotubes—whether they are bent or not leads to electrically and mechanically stable ON/OFF states, resulting in different resistances, "1" with hundreds of ohms, "0" with Gigaohms. MRAM is also a non-volatile memory under development since the 1990s. In an MRAM, data are stored in magnetic storage elements, which are magnetic tunneling junctions. The elements are formed from two ferromagnetic plates, separated by a thin insulating layer. One of the plates is a permanent magnet set to a particular polarity. The other's field changes based on the external field. If the two plates have the same polarity, the element stores a "0", else a "1". Different polarities imply different output voltages. PCM is also non-volatile and was first proposed in the 1970s. It employs chalcogenide phase change materials and various dopants as storage material. The crystalline and amorphous states of chalcogenide glass have dramatically different electrical resistivity, which forms the basis for data storage. The PCM cell functions by switching between the amorphous status (reset) and crystalline status (set) through heating. The difficulty of making a deep trench was a barrier to the deployment of DRAM as an embedded memory before. However, recently, researchers at NEC and IBM have developed a DRAM structure based on the standard CMOS logic process using a single fabrication line. Thus, eDRAM can also be used as on-chip memory now. The nano RAM cell can be as small as 6-12 $F^2$, where F is the technology node, thereby increasing on-chip memory capacity dramatically.

3D NATURE Design

Figure 48:
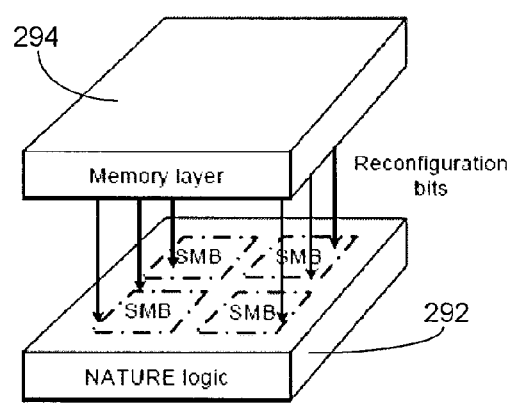
FIG. 48 schematically illustrates a three dimensional embodiment of a reconfigurable computer architecture.

As mentioned before, in order to ease fabrication and enlarge the storage for reconfiguration, we can extract the distributed nano RAM blocks from the 2D NATURE architecture and place them on a separate layer. As schematically illustrated in FIG. 48, embodiments of 3D NATURE include two layers (wafers): a logic layer 292 and a memory layer 294. The logic layer 292 and the memory layer 294 are electrically coupled together, for example, by vias, although there are other ways the layers could be electrically coupled together. Embodiments of the logic layer may use CMOS technology. In some embodiments, the memory layer 294 is composed of CMOS fabrication-compatible nano RAM blocks and CMOS peripheral circuits. The CMOS peripheral circuits can reduce the number of interface connections needed to electrically couple the memory layer 294 to the logic layer 292. In other memory layer embodiments, the RAM blocks of the memory layer 294 may not be fabricated with a CMOS fabrication-compatible process.

During reconfiguration, the reconfiguration bits are dynamically loaded from the memory layer 294 onto the logic layer 292. Of course, more fine-grain division of NATURE into more than two layers is also possible for other embodiments, along the lines advocated in the article entitled "Performance benefits of monolithically stacked 3D-FPGA" by M. Lin et al. as published in the February 2006 Proc. Int. Symp. FPGA, pp 113-122, and hereby incorporated by reference. However, embodiments having a two-layer division suffices to significantly improve NATURE's capabilities.

Figures 49, 50:
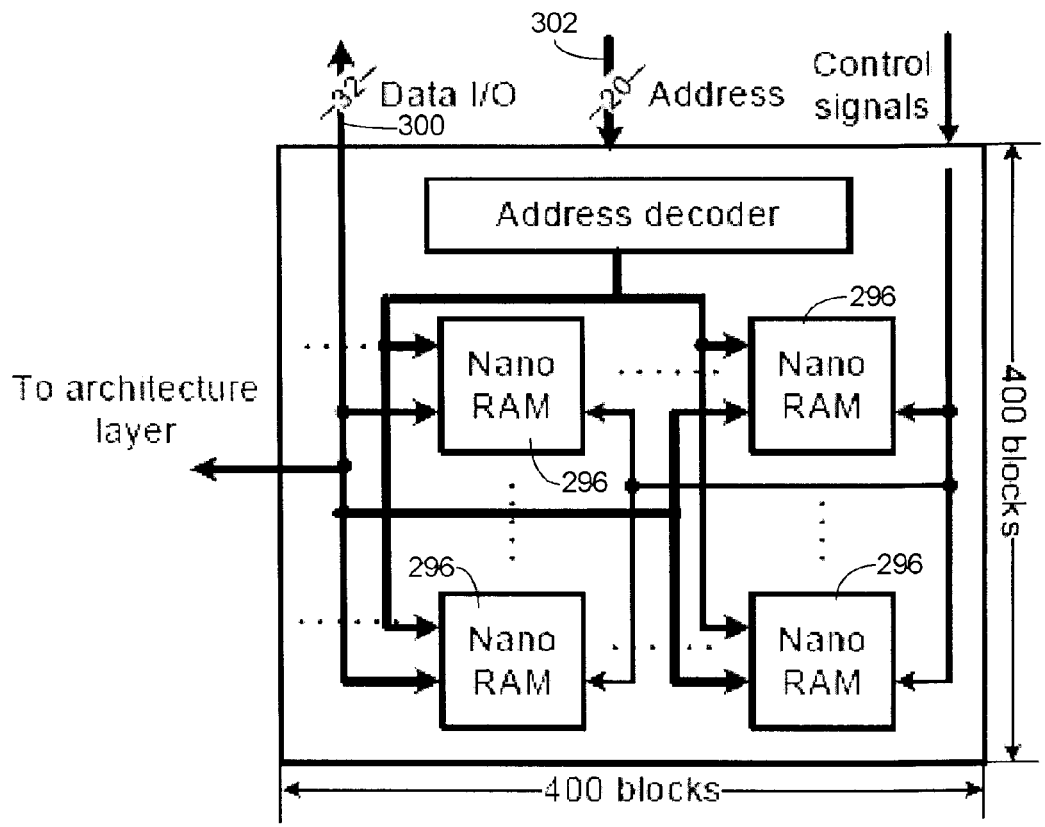
FIG. 49 schematically illustrates one embodiment of a memory layer design.
FIG. 50 illustrates distribution of reconfiguration bits for two types of SMB architectures.

An embodiment of a memory layer design is illustrated in FIG. 49. An array of small memory blocks 296 is used, instead of one large one, to speed up memory access, as well as spread the vertical vias more uniformly across the chip. The vertical vias transfer the reconfiguration bits to the lower logic layer. The memory size required to reconfigure an LB is similar to the size of the LB itself. This part of the memory is divided into 16 small blocks of the same size. Hence, the size of one such small RAM block is approximately 1/16 the size of an SMB and the SMB is fed by these 16 RAM blocks. We first calculate the number of reconfiguration bits required for an SMB. As mentioned earlier, the some embodiments of an SMB may contain either one or two levels of logic. The distribution of reconfiguration bits for these two types of SMB architectures is shown in Table X of FIG. 50. Here, we assume that an SMB contains 16 LEs and an LE contains 4 flip-flops. We keep the interconnect architecture the same as in the NATURE architecture discussed above since it is not impacted by the 3D organization. In this Table X of FIG. 50, CB and SB refer to a connection box and switch box, respectively. We can see that approximately 3.6 Kb reconfiguration bits are required to reconfigure an SMB with 16 LEs. Note that although the number of bits will vary with the number of LEs in an SMB, the SMB size will also proportionally vary with the number of LEs contained in it. Hence, it is possible to keep the sizes of the memory feeding the SMB and the SMB itself roughly the same.

Next, we explore the reconfiguration procedure for the 3D embodiments. By laying out an SMB in 32 nm technology, we found that its size is around 125 μm×125 μm. Since nano RAM cell size is $6F^2$-$12F^2$, accounting for the peripheral circuits, approximately 64 sets of reconfiguration bits can be stored in the memory area of one LB, totally 3.6×64=230.4 Kb. However, through design space exploration, it is found 32 copies of reconfiguration bits is sufficient to achieve area-delay product optimization. Hence, we assume 32 reconfiguration copies in the memory. That is 3.6×32=115.2 Kb per memory. Hence, each nano RAM block stores around 7.2 Kb. Note that when the LB size scales with technology scaling, the nano RAM cell scales correspondingly and the number of reconfiguration bits stored remains roughly constant.

In order to reduce the required via density without harming performance, we can transfer the 3.6 Kb reconfiguration bits in two clock cycles from the memory blocks, 1.8 Kb in each. We set the data line width for each nano RAM block to 114 and structure the 7.2 Kb memory block as 64×114. For the various nano RAMs, the access time for the small nano RAM block falls in the 1 ns-1.5 ns range. Assuming a via length of 20 um, the delay incurred for transferring the required number of bits through the via and connection wires to the SRAM cell on the logic layer is 200 ps. Hence, the maximum total reconfiguration time is (1.5+0.2)×2=3.4 ns. Of course, for the best nano RAM (which currently happens to be an NRAM), the reconfiguration time will only be (1.0+0.2)×2=2.4 ns. To hide this reconfiguration latency, we add a shadow SRAM cell for each SRAM cell in the architecture. When the shadow SRAM cell is being reconfigured, the other SRAM cell can support current computation or communication.

Figures 51, 52:
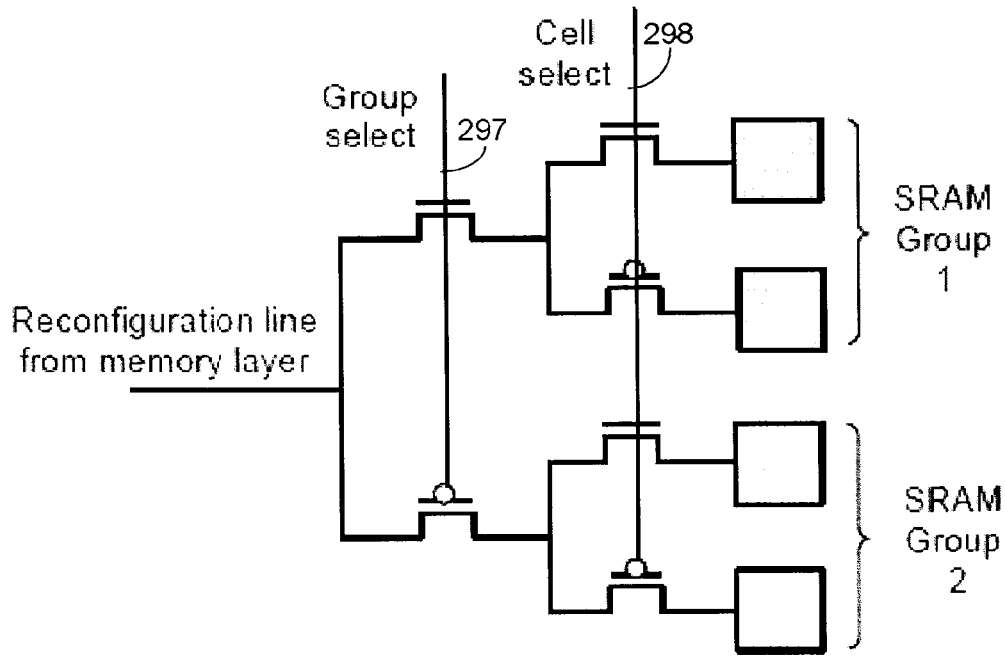
FIG. 51 schematically illustrates one embodiment of a two control signals which are needed to control reconfiguration in an embodiment of a reconfigurable computer architecture which utilizes shadow memory.
FIG. 52 shows relevant parameters for one embodiment of a 3D reconfigurable computer architecture.

Two control signals 296 and 298 are needed to control reconfiguration, as shown in FIG. 51. One 296 selects the appropriate SRAM group (shadow or main), and the other 298 selects the appropriate SRAM cell to write into. Since for most applications, the folding clock period is larger than 2.5 ns, even for level-1 folding, 3D dynamic reconfiguration will not cause a delay overhead. Even otherwise, the delay overhead will be small. The final folding clock period can be set to be the larger of the reconfiguration time for the nano RAM used and the required time needed to execute a folding stage. Once the folding level is chosen and folding clock period fixed, the control signals can be set correspondingly.

As for the area of the 3D architecture, since the shadow SRAMs occupy much smaller area than the distributed NRAM blocks in the 2D NATURE architecture, the total chip area is also reduced.

Referring back, FIG. 49 also illustrates how the memory layer can be initially configured from an off-chip source. The reconfiguration bits can be written through the 32-bit data bus 300, and the address bits 302 select the nano RAM block. Inside each nano RAM block, since the bits are written and read in sequence, a simple counter can control the words and bits selection. The control signals from the primary inputs control memory enable, write and read. They can be set based on the global clock cycle, synchronized with the computation in the logic layer.

Finally, we need to determine what vertical via density is recommended for this embodiment of a 3D architecture to make sure it can be supported by the fabrication technology. Based on the discussion in the previous section, we assume the via size to be 1 μm square, and the via pitch to be 2.5 μm. Thus, a 125 μm×125 μm LB can support 2500 vias. This is more than sufficient to transfer the reconfiguration bits to the logic layer in the time required. The relevant parameters for this embodiment of a 3D architecture are summarized in Table XI of FIG. 52.

FinFET Based Low-Power Nature Architecture

Compared to an ASIC, one particular disadvantage of an FPGA is its much higher power consumption. With technology scaling, leakage power has become a much larger fraction of total power, around 60% in today's technology. The fraction of leakage power continues to grow because of shortened channel lengths and reduced gate dielectric thickness. In addition, a higher power consumption leads to a higher power density, leading to thermal problems, especially in a 3D architecture, since a large number of active devices are packed into a much smaller volume. Hence, reducing the power consumption of NATURE, especially its leakage component, is very important. In this section, we introduce FinFET-based low-power techniques targeted at NATURE.

Background on FinFET

Figure 53:
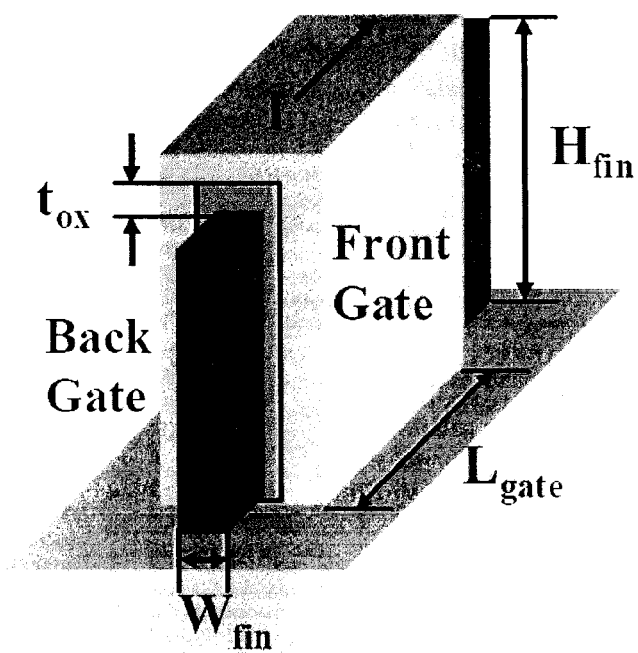
FIG. 53 schematically illustrates structure and various parameters for one embodiment of a FINFET.

FinFETs are promising replacements for bulk CMOS to enable CMOS scaling beyond the 32 nm technology node. Scaling of bulk MOSFETs faces significant challenges beyond 32 nm: severe short-channel effects, sub-threshold leakage, gate-dielectric leakage and enhanced sensitivity to process variations. These problems can be alleviated through multi-gate FETs that can simultaneously suppress subthreshold and gate dielectric leakage currents by providing a stronger control over the channel with multiple electrically-coupled gates. Among various multi-gate FETs, FinFETs are the most promising choice because of their ease of fabrication and compatibility with existing CMOS fabrication technology. FIG. 53 illustrates structure and various parameters for one embodiment of a FINFET. $L_{gate}$ refers to its gate length. $H_{fin}$ and $W_{fin}$ refer to the height and width of the fin. $t_{ox}$ refers to the oxide thickness. The width of a FinFET (i.e., the width of the area controlled by the two gates) is defined as $W_{gate}=2\times H_{fin}$.

Figure 54A:
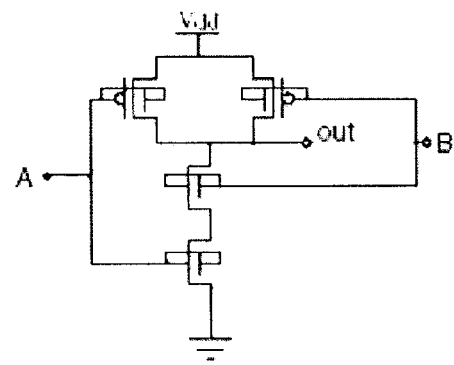
FIGS. 54A, 54B, and 54C schematically illustrate embodiments of NAND gates implemented in the three FinFET modes (SG, LG, and IG), respectively.
Figure 54B:
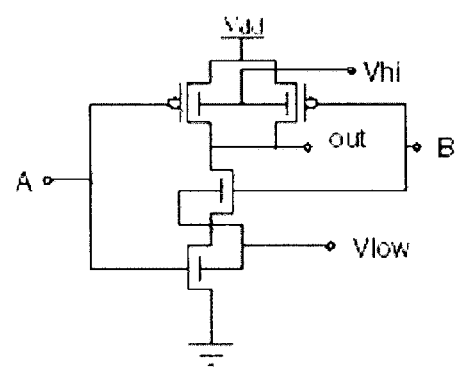
Figure 54C:
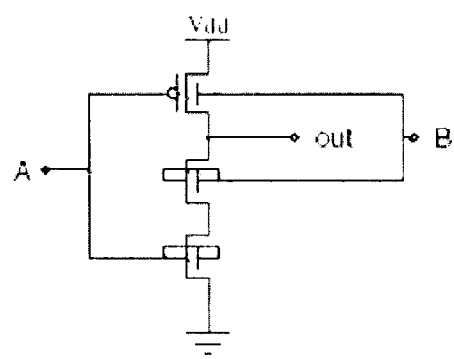

The two gates of a FinFET can be used in various ways. Three possible modes of FinFET operation include the shorted-gate (SG) mode in which the gates are tied together to improve performance, the low-power (LP) mode in which the back-gate is tied to a reverse-biased voltage to reduce leakage power, and the independent-gate (IG) mode in which independent signals drive the two gates to optimize the circuit topology as described in an article entitled "CMOS logic design with independent-gate FinFETs" published by A. Muttreja et al. in the October 2007 *Proc. Int. Conf. Computer Design*, pp 560-567, and hereby incorporated by reference. LP and IG modes require independent control of the two gates of a FinFET. Such FinFETs are referred to as independent-gate FinFETs and can be easily obtained by etching away its top part. NAND gates implemented in the three modes (SG, LG, and IG) are illustrated in FIGS. 54A, 54B, and 54C, respectively, where $V_{hi}$ and $V_{low}$ refer to high and low back-gate bias voltages, respectively. The threshold voltage of the front gate can be controlled by the bias on the back gate. A reverse bias substantially reduces leakage power (by more than an order of magnitude) at the expense of delay. The SG mode offers the best drive strength with more than 2× higher on-state current than LP or IG modes, but also the highest off-state current. Thus, the SG mode leads to higher performance whereas LP mode leads to least leakage. To be competitive with SG mode in performance, the number of fins (and, hence, its gate area) in LP-mode FinFETs can be doubled. Because of the vertical nature of fins and small fin pitch, the impact on the layout area for the LP mode is not that drastic in such embodiments.

FinFET Based NATURE

Figure 55A:
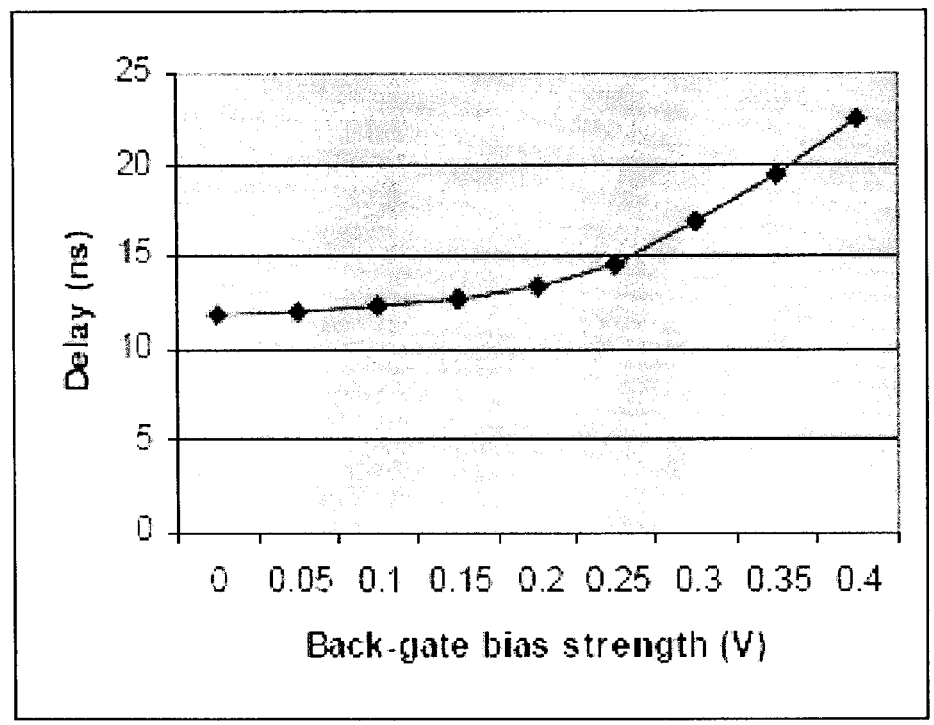
FIGS. 55A and 55B illustrate average delay and leakage power, respectively, plotted against back-gate bias voltage for an embodiment of a minimum-sized LP-mode inverter driving a load four times its size.
Figure 55B:
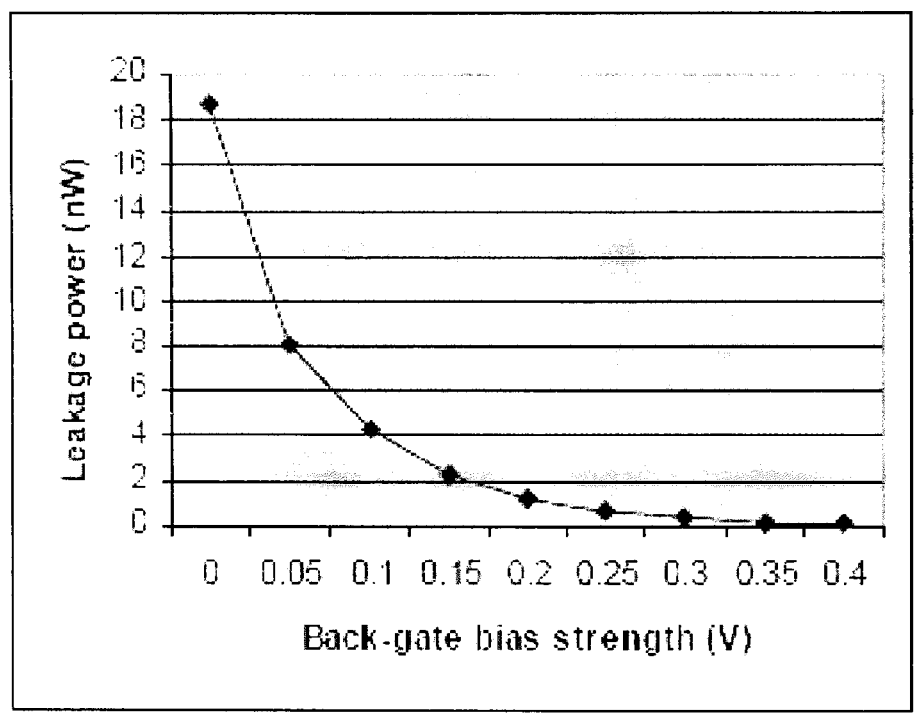

In order to reduce the power consumption, we replace MOSFETs in the logic layer of NATURE by LP-mode FinFETs in this embodiment. The independent-gate n-FinFET (p-FinFET) operates as a single-gate FET when the back-gate is connected to ground (Vdd). Average delay and leakage power, plotted against back-gate bias voltage for a minimum-sized LP-mode inverter driving a load four times its size, are shown in FIGS. 55A and 55B, respectively. In this inverter, the pull-up and pull-down FinFETs are driven by a back-gate bias of the same strength. For instance, assuming Vdd=1.0V, if the strength of the back-gate bias is 0.2V, then 1.2V is fed to the back gate of the pull-up p-FinFET and −0.2V to the back gate of the pull-down n-FinFET. It can be seen that inverter delay initially degrades slowly for smaller values of reverse bias, but more rapidly for larger values. However, the delay increase is accompanied by significant leakage power savings. The leakage power curve shows an initial sharp decline till around 0.2V and then leveling off between 0.2V to 0.4V of reverse bias. We implemented the main components of an SMB (LUT, MUX, flip-flop) using LP-mode FinFETs with a reverse bias of 0.2V and 0.4V and simulated the circuits using UFDG, a physics-based compact model for double-gate MOSFET simulation referred-to within the www.florida.edu website. The FinFET parameters, on which the simulation was based, are given in Table XII of FIG. 56. The simulation results showed the delay degradation to be 1.4× and 2× and leakage power saving to be 10× and 150× for 0.2V and 0.4V reverse biases, respectively. Since the delay degradation for the 0.4V case is excessive and 0.2V already reduces the leakage power close to 0, we chose 0.2V as the reverse bias in this embodiment of a FinFET-based implementation of NATURE.

Since leakage power reduction is achieved at the expense of delay degradation, a reverse back-gate bias can be applied to FinFETs on the non-critical paths of the circuit mapped to NATURE and no reverse bias to the FinFETs on the critical path. In this embodiment, we provide the same bias to all the FinFETs in any particular SMB or DSP block. In other embodiments, it may be desirable to bias each FinFET individually. As for the interconnect, since length-1 wires usually connect adjacent LBs and we group together LBs with the same back-gate bias, these direct link and length-1 wires can be provided the same back-gate bias as well. However, since length-4 and global wires may be used to connect LB groups with different back-gate biases, they are operated at 0V reverse bias. As mentioned earlier, the only reverse biases chosen are 0V and 0.2V. These bias voltages can be generated by on-chip voltage generators whose area overhead was found to be less than 2%. The voltage generator occupies an area of 100 μm². It is able to switch the back-gate voltage of an LB within 2 ns, which is generally less than one clock period. The voltage generator consumes around 5 mW to make the switch. However, since the leakage power of an LB in both the folding and no-folding cases is more than 2 mW and nearly all of this leakage power can be saved by providing the reverse bias, the break-even point for recovering the energy dissipated by the voltage generator in making the switch is just three cycles. Thus, fine-grain adaptive back gate biasing (ABGB) is possible (unlike bulk CMOS where no such fine-grain mechanism is available for making delay-power trade-offs). When a circuit is mapped to NATURE, the back-gate biases and the clock cycles when they will be switched are predetermined for each of the SMBs employed in the circuit. Switching of the voltage generator output can be controlled through the reconfiguration bits in nano RAMs. In order to take advantage of back-gate biasing and minimize power consumption, the NanoMap design optimization flow has to be modified to support ABGB. This is discussed in the following section.

Modification to the NanoMap Flow

In order to facilitate the optimization and implementation of circuits on NATURE, an integrated design optimization flow, called NanoMap, was developed and has been described in several embodiments above. It can automatically choose the optimal logic folding level and implement the design on NATURE, targeting different optimization objectives. The input to NanoMap can be an RTL description or gatelevel LUT netlist. NanoMap includes four major steps: logic mapping 304, temporal clustering 306, temporal placement 308, and routing 310, as illustrated the embodiment of FIG. 57 (ignore the dashed rectangles in this figure for now). The logic mapping step 304 automatically identifies 312 the best folding level based on user-specified design constraints 314 and optimization objective 316. Then force-directed scheduling (FDS) is performed 318 to assign LUTs and LUT clusters to appropriate folding stages (such a stage comprises all the LUTs in one folding cycle) in order to minimize overall resource usage. Temporal clustering 306 packs the LUT network into SMBs and temporal placement 308 places the SMBs into NATURE. Finally, the routing step 310 routes among SMBs and completes the mapping procedure. In the new design, since we have added new DSP modules, introduced a new 3D architecture and employed ABGB for reducing power in the FinFET implementations, NanoMap has to be modified to exploit these new features. However, 3D integration mainly impacts the reconfiguration time and has little impact on the mapping procedure. Thus, we focus on the modifications needed for the other two features.

A. Exploitation of the New DSP Block During Circuit Mapping

For the NATURE architecture that incorporates the set of new DSP blocks, NanoMap needs to target such blocks in the mapping flow 304. In order to fully exploit such blocks, we recognize that there are several special circuit structures, which are usually pipelined, and are better grouped together during mapping, such as those involved in finite impulse response (FIR) filter, infinite impulse response (IIR) filter, etc. Hence, such special structures are identified and marked in the circuit parameter search step. They are treated as one entity throughout the mapping procedure. The modification required to each of the mapping steps is discussed next.

Figure 58A:
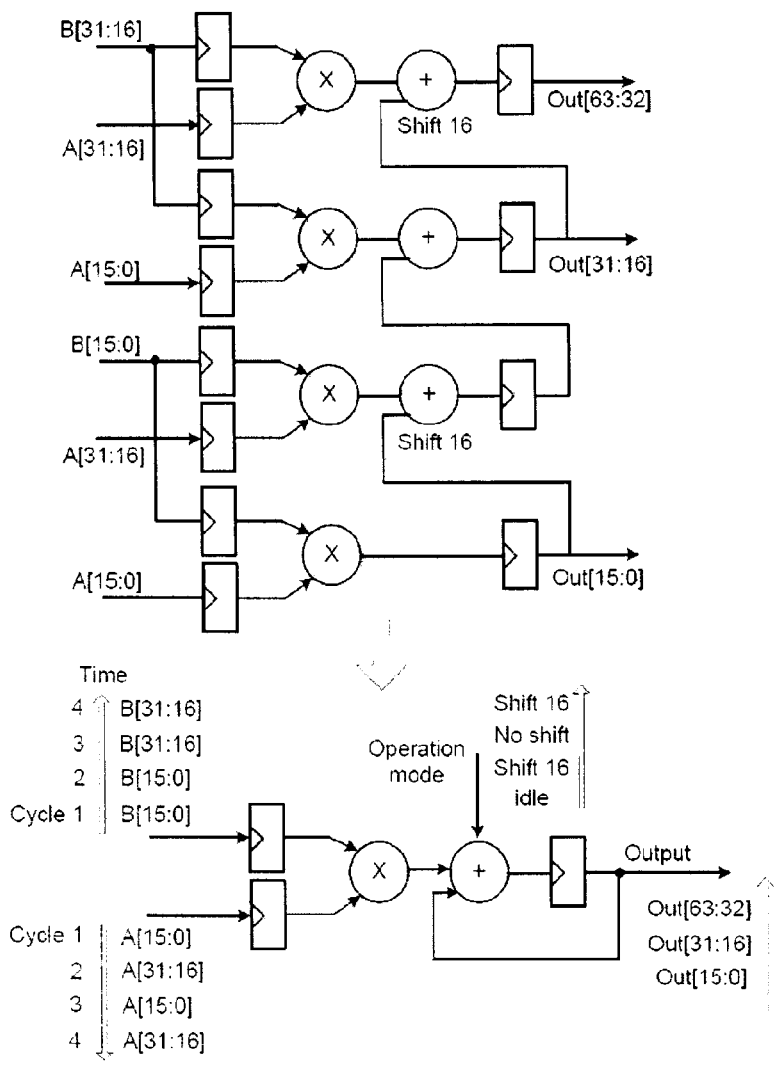
FIG. 58A schematically illustrates one example of multiplier expansion.

Logic mapping: First, after reading in the RTL modules, since there is only one 16-bit multiplier and one 32-bit adder/subtractor available in any DSP block, larger multiplier/adder/subtractor functions need to be expanded based on the basic functional units provided in the DSP block. FIG. 58A shows an example of multiplier expansion. Adder/subtractor expansions can be performed in a similar fashion. Then the expanded node is marked as a DSP node and its delay is the delay for the corresponding DSP operation. Note that a multiplication followed by an addition/subtraction can be mapped to just one DSP block. Other multiplications or additions/subtractions are mapped to other DSP blocks since only one output is provided per DSP block for either the multiplier or adder/subtractor per clock cycle. If the number of adders/multipliers in the circuit that needs to be mapped is smaller than a given threshold (16-bit width), they can be implemented using LUTs, since logic folding can then drastically reduce the area required to implement them and they can be placed close to other logic, reducing the interconnect delay. However, we do pay a price in reconfiguration delay. Thus, a DSP block would require more area, but less delay, than when the same operation is mapped to LUTs. In the case of special circuit structures, if such a structure can be implemented using a series of n connected DSP blocks, its delay equals n times the DSP block delay. Thus, depending on the folding level, such a special node can span several folding cycles. They are treated as multi-chained nodes in FDS. FDS minimizes overall DSP block usage across all the folding cycles while, at the same time, scheduling the LUTs and LUT clusters. Depending on which resource, LEs or DSP blocks, has a tighter constraint on availability, scheduling priority is given to LUTs/LUT clusters or DSP operations, and scheduling of nodes is performed in the corresponding sequence.

Figure 58B:
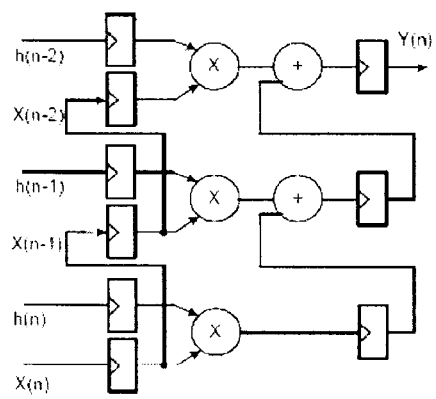
FIG. 58B schematically illustrates one example of an FIR filter.

FIG. 58B schematically illustrates how an FIR filter may be constructed using multiple DSP blocks without using logic folding.

Temporal clustering: After each DSP operation is scheduled 318 in an appropriate folding cycle, it is packed into available DSP blocks in the clustering step 320. Special circuit structures can be easily assigned to a group of DSP blocks based on pre-stored implementations specified in a library. A structure consisting of a multiplication followed by an addition or subtraction can also be assigned to a DSP block. NanoMap ensures during clustering that the DSP node is routable using the internal interconnects of the DSP block or outside interconnects.

Placement and routing: The VPR placer and router were modified to support placement containing DSP blocks 322. The positions, where DSP blocks are located, are specified to VPR. Different types of blocks cannot be swapped with each other during placement optimization, i.e., an SMB cannot be placed in the position belonging to a DSP block. However, the same types of blocks can switch places. Note that since DSP blocks can be shared across clock cycles, during placement, similarly to the case of SMBs, the net connections between blocks need to be considered across all the clock cycles. For routing, the interconnect between DSP blocks does not need to be taken care of. The router only routes connections between DSP blocks and SMBs using general interconnects. However, for delay estimation, all the DSP delays and intrinsic interconnect delays need to be considered.

B. Exploitation of ABGB During Circuit Mapping

Figure 57:
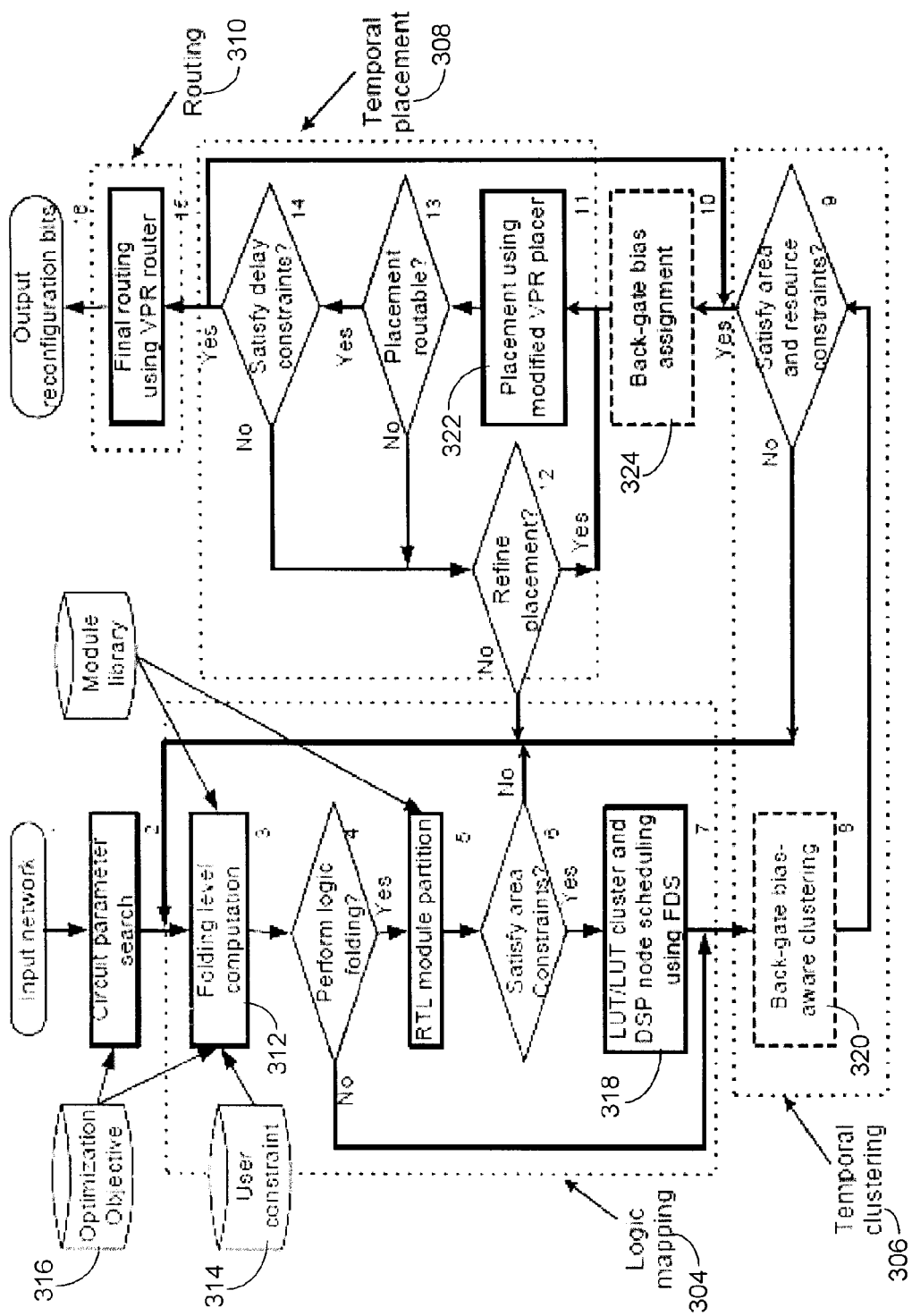
FIG. 57—illustrates a further embodiment of an optimization method, referred to in its various embodiments as NanoMap.

The ABGB objective is to optimize the power consumption without affecting performance. Thus, it is desirable to extend embodiments of NanoMap flow to support power optimization. Since the logic mapping step minimizes the number of LEs used, this minimizes leakage power as well as overall power consumption. Thus, we do not change this step. However, temporal clustering, placement and routing need to be adjusted to support ABGB. An extra step is added after temporal clustering to assign 324 an appropriate back-gate bias voltage to each of the clustered SMB and DSP blocks. The modified NanoMap flow is shown in FIG. 57: now the dashed rectangles are relevant. Next, we show how ABGB is supported in each step.

Temporal clustering: After scheduling, LUTs are packed into SMBs in the clustering step based on the attraction between LUTs that depends on timing criticality and input pin sharing. The attraction between unclustered LUT i and the unfilled target SMB is described as:

$$\text{Attraction}_{i,SMB} = \alpha * \text{Crit}_i + (1-\alpha) * \text{Nets}_{i,SMB} \quad (17)$$

where Crit and Nets are parameters that model timing criticality and net congestion between the two nodes. α, a parameter that takes a value between 0 and 1, allows a tradeoff between the timing concern and interconnect demand, which can be tuned to the specific optimization being performed. The timing criticality can be further expanded as:

$$\text{Crit}_i = \max j \left\{ 1 - \frac{\text{slack}(j)}{\text{MaxSlack}} \right\} + \varepsilon * \text{path\_affected}_i \quad (18)$$

where $\text{slack}_i$ is the difference between the actual arrival time and the required arrival time, and $\text{MaxSlack}_i$ is the maximum slack; among all the paths. The second part of the equation is used to break ties when multiple nodes have the same criticality. $\text{path\_affected}_i$ tracks how many critical paths the node is on and s is a parameter with a small value which is typically set to 0.01, although other values may be used. In order to use ABGB, LUTs with similar slacks should be clustered together in order to allow the application of the same bias voltage. Hence, the attraction can be adjusted to place more emphasis on timing criticality. This can be done by setting α to a large value around 0.9. Selection of the initial seed LUT around which LUT clusters are formed should also be based on timing criticality. The unclustered LUTs are first sorted according to their slacks. The LUT with minimum slack is selected as the seed, and other unclustered LUTs with similar slacks are assigned to the same SMB. If a LUT has a large slack, which can thus tolerate significant delay degradation for a given back-gate bias, the LUT should be assigned to a new SMB as a new seed, if possible. However, the total number of SMBs assigned in each folding cycle is not allowed to exceed the maximum number of SMBs required under no reverse biasing.

The effect of ABGB on the clustering of DSP nodes is mainly dependent on the slack of multiplications that are followed by an addition/subtraction. If their slacks differ greatly, they are assigned to different DSP blocks in order to allow the use of different back-gate bias voltages.

Back-gate bias assignment: In this step, an appropriate back-gate bias voltage is assigned 324 to each LB. We have to consider two scenarios: logic folding and no-folding. For the logic folding case, first note that the delay is determined by the number of folding cycles times the maximum delay across all the clock cycles. Since 0.2V back-gate reverse bias causes 1.4× delay degradation, if the delay of some folding cycle times 1.4× is less than the maximum delay, back-gate biasing can be used for all the logic and interconnects employed in this cycle. In folding cycles with delay close to the maximum, the LB network employed in the folding cycle can be biased using the strategy for the no-folding case, discussed next. For the no-folding case, the nodes, i.e., LBs or DSP blocks, can be assigned a back-gate bias voltage individually, based on their available slacks. For each node in a network of nodes, the minimum slack is computed based on its input/output connections. Then based on the delay degradation relationship and available slack, an appropriate back-gate bias voltage is assigned to each node. Since each such node assignment affects the slacks of the predecessors and successors of the node, which, in turn, affect the total power consumption, node assignment needs to be considered in an appropriate sequence to achieve the most power reduction. We first rank the nodes according to their slack. Nodes with the same slack are ranked based on the number of nodes their output is connected to. Since successors always have less slack than predecessors, if one node uses up all the slack, the successors will end up with zero slack. Hence, we should first obtain the bias assignment for the nodes with fewer output nodes. The biasing amenability of node i, denoted $bias\_amen_i$, is given as $$bias\_amen_i = slack_i + \beta * num\_outputs_i \quad (19)$$

where $\beta$ is given a small value and is included for breaking ties. Given an initial solution with no reverse bias assigned, the nodes are ranked based on their biasing amenability, i.e., bias_amen. The node with the maximum bias_amen is selected and assigned a 0.2V back-gate reverse bias. Then the bias_amen of its predecessors and successors are updated. This is iterated until there is no node left to select. A pseudocode embodiment of this process is illustrated in FIG. 59.

Placement and routing: Since a significant part of leakage power is due to the interconnect, during placement, we try to place the SMBs with the same back-gate bias voltage together to enable reverse biasing of length-1 interconnect wires. Since bias voltages are assigned to the LBs based on their timing criticality, by using a timing-driven placer, the SMBs are also placed based on their timing criticality. Thus, naturally, the SMBs with the same bias voltage tend to be placed together, allowing similar biasing of length-1 wires. The main effect of back-gate biasing on routing is delay degradation. The extra delay information for all possible back-gate biases is provided in the input file to VPR and used in placement and routing.

Further Experimental Results

In this section, we present experimental results for various benchmarks to show the advantages of the lower-power NATURE embodiments. Of the eight benchmarks, Paulin and Diffeq are differential-equation solvers, and Biquad is a digital filter. ASPP4 is an application specific programmable processor. Wavelet and DCT are mathematical functions implementing wavelet transform and discrete cosine transform computations, respectively. Motion is a behavior that performs video compression during video stream encoding, and Matrix is a standard multiplication algorithm often used in multimedia processing. To set up the experiments, we chose the architectural instance consisting of 16 LEs in an SMB with two levels of logic, and four flip-flops in an LE. The input/output parameters of an LE (see the embodiment of FIG. 28), h1, h2, h3 are set to 3,3,2, respectively. In the experiments, we use MRAM as an example in the architecture for the performance evaluation. Note that when using other nano RAMs, similar conclusions can be drawn. The fabrication of MRAMs is close to mature. Its read access time for an MRAM block is around 1 ns, and hence, the total reconfiguration time is 2.4 ns. The experiments were performed with both MOSFETs and FinFETs implemented in a 32 nm technology.

First, we investigated performance improvement of the unified architecture compared to the fine-grain architecture for NATURE. As discussed before, fine-grain NATURE can achieve more flexibility and more logic density improvement for random logic applications. In contrast, in the unified architecture, a coarse-grain module uses fewer reconfiguration bits and typically favors special types of applications at reduced flexibility. For example, DSP modules greatly speed up multimedia processing applications. However, for random logic circuits, the DSP block will remain idle most of the time and incur an area overhead. Moreover, simple computations can also be implemented efficiently in fine-grain logic using logic folding with small area usage. Hence, in order to increase the area efficiency, it is beneficial to implement large computations along the critical path, such as wide multiplications, using DSP modules, and map smaller computations, such as small additions, along the non-critical path, in fine-grain logic. We present the mapping results for the unified architecture in Table XIII of FIG. 60. The mapping results are compared to the fine-grain architecture implementing the no-folding case, which can be taken as a proxy for traditional fine-grain architectures, in the second last column to show the area-delay product improvement. The comparison for the logic-folding case between the unified architecture and fine-grain architecture presented in the last column illustrates the benefits of incorporating coarse-grain modules. On an average, the area-delay product improvement is 16.1× compared to the fine-grain no-folding case, and 3.1× compared to the fine-grain folding case, mainly due to the speed-up along the critical path made possible by DSP modules. In terms of power consumption, since the leakage power consumption is closely related to area usage and dynamic power depends on the clock frequency, and the unified architecture reduces area usage while basically retaining the clock cycle of the fine-grain architecture, the power consumption of the unified architecture reduces by about 1.5× due to the area reduction.

Next, compared to the 2D unified architecture, we investigated the advantages and disadvantages of 3D design (see Table XIII of FIG. 60). The experimental results for area-delay product improvement are shown in Table XIV of FIG. 61. The 3D design helps hide the reconfiguration time for some benchmarks using the shadow SRAMs. For smaller benchmarks, like Biquad and Paulin, since the folding cycle is less than the required reconfiguration time, the reconfiguration latency can only be partially hidden, resulting in some delay overhead, however, less than 30%. For larger benchmarks, the delay is improved because the reconfiguration latency can be completely hidden. Note that the total chip area is reduced due to the extraction of nano RAMs on another layer. Even when the area of the shadow SRAM is incorporated in the 3D design, there is still a 1.25× reduction in chip area. Hence, with 3D design, the further area-delay product reduction is around 1.18× compared to the 2D unified architecture. Currently, we are using 32 copies of reconfiguration bits. As discussed previously, 64 copies of reconfiguration bits are also allowed. Hence, for larger benchmarks, 64 reconfiguration copies can be used to further improve the performance. In the 3D design, one copy of reconfiguration bits is transferred in two clock cycles, hence, the reconfiguration frequency is doubled to compensate for this. However, since in the clock cycle, the switched number of bits is also reduced in half, the switching power remains the same. The memory leakage power consumption is proportional to the memory size. If 64 copies of reconfiguration bits are used in the 3D design, the memory leakage power consumption doubles. However, for larger circuits, 64 copies of reconfiguration bits can enable further logic folding and further area and leakage power reduction. This leakage power reduction may exceed the memory power increase, thus reducing total power. Employing FinFET-based ABGB, power consumption of mapped applications can be significantly reduced further, as discussed next.

Based on the discussions above, a 0.2V reverse bias is applied to the back gate of FinFETs in the LB and DSP blocks. Since in the logic-folding case, most of the power consumption is due to reconfiguration memory, it is crucial to apply ABGB to the memory blocks as well in order to reduce their leakage. Through simulation, we found that the leakage power of memory blocks can be reduced by 10× through back-gate biasing at the expense of a 1.3× increase in the access time, which results, on an average, in a 1.1× delay increase for the logic-folding case. Employing ABGB on an LB increases its power consumption by 5 mW. In order to make up for this power cost, after each back-gate voltage switching, the LP mode should last for several clock cycles (currently set to five) to save enough energy. The average power consumption in the 3D unified architecture for the LP mode with ABGB and normal mode without biasing for different folding levels is shown in Table XV of FIG. 62. We can see that for the logic-folding case, both memory and logic leakage power are reduced with a small delay overhead. For the no-folding case, the delay is not affected since ABGB is only applied to the non-critical path. The average power reduction is 1.5×. Considering the relationship between power reduction using ABGB and the folding level, we found at lower folding levels, a large fraction of total power is consumed in reconfiguration memory. The logic and interconnect power depend on the slack available in each clock cycle, which is determined by placement and routing. When the folding level increases, the logic and interconnect power increase. The biasing power, which is consumed during switching of the back gates of FinFETs, also generally increases with the folding level, since more SMBs need to be biased. However, for the no-folding case, although it consumes more leakage power, it does not consume reconfiguration power and memory leakage power. Hence, for some benchmarks, especially small benchmarks, the total power for the no-folding case is less than for the folding cases. Thus, there is a folding level that is optimal for power consumption. However, for each application, this optimal folding level may be different. The modified NanoMap can automatically determine this folding level.

Finally, the comparison of low-power 3D NATURE to the baseline design, the 2D fine-grain NATURE, is shown in Table XVI of FIG. 63 and Table XVII of FIG. 64. The area/delay mapping results and power consumption are presented for two different objectives: area-delay product optimization and power optimization. Note that the LB size in 3D NATURE is 1.25× smaller than the LB size in 2D NATURE. On an average, the area-delay product improvement is 24.9× for the area-delay product optimization objective and power reduction is 5.1× for the power optimization objective. Hence, the new design presents significant advantages in terms of logic density, area-delay product improvement and power reduction.

Conclusion

The claimed invention presents a hybrid nano-memory/FET dynamically reconfigurable architecture, NATURE, and an RTL/gate-level automatic design optimization flow, NanoMap, for the NATURE reconfigurable architecture. NATURE supports run-time fine-grain reconfiguration and, hence, enables temporal logic folding. Through logic folding, significant logic density improvement and flexibility in performing area-delay tradeoffs are possible.

NanoMap incorporates temporal logic folding during the logic mapping, temporal clustering and placement steps. NanoMap provides for automatic selection of a best folding level, and uses force-direct scheduling to balance resources across the different folding stages. Mapping, as provided by the claimed invention, can target various optimization objectives and user constraints. With NanoMap, the potential of NATURE can be effectively realized.

A thorough design space exploration in terms of LE, SMB and interconnect structure design were reported, allowing assessment of the full potential of NATURE in order to further optimize its architecture. The trade-offs involved in several design variations were investigated. Next, to enhance NATURE's capacity for implementing memory intensive applications, it was shown how blocks of high-density, high-performance nano RAMs can be distributed throughout the chip as embedded data memory, and exploited. Presence of such on-chip RAMs reduces the need to access off-chip memory dramatically, improving both the latency and throughput (which is further enhanced significantly due to logic folding)

In later embodiments, the fine-grain NATURE architecture was extended to include coarse-grain DSP blocks to speed up DSP-related computation. Then new techniques, including 3D design and FinFET-based back-gate biasing, were exploited to significantly improve NATURE's logic density and power consumption. The automatic mapping flow, NanoMap, was modified to support DSP block mapping, and back-gate bias voltage assignment, and explore the advantages of the new architecture. Experimental results demonstrate significant improvements in logic density, area-delay product and power consumption. Hence, the new design presents a promising 3D low-power and high-performance dynamically reconfigurable architecture.

Having thus described several embodiments of a method and system for a run-time reconfigurable computer architecture, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and the scope of the claimed invention. As just one example, although embodiments of a reconfigurable computer architecture have been shown herein as a field programmable gate array, it should be understood that other embodiments of the reconfigurable computer architecture may be a processor such as a processor which is able to reconfigure its processor type and/or capabilities during run-time. Such a processor, for example, would be able to provide time multiplexing of appli- cations, each application being able to be executed on a different processor configuration by the same reconfigurable computer architecture. Additionally, the recited order of the processing elements or sequences, or the use of numbers, letters, or other designations therefore, is not intended to limit the claimed processes to any order except as may be specified in the claims. Accordingly, the claimed invention is limited only by the following claims and equivalents thereto.

What is claimed is:

1. A reconfigurable computer architecture, comprising:
   a) a logic layer having:
      1) a plurality of logic elements grouped into a plurality of macroblocks each containing at least two logic elements; and
      2) a plurality of connection switching elements;
   b) memory layer electrically coupled to the logic layer, the memory layer having:
      1) a configuration storage associated with each of the plurality of macroblocks (MBs), wherein each configuration storage is configured for storing configuration bits and is electrically coupled to its associated macroblock using a through-silicon Via to enable reconfiguration.

2. The reconfigurable computer architecture of claim 1, wherein each configuration storage in the memory layer is electrically coupled to at least one of the plurality of connection switching elements in the logic layer by at least one via.

3. The reconfigurable computer architecture of claim 1, wherein each of the one or more MBs comprises four of the plurality of logic elements.

4. The reconfigurable computer architecture of claim 1, wherein:
   each logic element comprises logic element inputs, at least one logic element output; each of the MBs comprises MB inputs; and
   each of the logic element inputs arrive from one of the logic element outputs or from one of the MB inputs after passing through at least one of the connection switching elements.

5. The reconfigurable computer architecture of claim 1, wherein a plurality of the one or more MBs are grouped into one or more super-macroblocks (SMBs).

* * * * *